(12) United States Patent
Kikuchi et al.

(10) Patent No.: US 9,129,828 B2
(45) Date of Patent: Sep. 8, 2015

(54) SEMICONDUCTOR DEVICE WITH CHIP HAVING A DIFFERENT NUMBER OF FRONT SURFACE ELECTRODES AND BACK SURFACE ELECTRODES

(71) Applicant: Renesas Electronics Corporation, Kawasaki-shi, Kanagawa (JP)

(72) Inventors: Takashi Kikuchi, Kanagawa (JP); Takafumi Kikuchi, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 14/027,187

(22) Filed: Sep. 14, 2013

(65) Prior Publication Data

US 2014/0077391 A1    Mar. 20, 2014

(30) Foreign Application Priority Data

Sep. 14, 2012   (JP) ................................. 2012-203064

(51) Int. Cl.
*H01L 25/065*   (2006.01)
*H01L 23/498*   (2006.01)
*H01L 23/00*    (2006.01)
*H01L 25/18*    (2006.01)

(52) U.S. Cl.
CPC ...... *H01L 25/0657* (2013.01); *H01L 23/49827* (2013.01); *H01L 24/97* (2013.01); *H01L 25/18* (2013.01); *H01L 23/49816* (2013.01); *H01L 2224/16145* (2013.01); *H01L 2224/16225* (2013.01); *H01L 2224/32145* (2013.01); *H01L 2224/32225* (2013.01); *H01L 2224/73204* (2013.01); *H01L 2224/73253* (2013.01); *H01L 2224/81005* (2013.01); *H01L 2224/97* (2013.01); *H01L 2225/06513* (2013.01); *H01L 2225/06517* (2013.01); *H01L 2225/06527* (2013.01); *H01L 2225/06541* (2013.01); *H01L 2225/06562* (2013.01); *H01L 2225/06572* (2013.01); *H01L 2924/07802* (2013.01); *H01L 2924/15311* (2013.01)

(58) Field of Classification Search
None
See application file for complete search history.

(56) References Cited

U.S. PATENT DOCUMENTS

2005/0104181 A1* 5/2005 Lee et al. ...................... 257/686
2008/0079157 A1  4/2008 Kurita et al.
(Continued)

FOREIGN PATENT DOCUMENTS

JP    2008-091638 A   4/2008
JP    2008-091640 A   4/2008
(Continued)

*Primary Examiner* — Daniel Luke
(74) *Attorney, Agent, or Firm* — Miles & Stockbridge P.C.

(57) ABSTRACT

A semiconductor device in which a plurality of semiconductor chips having different planar sizes are stacked with a degree of freedom in design of each of the semiconductor chips is provided. A logic chip, a redistribution chip, and a memory chip having a larger planar size than the logic chip are mounted over a wiring board. The logic chip and the memory chip are electrically connected via the redistribution chip. The redistribution chip includes a plurality of front surface electrodes formed to a front surface facing the wiring board, and a plurality of back surface electrodes formed to a back surface opposite to the surface. The redistribution chip has a plurality of through silicon vias, and a plurality of lead wirings formed to the front surface or the back surface and electrically connecting the plurality of through silicon vias and the front surface electrodes or the back surface electrodes.

15 Claims, 43 Drawing Sheets

(56) References Cited

U.S. PATENT DOCUMENTS

| | | |
|---|---|---|
| 2008/0079163 A1 | 4/2008 | Kurita et al. |
| 2009/0008796 A1* | 1/2009 | Eng et al. .................. 257/777 |
| 2009/0059641 A1 | 3/2009 | Jeddeloh |
| 2010/0061134 A1 | 3/2010 | Jeddeloh |
| 2012/0088332 A1* | 4/2012 | Lee et al. .................. 438/113 |
| 2012/0218803 A1 | 8/2012 | Jeddeloh |
| 2013/0083585 A1 | 4/2013 | Jeddeloh |
| 2013/0099390 A1 | 4/2013 | Kurita et al. |

FOREIGN PATENT DOCUMENTS

| | | |
|---|---|---|
| JP | 2010-538358 A | 12/2010 |
| JP | 2011-187574 A | 9/2011 |

* cited by examiner

SEMICONDUCTOR DEVICE WITH CHIP HAVING A DIFFERENT NUMBER OF FRONT SURFACE ELECTRODES AND BACK SURFACE ELECTRODES

CROSS-REFERENCE TO RELATED APPLICATION

The present application claims priority from Japanese Patent Application No. 2012-203064 filed on Sep. 14, 2012, the content of which is hereby incorporated by reference into this application.

BACKGROUND

The present invention relates to technique of a semiconductor device. More particularly, the present invention relates to technique which is effective when applied to a semiconductor device in which a plurality of semiconductor chips having different planar sizes are stacked.

Japanese Patent Application Laid-Open Publication No. 2011-187574 (Patent Document 1) describes a semiconductor device in which a semiconductor chip having through silicon vias is disposed between a stacked body of a plurality of memory chips and a wiring board.

Japanese Patent Application Laid-Open Publication No. 2008-91638 (Patent Document 2) and Japanese Patent Application Laid-Open Publication No. 2008-91640 (Patent Document 3) describe a semiconductor device in which a plurality of semiconductor chips including a stacked body of a plurality of semiconductor chips are mounted on a wiring board and collectively sealed.

Japanese Patent Application Laid-Open Publication (Translation of PCT Application) No. 2010-538358 (Patent Document 4) describes methods of stacking a plurality of semiconductor chips including stacking at wafer level and stacking at chip level.

SUMMARY

The inventors of the present invention have been studying technology for improving performances of a semiconductor device in which a plurality of semiconductor chips are stacked on a wiring board. As a part of the study, the inventors have studied a semiconductor device of SiP (System in Package) type in which a system is structured by one semiconductor device by mounting a plurality of semiconductor chips (e.g., a memory chip and a control chip which controls the memory chip) in one semiconductor device.

As a method of stacking a plurality of semiconductor chips, there is a method of forming through silicon vias and electrically connecting a plurality of semiconductor chips to each other via the through silicon vias. This method can connect a plurality of semiconductor chips stacked without interposing wires and thus the transmission distances among semiconductor chips can be reduced.

However, the inventors have found out that the limitation in view of freedom in design of each semiconductor device is increased when stacking a plurality of semiconductor chips having different planar sizes.

The other problems and novel characteristics of the present invention will be apparent from the description of the present specification and the accompanying drawings.

A semiconductor device according to an embodiment includes: a first semiconductor chip mounted over a wiring board; a second semiconductor chip; and a third semiconductor chip having a larger planar size than the first semiconductor chip. In addition, the first semiconductor chip and the third semiconductor chip are electrically connected via the second semiconductor chip. In addition, the second semiconductor chip has: a front surface facing the wiring board; a plurality of front surface electrodes formed to the front surface; a back surface opposite to the front surface; and a plurality of back surface electrodes formed to the back surface and electrically connected to the plurality of surface electrodes. Further, the second semiconductor chip has: a plurality of through silicon vias penetrating from one of the front surface or the back surface toward the other; and a plurality of lead wirings formed to the front surface or the back surface and electrically connecting the through silicon vias and the front surface electrodes or the plurality of back surface electrodes. Still further, the first semiconductor chip is disposed between the second semiconductor chip and the wiring board or next to the second semiconductor chip and electrically connects the surface electrodes of the second semiconductor chip. Moreover, the third semiconductor chip is disposed on the second semiconductor chip and electrically connected to the back surface electrodes on the second semiconductor chip.

According to the embodiment, freedom of design of the first semiconductor chip can be improved.

BRIEF DESCRIPTIONS OF THE DRAWINGS

Figure 1:
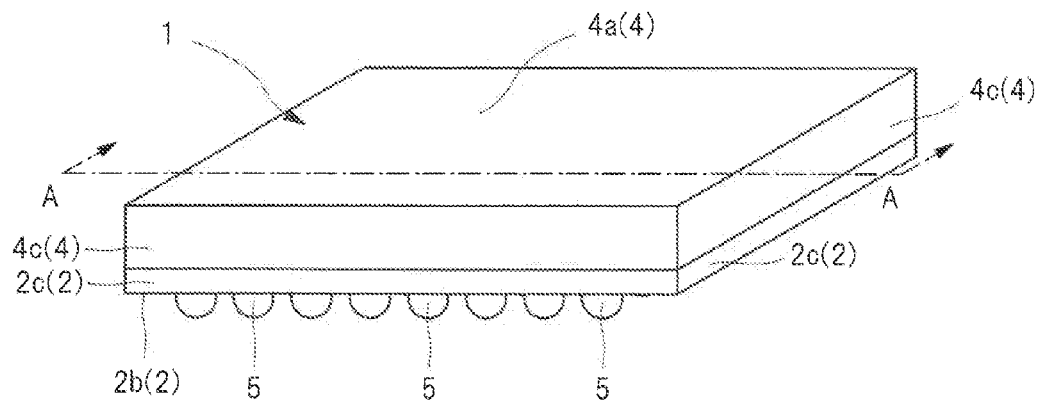
FIG. 1 is a perspective view of semiconductor device according to an embodiment.

DETAILED DESCRIPTION (Form of Descriptions, Basic Terminology and Phrases in the Present Application)

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

In the same manner, in the descriptions of an embodiment and so forth, such an expression "X including (comprising, having, composed of) A" does not exclude other elements than A unless otherwise explicitly stated to deny it or it is clearly not the case from the context. For example, in view of components, the expression means "X containing A as a main component" or the like. For example, it is needless to say that a term "silicon member" is not limited to pure silicon and SiGe (silicon germanium) alloy and other multicomponent alloys containing silicon as a main component, and members containing other additives. Also, the terms gold plating, Cu layer, nickel plating include not only pure members but also members containing gold, Cu, nickel etc., respectively unless otherwise specifically stated.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Also, components having the same function are denoted by the same reference symbols throughout the drawings for describing the embodiments, and the repetitive description thereof is omitted.

Further, in the attached drawings, when the drawing is complicated or a part can be clearly distinguished from a vacant space, hatching etc, may be omitted even in cross-sectional views. In relation to this, when it is apparent from the explanations etc., even a hole that is closed in a planar view may be illustrated omitting an outline of the background. Moreover, to explicitly illustrate that a region is not a vacant space or to clearly illustrate a boundary of regions, hatching and a dot pattern may be added even the drawing is not a cross-sectional view.

In the embodiment described below, as an example of a semiconductor device of the SiP type, a semiconductor package in which a semiconductor chip (memory chip) in which a memory circuit is formed and a semiconductor chip (control chip) in which a control circuit controlling operation of the memory circuit are mounted in one package will be picked up and described.

First Embodiment

Figure 2:
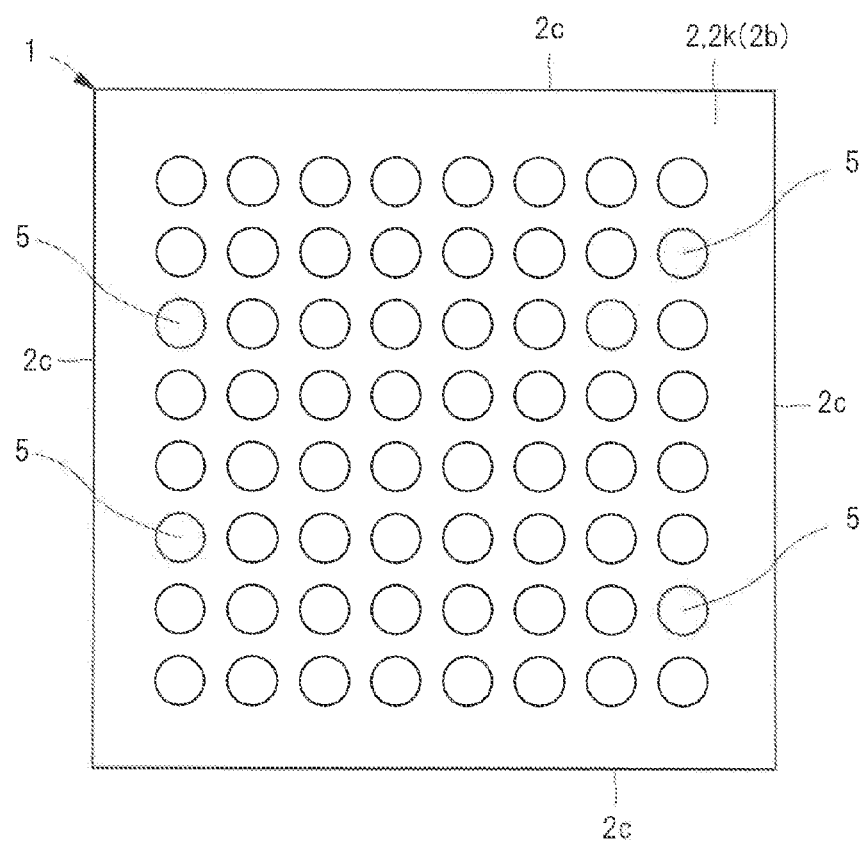
FIG. 2 is a bottom view of the semiconductor device illustrated in FIG. 1.
Figure 3:
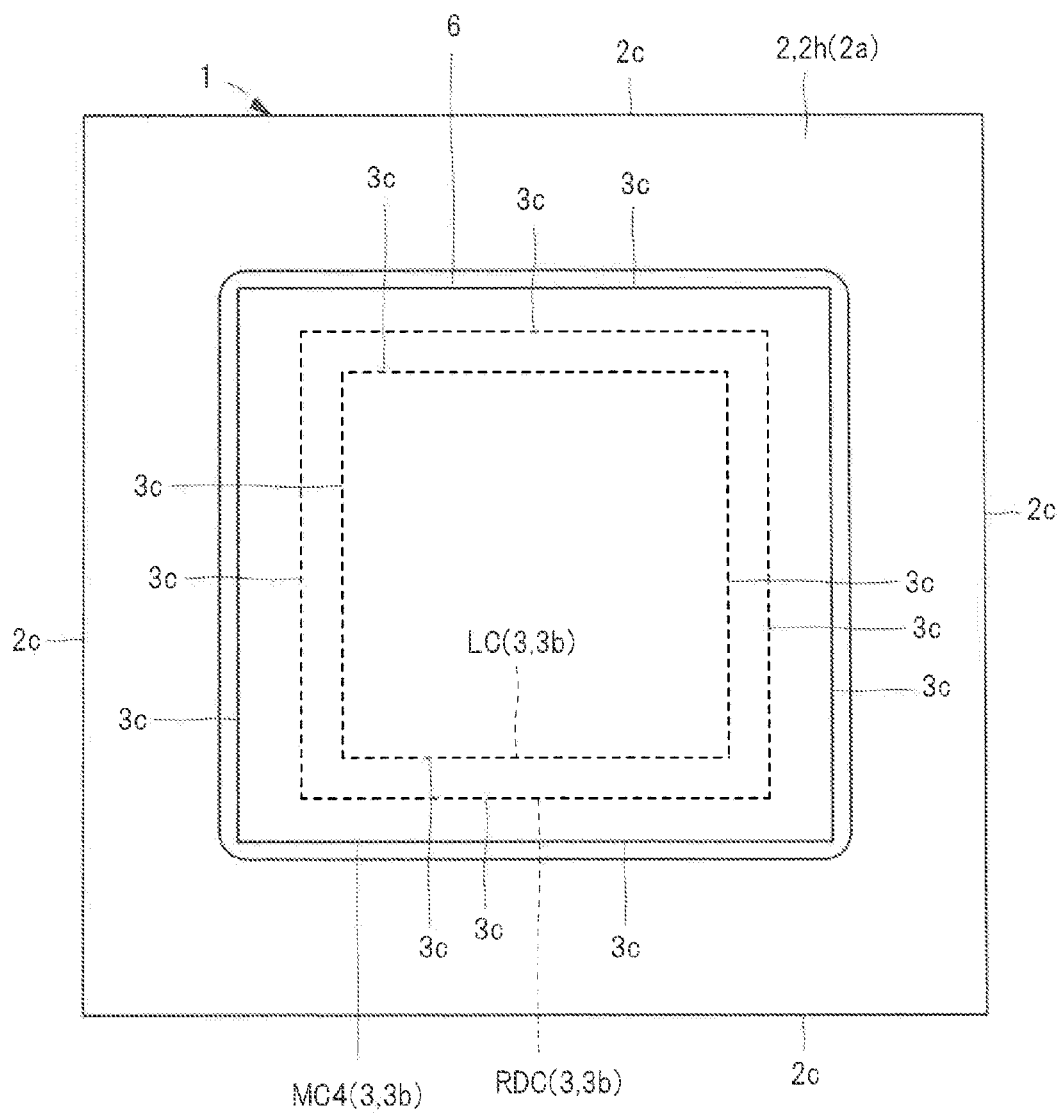
FIG. 3 is a perspective planar view illustrating an inner structure of the semiconductor device on a wiring board in a state in which a sealing body illustrated in FIG. 1 is omitted.
Figure 4:
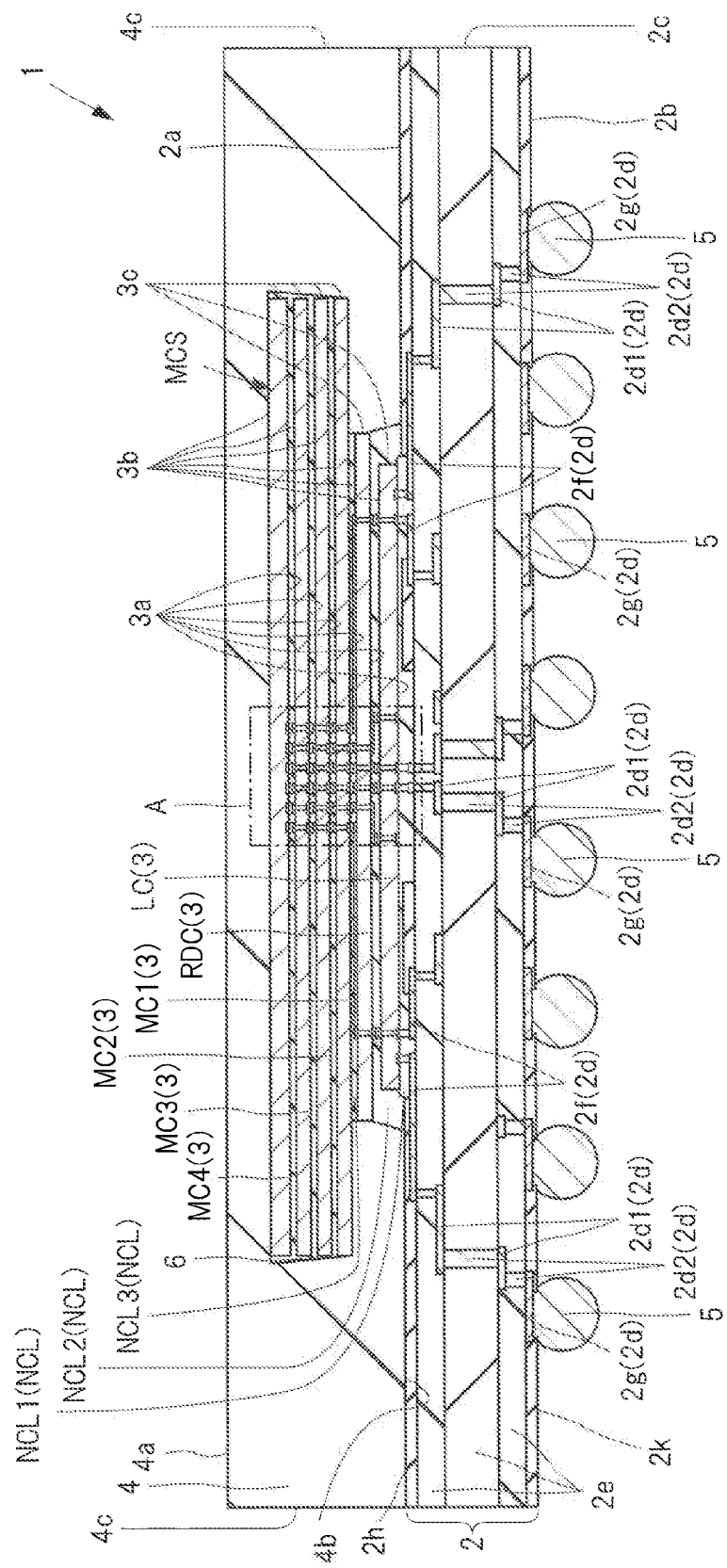
FIG. 4 is a cross-sectional view taken along the A-A line in FIG. 1.
Figure 5:
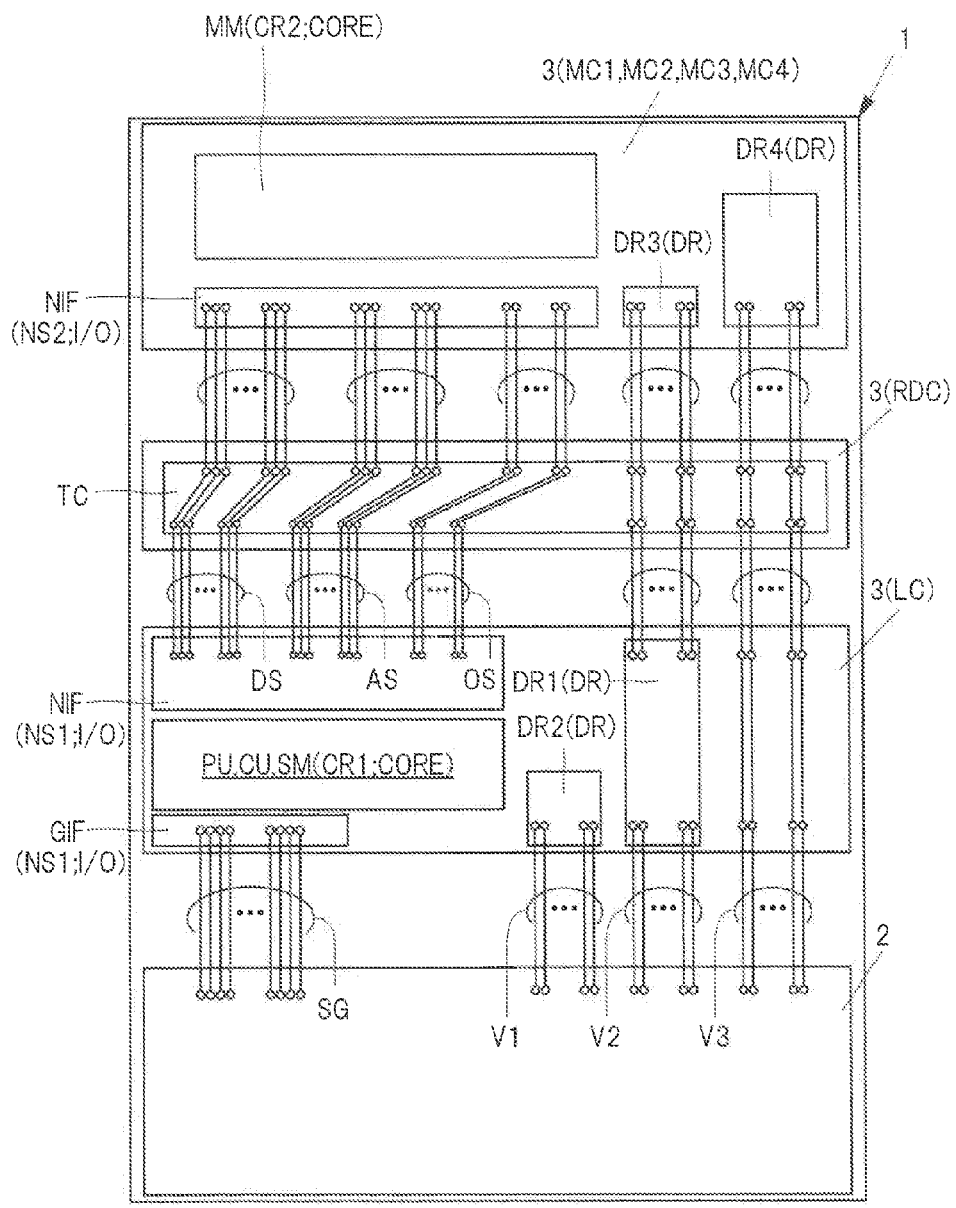
FIG. 5 is an explanatory diagram schematically illustrating a circuit configuration example of the semiconductor device illustrated in FIGS. 1 to 4.

FIG. 1 is a perspective view of a semiconductor device according to a present embodiment, and FIG. 2 is a bottom view of a semiconductor device illustrated in FIG. 1. FIG. 3 is a perspective planar view illustrating an inner structure of the semiconductor device on a wiring board in a state in which a sealing body illustrated in FIG. 1 is removed. FIG. 4 is a cross-sectional view taken along the line A-A in FIG. 1. FIG. 5 is an explanatory diagram schematically illustrating a circuit configuration example of the semiconductor device illustrated in FIGS. 1 to 4. Not that, although the number of terminals is reduced in the drawing to facilitate viewing, the number of terminals (bonding lead $2f$, land $2g$, solder ball 5) is not limited to the aspect illustrated in FIGS. 1 to 4. Moreover, in FIG. 3, to facilitate viewing of a positional relationship and a difference in planar size in a planar view of a logic chip LC and a memory chip MC4, outlines of the logic chip LC and a redistribution chip RDC are illustrated by dotted lines.

<Semiconductor Device>

First, an outline and a configuration of a semiconductor device 1 according to the present embodiment will be described with reference to FIGS. 1 to 4. The semiconductor device 1 of the present embodiment includes a wiring board 2, a plurality of semiconductor chips 3 (see FIG. 4) mounted over the wiring board 2, and a sealing body (resin body) 4 for sealing the plurality of semiconductor chips 3.

As illustrated in FIG. 4, the wiring board 2 includes: an upper surface (surface; main surface; chip-mounting surface) $2a$ to which the plurality of semiconductor devices are mounted; a lower surface (surface; main surface; mounting surface) $2b$ opposite to the upper surface; and side surfaces $2c$ disposed between the upper surface $2a$ and the lower surface $2b$. The wiring board 2 has a rectangular outer shape in planar view as illustrated in FIGS. 2 and 3. In the example illustrated in FIGS. 2 and 3, a planar size of the wiring board 2 (size in planar view; size of the upper surface $2a$ and the lower surface $2b$; outer size) is a square having a length of one side that is about 14 mm. In addition, a thickness (height) of the wiring board 2, that is, a distance from the upper surface $2a$ to the lower surface $2b$ illustrated in FIG. 4 is, for example, about 0.3 to 0.5 mm.

The wiring board 2 is an interposer for electrically connecting the semiconductor chip 3 mounted on the upper surface $2a$ side and a mounting board not illustrated and the wiring board 2 includes plurality of wiring layers (four layers in FIG. 4) electrically connecting the upper surface $2a$ side and the lower surface $2b$ side. To each of the wiring layers, a plurality of wirings $2d$ and an insulating layer $2e$ for insulation among the plurality of wirings $2d$ and among neighboring wiring layers are formed. Here, the wiring board 2 of the present embodiment includes three insulating layers $2e$ and the insulating layer $2e$ at the center is a core layer (core material); however, a core-less board not having the insulating layer $2e$ to be a core may be used. In addition, the wiring $2d$ includes a wiring $2d1$ formed to an upper surface or an lower surface of the insulating layer $2e$ and a via wiring $2d2$ which is an interlayer conduction path formed to penetrate the insulating layer $2e$ in the thickness direction.

In addition, to the upper surface $2a$ of the wiring board 2, a plurality of bonding leads (terminals; terminals of chip-mounting surface side; electrodes) $2f$ which are terminals electrically connected to the semiconductor chips 3 are formed. On the other hand, to the lower surface $2b$ of the wiring board 2, terminal to be electrically connected to a mounting board not illustrated, that is, a plurality of land $2g$, to which a plurality of solder balls 5 which are external connection terminals of the semiconductor device 1 are joined, are formed. The plurality of bonding leads $2f$ and the plurality of lands $2g$ are electrically connected to each other via the plurality of wirings $2d$. Note that the wirings $2d$ connected to the bonding leads $2f$ and the lands $2g$ are integrally formed with the bonding leads $2f$ and the lands $2g$ and thus the bonding leads $2f$ and the lands $2g$ are illustrated as part of the wirings $2d$ in FIG. 4.

In addition, the upper surface $2a$ and the lower surface $2b$ of the wiring board 2 are covered with insulating films (solder resist films) $2h$ and $2k$. The wirings $2d$ formed to the upper surface $2a$ of the wiring board 2 are covered with the insulating film $2h$. Opening portions are formed to the insulating film $2h$ and thus at least part (joint portion to the semiconductor chips 3; bonding region) of the plurality of bonding leads $2f$ is exposed from the insulating film $2h$ at the opening portions. Also, the wirings $2d$ formed to the lower surface $2b$ of the wiring board 2 are covered with the insulating film $2k$. Opening portions are formed to the insulating film $2k$ and at least part (joint portions to the solder balls 5) of the plurality of lands $2g$ is exposed from the insulating film $2k$ at the opening portions.

Also, as illustrated in FIG. 4, the solder balls (external terminals; electrodes; external electrodes) 5 joined to the plurality of lands $2g$ of the lower surface $2b$ of the wiring board 2 are disposed in a matrix-like manner as illustrated in FIG. 2. In addition, although illustration is omitted in FIG. 2, the plurality of lands $2g$ (see FIG. 4) to which the plurality of solder balls 5 are joined are also disposed in a matrix-like manner. In this manner, such a semiconductor device in which the plurality of external terminals (solder balls 5; lands $2g$) are disposed in a matrix-like manner on the mounting-surface side of the wiring board 2 is called a semiconductor device of an area-array type. The area-array type semiconductor device can effectively utilize the mounting surface side (lower surface $2b$) of the wiring board 2 as a space for disposing the external terminals and thus preferable in a point of the possibility of reducing an increase in mounting area of the semiconductor device even when the number of external terminals is increased. In other words, semiconductor devices having the number of external terminals increased along with improvements in high function and high integration can be mounted in a space-saving manner.

In addition; the semiconductor device 1 includes the plurality of semiconductor chips 3 mounted on the wiring board 2. The plurality of semiconductor chips 3 are stacked on the upper surface $2a$ of the wiring board 2. Also, each of the plurality of semiconductor chips 3 has a front surface (main surface, upper surface) $3a$, a back surface (main surface, lower surface) $3b$ opposite to the surface $3a$, and side surfaces $3c$ positioned between the front surface $3a$ and the back surface $3b$. The plurality of semiconductor chips 3 have a rectangular outer shape in a planar view as illustrated in FIG. 3. In this manner, by stacking a plurality of semiconductor chips, even when the functions of the semiconductor device 1 are improved, the mounting area can be reduced.

In the example illustrated in FIG. 4, the semiconductor chip 3 mounted at the lowermost stage (a position closest to the wiring board 2) is a logic chip (semiconductor chip) LC to which a processor circuit PU (see FIG. 5) is formed. On the other hand, the semiconductor chips 3 mounted on the upper stage side of the logic chip LC are memory chips (semiconductor chip) MC1, MC2, MC3 and MC4. Further, another semiconductor chip 3 (redistribution chip RDC) is disposed between the logic chip LC and the memory chips MC1, MC2, MC3 and MC4. The redistribution chip (interface chip) RDC includes a plurality of wirings (redistribution) for adjusting positions of electrodes (external terminals) of the logic chip LC and the memory chip MC1 such that the logic chip LC and the memory chip MC1 are electrically connected to each other via a plurality of wiring of the redistribution chip RDC.

In addition, as illustrated in FIG. 4, an adhesive material NCL (insulating adhesive material) is disposed between each two of the plurality of semiconductor chips 3. The adhesive material NCL is disposed to fill in a space between the front surface 3a of the semiconductor chip 3 on the upper stage side and the back surface 3b of the semiconductor chip 3 on the lower stage side (or the upper surface 2a of the wiring board 2). In more detail, the adhesive material NCL includes an adhesive material (insulating adhesive material) NCL1 for adhering and fixing the logic chip LC on the wiring board 2, an adhesive material (insulating adhesive material) NCL2 for adhering and fixing the redistribution chip RDC on the logic chip LC, and an adhesive material (insulating adhesive material) NCL3 for adhering and fixing a stacked body MCS of the memory chips MC1, MC2, MC3 and MC4 on the redistribution chip RDC. In addition, the adhesive materials NCL1, NCL2 and NCL3 are each formed of an insulating (non-conductive) material (e.g., resin material) and thus capable of electrically insulating between each two of the plurality of electrodes provided to each of the joint portions by being disposed at the joint portion of the logic chip LC and the wiring board 2, the joint portion of the logic chip LC and the redistribution chip RDC, and the joint portion of the redistribution chip RDC and the stacked body MCS, respectively.

Further, in the example illustrated in FIG. 4, a sealing body (sealing body for stacked chip body; resin body for stacked chip body) 6 that is different from the sealing body 4 is disposed between each two of the plurality of memory chips MC, MC2, MC3 and MC4. The stacked body MCS of the memory chips MC1, MC2, MC3 and MC4 is sealed by the sealing body 6. The sealing body 6 is buried so as to be tightly adhered to the front surface 3a and the back surface 3b of each of the memory chips MC1, MC2, MC3 and MC4 and the stacked bodies MCS of the memory chips MC1, MC2, MC3 and MC4 are integrated by the joint portions between each two of the semiconductor chips 3 and the sealing body 6. In addition, the sealing body 6 is formed of an insulating (non-conductive) material (e.g., resin material). Note that, in the stacked body MCS of the memory chips MC1, MC2, MC3 and MC4, the front surface 3a of the memory chip MC1 mounted at the lowermost stage (a position closest to the logic chip LC) is exposed from the sealing body 6 as illustrated in FIG. 4. Moreover, as illustrated in FIGS. 3 and 4, in the stacked body MCS of the memory chips MC1, MC2, MC3 and MC4, the back surface 3b of the memory chip MC4 disposed at the uppermost stage is exposed from the sealing body 6.

Moreover, the semiconductor device 1 includes the sealing body 4 for sealing the plurality of semiconductor chips 3. The sealing body 4 has an upper surface (surface; front surface) 4a, a lower surface (surface, back surface) 4b positioned opposite to the upper surface 4a, and side surfaces 4c positioned between the upper surface 4a and the lower surface 4b. The sealing body 4 has a rectangular outer shape in a, plan view. In the example illustrated in FIG. 1, a planar size (size when viewed from the upper surface 4a side; outer size of the upper surface 4a) of the sealing body 4 is the same as the planar size of the wiring board 2. The side surfaces 4c of the sealing body 4 are continuous with the side surfaces 2c of the wiring board 2. In addition, in the example illustrated in FIG. 1, the planar size (size in a plan view) of the sealing body 4 is a square having a length of one side that is, for example, about 14 mm.

The sealing body 4 is a resin body for protecting the plurality of semiconductor chips 3 and thus it is possible to suppress damages to the thin semiconductor chips 3 by forming the sealing body 4 tightly adhering to the semiconductor chips 3 and the wiring board 2. Also, the sealing body 4 is formed of material such as that as explained below in view of improving the function of a protective member. The sealing body 4 preferably contains a thermosetting resin such as an epoxy-based resin because it is required to be easy to tightly adhere between each two of the plurality of semiconductor chips 3 and to the semiconductor chips 3 and the wiring board 2 and also hardness (rigidness) to some extent after sealing. In addition, to improve the function of the sealing body 4 after curing, the sealing body 4 preferably has filler particles such as silica (silicon dioxide: $SiO_2$) or the like mixed in its resin material. For example, in view of suppressing damages to the semiconductor chips 3 due to thermal deformation after forming the sealing body 4, it is preferable to adjust the percentage of mixing the filler particles to make the linear expansion coefficients of the semiconductor chips 3 and the sealing body 4 closer.

<Circuit Configuration of the Semiconductor Device>

Next, a circuit configuration example of the semiconductor device 1 will be described. As illustrated in FIG. 5, in the logic chip LC, in addition to the processor circuit PU, a control circuit CU which controls operation of a main memory circuit MM of the memory chips MC1, MC2, MC3 and MC4 is formed. Also, in the logic chip LC, a subsidiary memory circuit (memory circuit) SM having a smaller memory capacity than the main memory circuit MM such as a cache memory which temporally stores data or the like is formed. In FIG. 5, as an example, a core circuit (main circuit) CR1 is illustrated to collectively denote the processor circuit PU, the control circuit CU and the subsidiary memory circuit SM. Note that circuits included in the core circuit CR1 may include other circuits than those mentioned above.

In addition, an external interface circuit (external input/output circuit) GIF, which inputs and outputs signals to and from external devices not illustrated, is formed in the logic chip LC. To the external interface circuit GIF, signal lines SG for transmitting signals between the logic chip LC and the external devices not illustrated are connected. Also, the external interface circuit GIF is also electrically connected to the core circuit CR1 and the core circuit CR1 can transfer signals with the external devices via the external interface circuit GIF.

Further, in the logic chip LC, an internal interface circuit (inner input/output circuit) NIF, which inputs and outputs signals to and from internal devices (e.g., the redistribution chip RDC and the memory chips MC1, MC2, MC3 and MC4), is formed. To the internal interface circuit NIF, data lines (signal lines) DS for transferring data signals, address lines (signal lines) AS for transferring address signals, and signal lines OS for transferring other signals are connected. The data lines DS, address lines AS and signal lines OS are connected to the internal interface circuit NIF of the memory chips MC1, MC2, MC3 and MC4. In FIG. 5, a circuit which inputs and outputs signals to and from other electronic parts than the logic chip LC such as the external interface circuit GIF and the internal interface circuit NIF is illustrated as an input/output circuit NS1.

Moreover, in the logic chip LC, a power circuit DR which supplies a potential for driving the core circuit CR1 and the input/output circuit. NS1 is provided. The power circuit DR includes a power circuit (power circuit for input/output) DR1 which supplies a voltage for driving the input/output circuit NS1 of the logic chip LC, and a power circuit (power circuit for core) DR2 which supplies a voltage for driving the core circuit CR1 of the logic chip LC. For example, a plurality of different potentials (e.g., a first power potential and a second power potential) are supplied to the power circuit DR and a voltage to be applied to the core circuit CR1 and the input/output circuit NS1 is defined by a potential difference of the plurality of potentials.

A chip like the logic chip LC, in which circuits required for operation of a device or a system are collectively formed in one of the semiconductor chips 3, is called an SoC (System on a Chip) Note that, when the main memory circuit MM illustrated in FIG. 5 is formed in the logic chip LC, a system can be configured by one logic chip LC. However, the required capacity of the main memory circuit MM (see FIG. 5) differs in accordance with a device or a system to operate. Accordingly, by forming the main memory circuit MM to another semiconductor chip 3 different from the logic chip LC, commodity of the logic chip LC can be improved.

In addition, by connecting a plurality of chips of the memory chips MC1, MC2, MC3 and MC4 in accordance with the required memory capacity of the main memory circuit MM, freedom in design of the capacity of memory circuits provided in a system is improved. In the example illustrated in FIG. 5, the main memory circuit MM is formed to each of the memory chips MC1, MC2, MC3 and MC4. In FIG. 5, the main memory circuit MM is illustrated as a core circuit (main circuit) CR2 of the memory chips MC1, MC2, MC3 and MC4. Note that other circuits than the main memory circuit MM may be included in the circuits included in the core circuit CR2.

In each of the memory chips MC1, MC2, MC3 and MC4, an internal interface circuit (internal input-output circuit) NIF for inputting and outputting signals to and from internal devices (e.g., the redistribution chip RDC and the logic chip LC). In FIG. 5, the internal interface circuit NIF for inputting and outputting signals to and from electronic parts other than the memory chips MC1, MC2, MC3 and MC4 is illustrated as an input/output circuit NS2.

The memory chips MC1, MC2, MC3 and MC4 each includes a power circuit (driving circuit) DR for supplying a potential for driving the core circuit CR2 and input/output circuit NS2. The power circuit DR includes a power circuit (power circuit for input/output) DR3 for supplying a voltage for driving the input/output circuit NS2 of the memory chips MC1, MC2, MC3 and MC4, and a power circuit DR4 (power circuit for core) DR4 for supplying a voltage for driving the core circuit CR2 of the memory chips MC1, MC2, MC3 and MC4. For example, a plurality of different potentials (e.g., a first power potential and a second power potential) are supplied to the power circuit DR and a voltage to be applied to the core circuit CR2 and the input/output circuit NS2 is defined by a potential difference of the plurality of potentials.

Note that, in the example illustrated in FIG. 5, the power circuit DR1 of the logic chip LC and the power circuit DR3 of the memory chips MC1, MC2, MC3 and MC4 are commonly used. In other words, the input/output circuit NS1 of the logic chip LC and the input/output circuit NS2 of the memory chips MC1, MC2, MC3 and MC4 are driven when the same voltage supplied from a power line V2 is applied thereto. In this manner, by commonly using a part or the whole of the power circuit DR, the number of power lines V1, V2 and V3 for supplying a potential (driving voltage) to the power circuit can be reduced. Also, when the number of power lines V1, V2 and V3 can be reduced, the number of electrodes formed in the logic chip LC can be reduced.

In addition, the redistribution chip DRC is disposed between paths electrically connecting the logic chip LC and the memory chips MC1, MC2, MC3 and MC4. In other words, the logic chip LC and the memory chips MC1, MC2, MC3 and MC4 are electrically connected to each other via the redistribution chip RDC. In the example illustrated in FIG. 5, the core circuits CR1 and CR2 and the input/output circuits NS1 and NS2 including semiconductor elements such as transistors and diodes as components of the circuits are not formed in the redistribution chip RDC. In the redistribution chip RDC illustrated in FIG. 5, only a relay circuit TC for electrically connecting the logic chip LC and the memory chips MC1, MC2, MC3 and MC4 via a conductor pattern (redistribution) formed to the semiconductor substrate is formed. However, as a modification example to the example in FIG. 5, a circuit including semiconductor elements such as transistors and diodes as components can be formed in the redistribution chip RDC. This modification example will be described later.

A device like the semiconductor device 1, in which circuits necessary for operating a device and/or a system are aggregated in one semiconductor device 1, is called a SiP (System in Package). Note that, while an example in which the four memory chips MC1, MC2, MC3 and MC4 are stacked on one logic chip LC in FIG. 4, as mentioned above, there are various modification examples of the number of the semiconductor chips 3. Although not illustrated, for example, as a minimum configuration, a modification example of the semiconductor chip 3 in which one memory chip MC1 is mounted over one logic chip LC via one redistribution chip RDC can be applied.

Also, in view of improving the commodity of the logic chip LC and the memory chips MC1, MC2, MC3 and MC4, the planar size (dimensions in a plan view, dimensions of the surface 3a and back surface 3b, external dimensions) of the logic chip LC and the memory chips MC1, MC2, MC3 and MC4 are preferably made minimum in a range in which the functions of respective semiconductor chips 3 are achievable. Planar size of the logic chip LC can be reduces by improving the density of the circuit elements. However, since the capacity and transmission rate (e.g., data transfer amount of a data bus) of the main memory circuit MM are varied, there is a limit in down-sizing the planar size of the memory chip.

Thus, in the example illustrated in FIG. 4, the planar size of the memory chip MC4 is larger than the planar size of the logic chip LC. For example, the planar size of the memory chip MC4 is a rectangle having its one side that is about 8 to 10 mm. The planar size of the logic chip LC is a rectangle having its one side that is about 5 to 6 mm. Also, although not illustrated, the planar sizes of the of memory chips MC1, MC2, MC3 and MC4 is the same as the planar size of the memory chip MC4.

Also, as described above, since the external interface circuit GIF, which is for inputting and outputting signals to and from external devices not illustrated, is formed in the logic chip LC, in view of shortening the transmission distance to the external devices, the order of stacking the plurality of semiconductor chips 3 preferably mount the logic chip LC at the undermost stage, i.e., at a position closest to the wiring board 2. That is, it is preferable to make a configuration in which the semiconductor chips 3 (memory chips MC1, MC2, MC3 and MC4) having a larger planar size are stacked on the semiconductor chips 3 having smaller planar size (logic chip LC) like the semiconductor device 1.

<Details of Electrical Connection Method of Stacked Semiconductor Chips>

Figure 6:
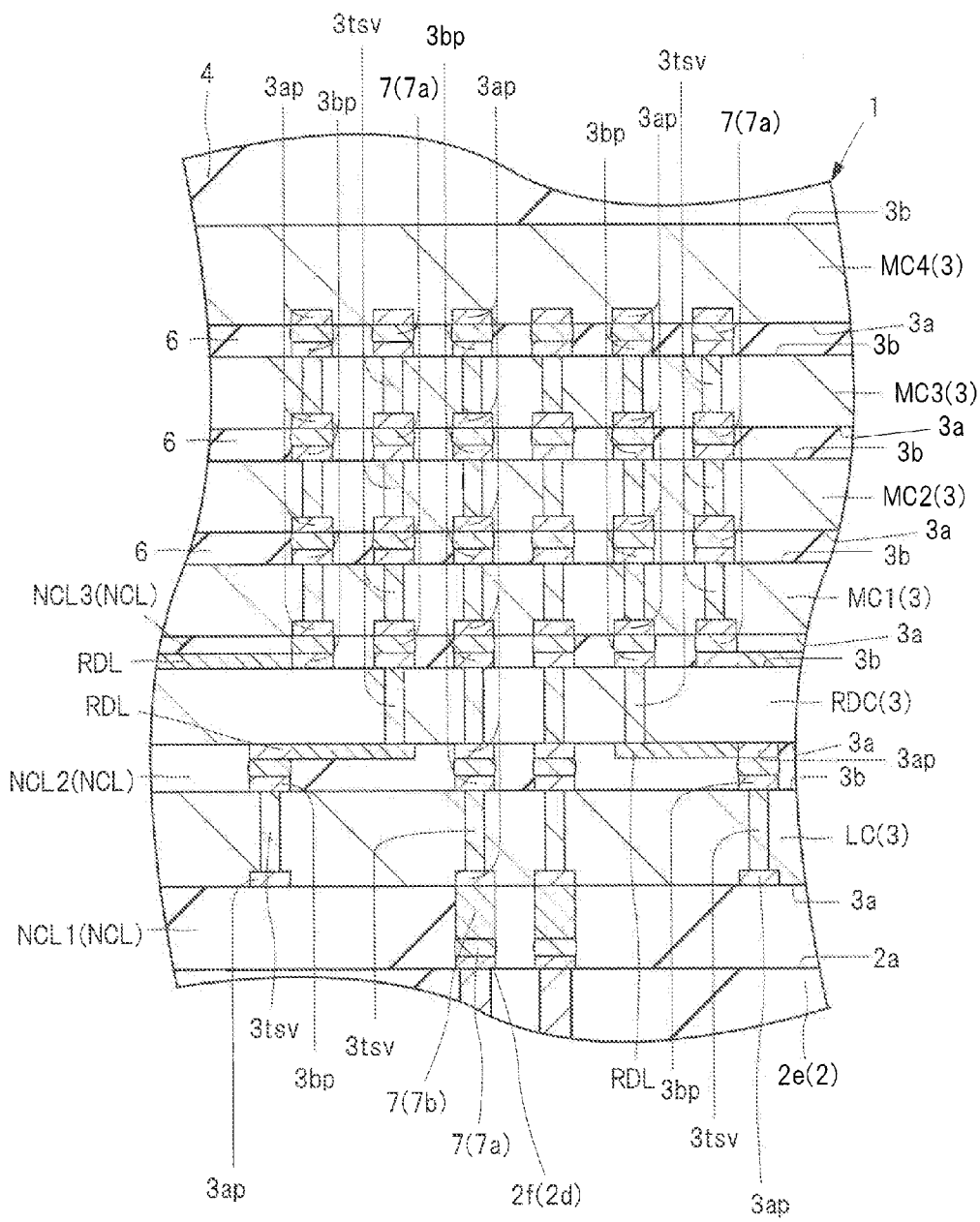
FIG. 6 is an enlarged cross-sectional view illustrating the A part illustrated in FIG. 4.
Figure 7:
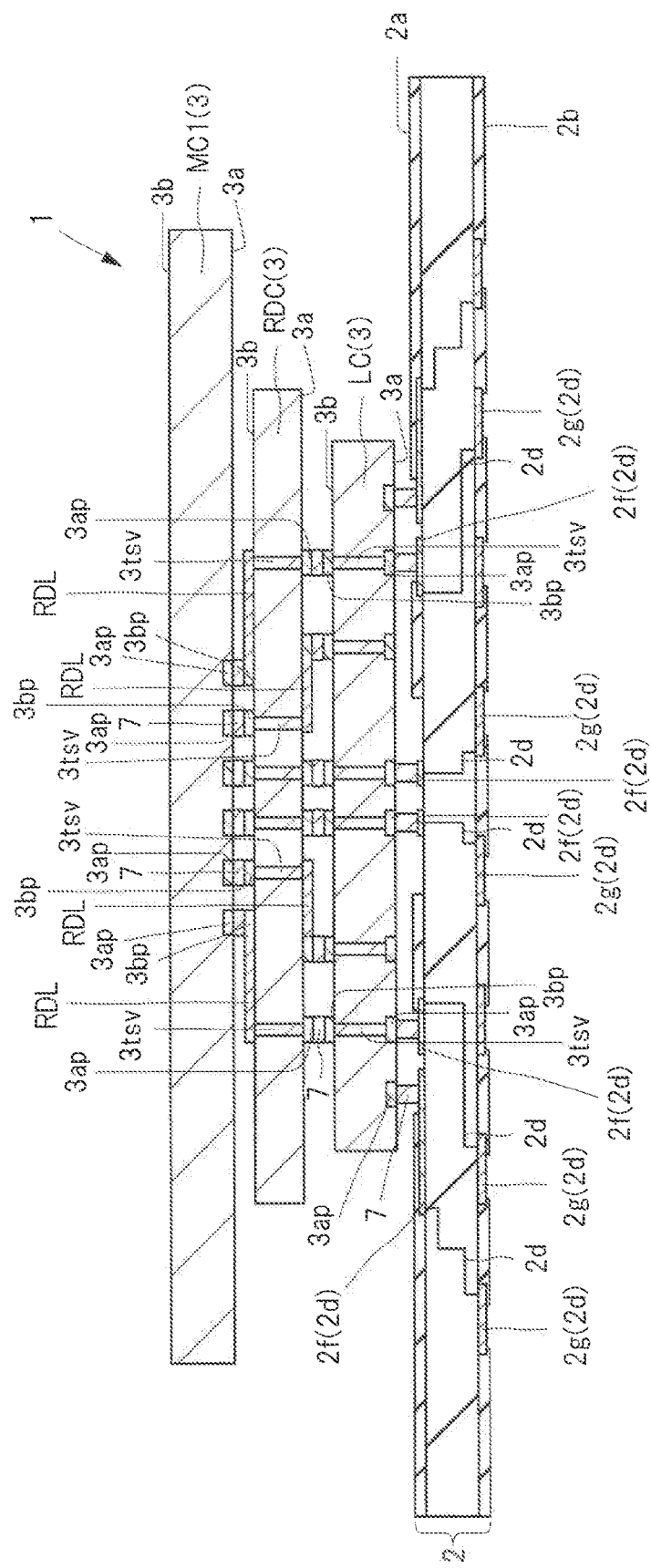
FIG. 7 is an explanatory diagram illustrating a stacked structure of a plurality of semiconductor chips illustrated in FIG. 4 in a simpler way.
Figure 46:
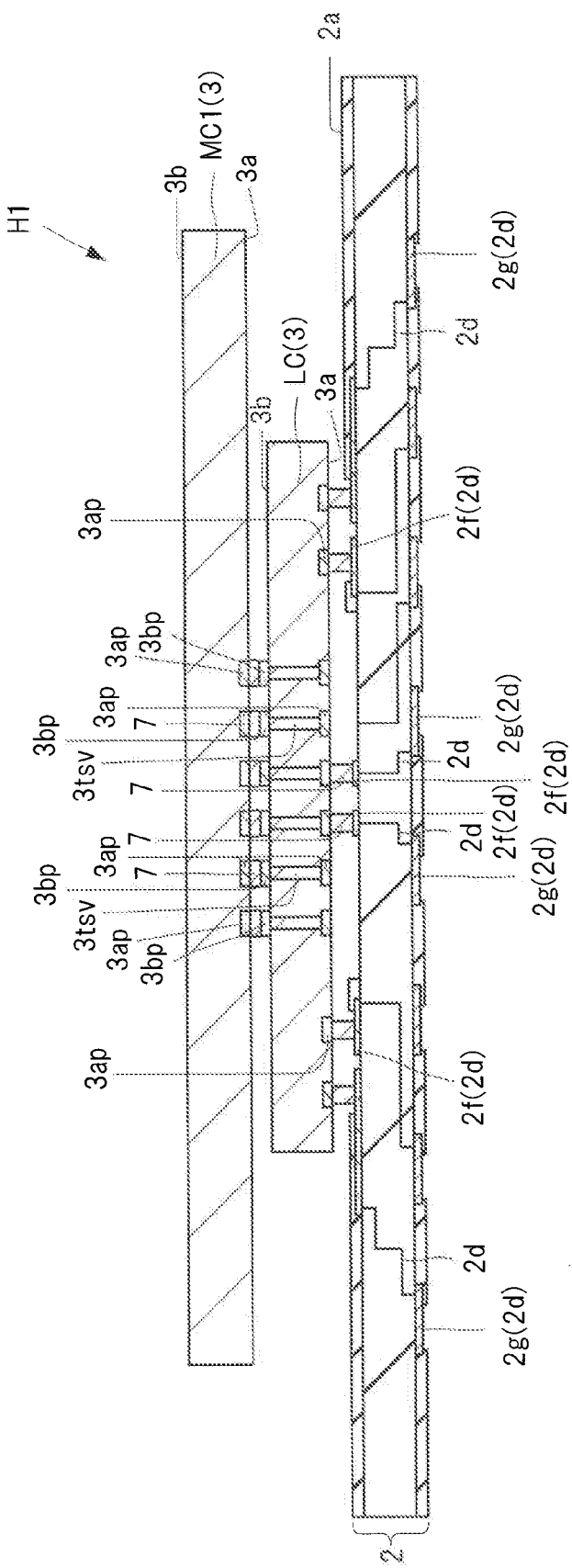
FIG. 46 is an enlarged cross-sectional view illustrating a first study example corresponding to FIG. 7.
Figure 47:
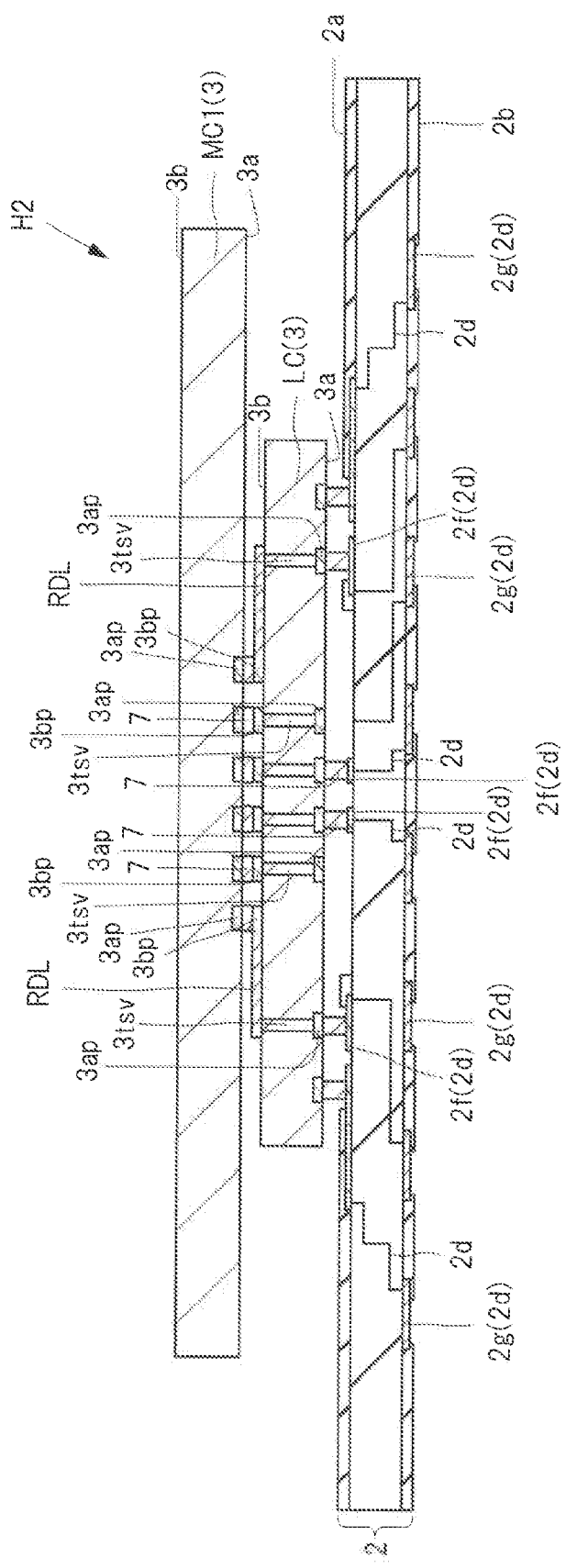
FIG. 47 is an enlarged cross-sectional view illustrating a second study example corresponding to FIG. 7.

Next, details of the logic chip LC and the memory chips MC1, MC2, MC3 and MC4 illustrated in FIGS. 3 and 4 and an electrical connection method of the respective semiconductor chips 3 will be described. FIG. 6 is an enlarged cross-sectional view of an "A" part illustrated in FIG. 4. FIG. 7 is an explanatory diagram illustrating a stacked structure of the plurality of semiconductor chips illustrated in FIG. 4 in a simplified way. FIGS. 46 and 47 are enlarged cross-sectional views illustrating a studied example corresponding to FIG. 7. In FIGS. 6 and 7, while the number of electrodes is smaller for an easy view, the number of electrodes (front surface electrode 3ap, back surface electrode 3bp and through silicon via 3tsv) is not limited to the aspect illustrated in FIGS. 6 and 7.

The inventors of the present invention has been studied technique of improving SiP type semiconductor devices and as a part of the study, they studied technology of improving the signal transmission rate among a plurality of semiconductor chips mounted on an SiP to 12 Gbps (12 gigabits per second) or faster. As a method of improving transmission rate among a plurality of semiconductor chips mounted on an SiP, there is a method of increasing the amount of transferring data per single transfer by increasing the width of a data bus of an internal interface (hereinafter, mentioned as bus-width enhancement). In addition, as another method, there is a method of increasing the number of transfer cycles per unit time (hereinafter, mentioned as clock-frequency increase). Further, there is a method of combining the bus-width enhancement and the clock-frequency increase. The semiconductor device 1 described with reference to FIGS. 1 to 5 is a semiconductor device in which the transmission rate of the internal interface is improved to 12 Gbps or faster by using a combination of the bus-width enhancement and the clock-frequency increase.

Each of the memory chips MC1, MC2, MC3 and MC4 illustrated in FIG. 4 is, for example, what is called a wide I/O memory having a data-bus width of 512 bits. In detail, the memory chips MC1, MC2, MC3 and MC4 each has a channel with a data-bus width of 128 bits and thus the total bus width is 512 bits. In addition, the number of transfer cycles per unit time of each of the channels is increased for the clock-frequency increase and the number is, for example, 3 Gbps or more, respectively.

In this manner, when combining the clock-frequency increase and the bus-width enhancement, it is required to operate a large number of data lines at a high speed. Thus, in view of reducing influence of noise, it is preferable to shorten the data transfer distances. Accordingly, as illustrated in FIG. 4, the logic chip LC and the memory chip MC1 are electrically connected via a conductive member disposed between the logic chip LC and the memory chip MC1. Also, the plurality of memory chips MC1, MC2, MC3 and MC4 are electrically connected via a conductive member disposed between the plurality of memory chips MC1, MC2, MC3 and MC4, respectively. In other words, in the semiconductor device 1, the wiring board 2 and not-illustrated wires (bonding wires) are not included in transfer paths between the logic chip LC and the memory chip MC1. Also, in the semiconductor device 1, the wiring board 2 and not-illustrated wires (bonding wires) are not included in transfer paths among the plurality of memory chips MC1, MC2, MC3 and MC4. Further, when bonding wires are not interposed in the transfer paths of the stacked plurality of semiconductor chips, space of the wire-bonding can be omitted, thereby enabling downsizing of the planar size of the whole package.

As a method of connecting the plurality of semiconductor chips 3 without via wires, in the present embodiment, used technology is such that through silicon vias penetrating through the semiconductor chips 3 in the thickness direction are formed to mutually connect the stacked semiconductor chips 3 via the through silicon vias. In more details, the logic chip LC includes a plurality of surface electrodes (electrodes, pads) 3ap formed to the surface 3a, and the plurality of back surface electrodes (electrodes, pads) 3bp formed to the back surface 3b. In addition, the logic chip LC includes the plurality of through silicon vias 3tsv formed to penetrate from one of the surface 3a and the back surface 3b to the other and electrically connecting the plurality of front surface electrodes 3ap and the plurality of back surface electrodes 3bp.

Each circuit included in the semiconductor chip 3 is formed on the surface 3a side of the semiconductor chip 3. In detail, the semiconductor chip 3 includes a semiconductor substrate (not illustrated) formed of silicon (Si) and a plurality of semiconductor elements (not illustrated) such as transistors are formed on a main surface (element formation surface) of the semiconductor substrate. On the main surface (on the surface 3a side) of the semiconductor substrate, wiring layers (not illustrated) including an insulating film for insulation between a plurality of wirings and a plurality of wirings are stacked. The wirings of the wiring layers are electrically connected to the plurality of semiconductor elements, respectively, thereby configuring a circuit. The plurality of front surface electrodes 3ap formed to the surface 3 (see FIG. 3) of the semiconductor chip 3 are electrically connected to the semiconductor elements via the wiring layers provided, between the semiconductor substrate and the surface 3a, thereby configuring a part of the circuit.

Thus, as illustrated in FIG. 6, by forming the through silicon vias 3tsv penetrating the semiconductor chip 3 in the thickness direction and electrically connecting the front surface electrodes 3ap and the back surface electrodes 3bp via the through silicon vias 3tsv, the back surface electrodes 3bp and the circuits of the semiconductor chip 3 formed on the surface 3a side can be electrically connected to each other. That is, as illustrated in FIG. 6, when the front surface electrodes 3ap on the upper stage side and the back surface electrodes 3bp on the lower stage side are electrically connected via a conductive member such as a joint material (conductive member, bump electrode, protrusion electrode) 7, the circuit of the semiconductor chip 3 on the upper stage side and the circuit of the semiconductor chip 3 on the lower stage side are electrically connected to each other via the through silicon vias 3tsv.

Also, in the example illustrated in FIG. 6, the logic chip LC and the re-distribution chip RDC mounted between the memory chip MC1 and the wiring board 2 each includes the plurality of through silicon vias 3tsv. Thus, by electrically connecting the memory chip MC1 and the logic chip LC via the through silicon via 3tsv, the wiring board 2 and wires (bonding wires) not illustrated can be eliminated from the transfer path between the logic chip LC and the memory chip MC1. As a result, the impedance components in the transfer path between the logic chip LC and the memory chip MC1 are reduced and thus influence of noise by increasing clocks can be reduced. In other words, even when the signal transmission rate between the logic chip LC and the memory chip MC1 is increased, the transfer reliability can be improved.

Figure 41:
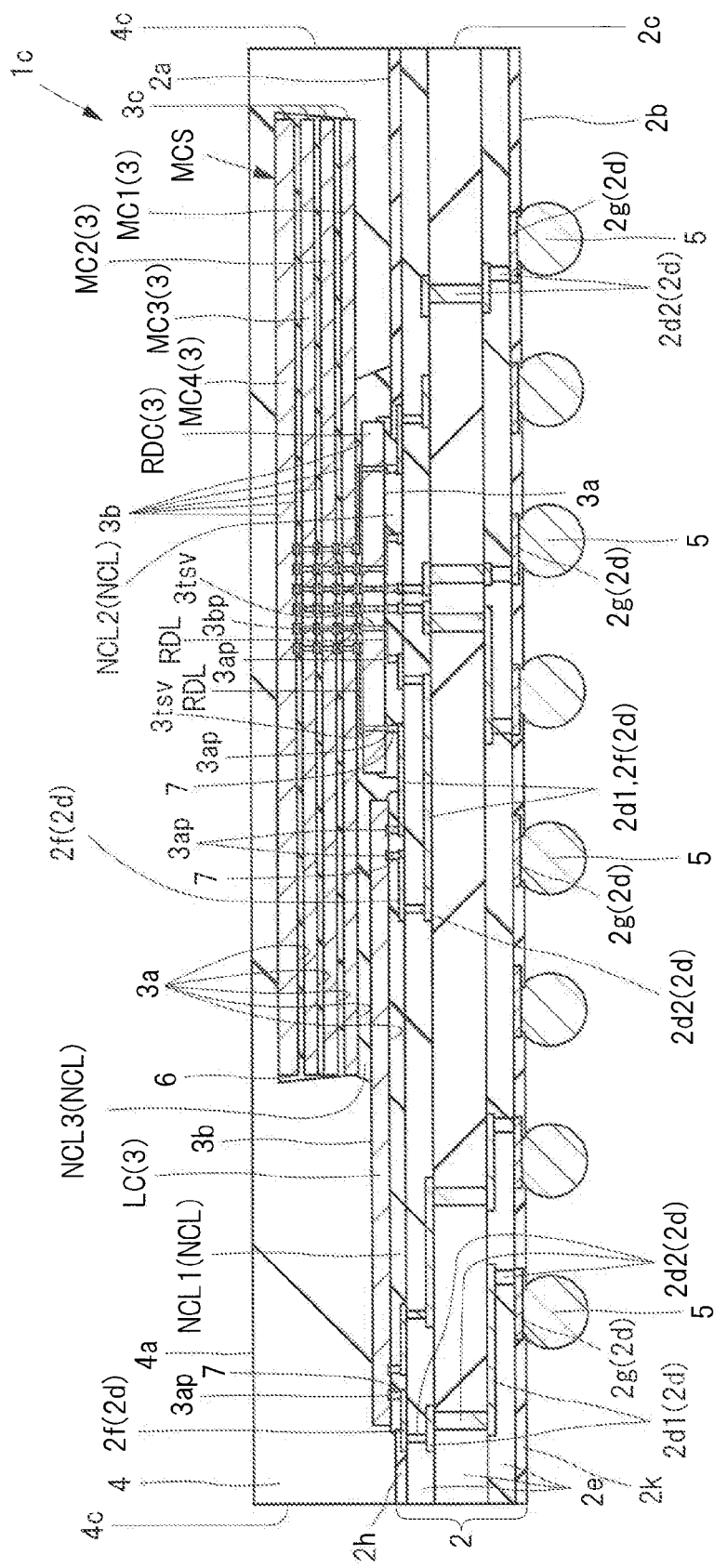
FIG. 41 is a cross-sectional view of a semiconductor device according to a modification example with respect to FIG. 4.

Here, when electrically connecting the memory chip MC1 and the logic chip LC via the through silicon vias 3tsv formed to the logic chip LC, like a semiconductor device H1 illustrated in FIG. 41, a structure in which the memory chip MC1 is directly mounted on the logic chip LC via the joint material 7 is conceivable. In this case, however, as illustrated in FIG. 46, the front surface electrodes 3ap of the memory chip MC1 and the back surface electrodes 3bp, the through silicon vias 3tsv and the front surface electrodes 3ap of the logic chip LC are linearly disposed such that they are overlapped in the thickness direction. In addition, the joint material 7 joined to the front surface electrodes 3*ap* of the logic chip LC and the bonding leads 2*f* of the wiring board 2 joined to the joint material 7 are also disposed such that they overlap the front surface electrodes 3*ap* of the memory chip MC1 in the thickness direction.

However, as to the semiconductor device H1, the layout of the plurality of front surface electrodes 3*ap*, the plurality of through silicon vias 3*tsv* and the plurality of back surface electrodes 3*bp* of the logic chip LC is limited by the layout of the plurality of front surface electrodes 3*ap* of the memory chip MC1. Also, on the contrary, the layout of the plurality of front surface electrodes 3*ap* of the memory chip MC1 is limited by the layout of the plurality of front surface electrodes 3*ap*, the plurality of through silicon vias 3*tsv* and the plurality of back surface electrodes 3*bp* of the logic chip LC.

For example, as illustrated in FIG. 46, when the planar size of the logic chip LC is smaller than that of the memory chip MC1, the memory chip MC1 cannot be electrically connected to the logic chip LC if the front surface electrodes 3*ap* of the memory chip MC1 are disposed in a circumferential portion of the surface 3*a*. Thus, it is required to arrange the plurality of front surface electrodes 3*ap* of the memory chip MC1 at positions overlapping the back surface electrode 3*b* of the logic chip LC. In addition, it is required to arrange the plurality of front surface electrodes 3*ap*, the plurality of through silicon vias 3*tsv* and the back surface electrodes 3*bp* of the logic chip LC at positions overlapping the plurality of front surface electrodes 3*ap* of the memory chip MC1 in the thickness direction.

Each of the logic chip LC and the memory chip MC1 has an optimum layout of the front surface electrodes 3*ap* and the circuit region including semiconductor elements in accordance with demands of electrical characteristics and downsizing of planar sizes. However, like the semiconductor device H1, in the case of the structure in which the memory chip MC1 is mounted directly on the logic chip LC via the joint material 7, to electrically connect the front surface electrodes 3*ap* of the memory chip MC1 and the back surface electrodes 3*bp* of the logic chip LC, the layout of the front surface electrodes 3*ap* and the circuit region including semiconductor elements has limitations. That is, in the case of the semiconductor device H1, to electrically connect the front surface electrodes 3*ap* of the memory chip MC1 and the back surface electrodes 3*bp* of the logic chip LC, freedom in design of each of the semiconductor chips 3 is lowered.

Particularly, like the logic chip LC, when a large number of circuits including the central processor circuit CPU (see FIG. 5) are integrated on one semiconductor chip 3, the manufacturing process is complex. Thus, from the view point of improving the manufacturing efficiency of the logic chip LC, it is preferable to reduce the planar size to increase the number of the logic chips LC obtainable from one semiconductor wafer. However, if there is a limitation in the layout of the circuit region including the semiconductor elements and the front surface electrode 3*ap* for electrically connecting the front surface electrode 3*ap* of the memory chip MC1 and the back surface electrode 3*bp* of the logic chip LC, it is difficult to sufficiently reduce the planar size of the logic chip LC.

In addition, as a method of improving the degree of freedom in design more than the semiconductor device H1 illustrated in FIG. 46, there is one method of forming a lead wiring (redistribution line) RDL which electrically connects the back surface electrode 3*bp* and the through silicon via 3*tsv* to the back surface 3*b* of the logic chip LC like the semiconductor device H2 illustrated in FIG. 47. In the case of the semiconductor device H2, as illustrated in FIG. 47, a part of the back surface electrode 3*bp* and the front surface electrode 3*ap* of the logic chip LC can be disposed at a position not overlapped in the thickness direction. Thus, the limitation in layout of the plurality of front surface electrodes 3*ap* and the plurality of through silicon vias 3*tsv* of the logic chip LC is reduced as compared with the semiconductor device H1 illustrated in FIG. 46.

However, when forming the lead wiring RDL to the logic chip LC, the manufacturing process of the logic chip LC is more complicated. Further, since yield of the process of forming the lead wiring RDL influences yield of the logic chip LC, there is a concern about lowering of manufacturing efficiency of the logic chip LC.

Accordingly, in the present embodiment, the structure of the semiconductor device 1 illustrated in FIG. 7 is used. The semiconductor device 1 includes a wiring board having the upper surface 2*a* and the lower surface 2*b* that is opposite to the upper surface 2*a*. To the lower surface 2*b* opposite to the upper surface 2*a* that is a chip-mounting surface of the wiring board 2, a plurality of lands 2*g* which are external terminals are formed.

Also, the semiconductor device 1 includes the logic chip LC which has the surface 3*a*, the plurality of front surface electrodes 3*ap* formed to the surface 3*a*, the back surface 3*b* opposite to the surface 3*a*, and the plurality of back surface electrodes 3*bp* formed to the back surface 3*b*. The plurality of front surface electrodes 3*ap* and the plurality of back surface electrodes 3*bp* of the logic chip LC are formed at positions overlapping each other in the thickness direction (in a planar view). In addition, the plurality of front surface electrodes 3*ap* are electrically connected to the plurality of back surface electrodes 3*bp* to each other via the plurality of through silicon vias 3*tsv* formed between the plurality of front surface electrodes 3*ap* and the plurality of back surface electrodes 3*bp*. Moreover, the logic chip LC is mounted onto the upper surface 2*a* of the wiring board 2 such that the surface 3*a* faces the upper surface 2*a* of the wiring board 2.

In addition, the semiconductor device 1 includes the redistribution chip RDC (semiconductor chip 3) which has the surface 3*a*, the plurality of front surface electrodes 3*ap* formed to the surface 3*a*, the back surface 3*b* opposite to the surface 3*a*, and the plurality of back surface electrodes 3*bp* formed to the back surface 3*b*. Also, the redistribution chip RDC has the plurality of through silicon vias 3*tsv* which penetrate the redistribution chip RDC from one of the surface 3*a* and the back surface 3*b* toward the other. Moreover, the redistribution chip RDC has the plurality of lead wirings (redistribution wirings) RDL which are formed to the surface 3*a* or the back surface 3*b* and electrically connecting the plurality of through silicon vias 3*tsv* and the plurality of front surface electrodes 3*ap* or the plurality of back surface electrodes 3*bp*. In the example illustrated in FIG. 7, since there is an advantage in the capability of making the space for disposing the lead wirings RDL wide, the example of forming the lead wirings RDL to both the surface 3*a* and the back surface 3*b*. However, as a modified example, the lead wirings RDL may be formed to either of the surface 3*a* or the back surface 3*b*. The plurality of front surface electrodes 3*ap* and the plurality of back surface electrodes 3*bp* are electrically connected to each other via the plurality of through silicon vias 3*tsv* and the plurality of lead wiring RDL. Moreover, the redistribution chip RDC is mounted over the back surface 3*b* of the logic chip LC.

Further, the semiconductor device 1 includes the memory chip MC1 (semiconductor chip 3) which has the surface 3*a*, the plurality of front surface electrodes 3*ap* formed to the surface 3*a*, and the back surface 3*b* opposite to the surface 3*a*.

The plurality of front surface electrodes 3*ap* of the memory chip MC1 are disposed to face the plurality of back surface electrodes 3*bp* of the redistribution chip RDC and electrically connected to the plurality of back surface electrodes 3*bp* via the joint material 7, for example. In addition, the memory chip MC1 is disposed such that the surface 3*a* of the memory chip MC1 faces the back surface 3*b* of the redirection chip RDC. Moreover, the planar size (for example, a planar area of the surface 3*b*) of the memory chip MC1 is larger than a planar size (for example, planar area of the back surface 3*b*) of the logic chip LC.

In the semiconductor device 1 configured in the above-described manner, when the redistribution chip RDC is used, the plurality of front surface electrodes 3*ap* and the plurality of back surface electrodes 3*bp* can be disposed at different planar positions in the planar view (more specifically, when viewing the electrodes from the surface 3*a* or the back surface 3*b* side in the thickness direction). For example, in the example illustrated in FIG. 7, at least a part of the plurality of back surface electrodes 3*bp* electrically connected to the plurality of front surface electrodes 3*ap* is disposed at a position not overlapping in the thickness direction. However, the plurality of front surface electrodes 3*ap* of the redistribution chip RDC and the plurality of back surface electrodes 3*bp* of the logic chip LC are disposed at positions overlapping in the thickness direction (positions facing to each other). Further, the plurality of through silicon vias 3*tsv* and the plurality of front surface electrodes 3*ap* electrically connected to the plurality of back surface electrodes 3*bp* of the logic chip LC are disposed to be overlapped with each other in the thickness direction.

Therefore, the plurality of front surface electrodes 3*ap* of the memory chip MC and the plurality of back surface electrodes 3*bp* of the redistribution chip RDC are disposed at positions overlapping each other in the thickness direction and electrically connected via the joint material 7. Also, the plurality of back surface electrodes 3*bp* of the logic chip LC and the plurality of front surface electrodes 3*ap* of the redistribution chip RDC are disposed at positions overlapping each other in the thickness direction and electrically connected via the joint material 7.

More specifically, in the present embodiment, between the logic chip LC and the memory chip MC1, the redistribution chip RDC having the plurality of lead wirings RDL for adjusting the positions of the electrodes of the logic chip LC and the memory chip MC1 is disposed such that the planar arrangement of the electrodes is transformed. As a result, in the memory chip MC1, with the most optimum layout in view of the requirements of electric characteristics and downsizing etc., the circuit areas including the semiconductor elements and the front surface electrodes 3*ap* can be formed. On the other hand, in the logic chip LC, although it is necessary to ensure space for disposing the plurality of through silicon vias 3*tsv*, the layout of the circuit areas including the semiconductor elements and the front surface electrodes 3*ap* can be optimized regardless of the layout of the memory chip MC1.

That is, according to the above-described configuration, the degree of freedom of design of the memory chip MC1 can be improved. In addition, according to the above-described configuration, the degree of freedom of design of the logic chip LC can be improved. Further, by improving the degrees of freedom of design of the memory chip MC1 and the logic chip LC, the planar size of the semiconductor chip 3 of the memory chip MC1 and the logic chip LC can be down-sized. Still further, by downsizing the planar size of the semiconductor chip 3 of the memory chip MC1 and the logic chip LC, the obtainable number of the semiconductor chips 3 from one semiconductor wafer is increased and thus the manufacturing efficiency of the semiconductor chips 3 is improved. Moreover, since the planar positions of the electrodes of the redistribution chip RDC are transformed as described above, the plurality of through silicon vias 3*tsv* and the plurality of front surface electrodes 3*ap* electrically connected to the plurality of back surface electrodes 3*bp* of the logic chip LC can be disposed at positions overlapping in the thickness direction. Therefore, the manufacturing process of the logic chip LC can be simplified and yield can be improved.

Note that, in view of reducing the impedance component in the transmission path for electrically connecting the memory chip MC1 and the logic chip LC, as illustrated in FIGS. 46 and 47, it is preferable to mount the memory chip MC1 directly on the logic chip LC. However, by using the semiconductor substrate as a base material in the redistribution chip RDC, the lead wiring RDL, the through silicon via 3*tsv*, the front surface electrode 3*ap*, and the back surface electrode 3*bp* can be formed using technology of wirings and electrodes. Therefore, the impedance component in the transmission path can be reduced as compared with the case of electrically connecting the memory chip MC1 and the logic chip LC via bonding wires not illustrated and the wiring board 2.

Also, when the memory chip MC1 and the logic chip LC are electrically connected via the redistribution chip RDC, wide space for disposing the lead wiring RDL can be ensured and thus the number of transmission paths (number of signal lines) connecting the memory chip MC1 and the logic chip LC can be increased. That is, the bus-width enhancement mentioned above can be advanced. In addition, by advancing the bus-width enhancement, the number of transmission per unit time of each signal line can be reduced. Thereby, influence of noise in the transmission path can be reduced. In other words, even when the signal transmission rate between the logic chip LC and the memory chip MC1 is improved, transmission reliability can be improved.

Further, in the example illustrated in FIG. 6, the plurality of memory chips MC1, MC2, MC3 and MC4 are stacked on the logic chip LC; thus, it is preferable to improve the signal transmission rate also among the plurality of memory chips MC1, MC2, MC3 and MC4. Accordingly, in the plurality of memory chips MC1, MC2, MC3 and MC4, the memory chips MC1, MC2 and MC3, onto each of which the semiconductor chip 3 is disposed, have a plurality of through silicon vias 3*tsv* in the same manner as the logic chip LC. More specifically, each of the memory chips MC1, MC2 and MC3 has the plurality of surface electrodes (electrodes, pads) 3*ap* formed to the surface 3*a* and the plurality of back surface electrodes (electrodes, pads) 3*bp* formed to the back surface 3*b*. In addition, each of the memory chips MC1, MC2 and MC3 is formed so as to penetrate from one of the surface 3*a* and the back surface 3*b* toward the other and also has the plurality of through silicon vias 3*tsv* electrically connecting the plurality of plurality of front surface electrodes 3*ap* and the plurality of back surface electrodes 3*bp*.

Therefore, in the same manner as the logic chip LC described above, in the memory chips MC1, MC2, MC3 and MC4, when the front surface electrode 3*ap* of the semiconductor chip 3 on the upper stage side and the back surface electrode 3*bp* of the semiconductor chip 3 on the lower stage side are electrically connected via a conductive member such as the joint material (conductive member, bump electrode) 7, the circuits of the stacked plurality of semiconductor chip 3 are electrically connected via the through silicon vias 3*tsv*.

Consequently, the wiring board 2 and not-illustrated wires (bonding wires) can be eliminated from the transmission path of the memory chips MC1, MC2, MC3 and MC4. As a result, the impedance component in the transmission path among the stacked plurality of memory chips MC1, MC2, MC3 and MC4 can be reduced and influence of noise caused by increasing clock can be reduced. In other words, also in the case of improving the signal transmission rate among the plurality of memory chips MC1, MC2, MC3 and MC4, the transmission reliability can be improved.

Note that, in the example illustrated in FIG. 6, since the memory chip 4 mounted at the top stage may be only connected to the memory chip MC3, although the plurality of front surface electrodes 3ap are formed to the memory chip MC4, the plurality of back surface electrodes 3bp and the plurality of through silicon vias 3tsv are not formed. In this manner, the memory chip MC4 mounted at the top stage can be simplified in its manufacturing process by using the structure which does not have the plurality of back surface electrodes 3bp and the plurality of through silicon vias 3tsv. However, although illustration is omitted, as a modification example, a structure which has the plurality of back surface electrodes 3bp and the plurality of through silicon vias 3tsv same as the memory chips MC1, MC2 and MC3 can be used also as the memory chip MC4. In this case, by making the structures of the stacked plurality of memory chips MC1, MC2, MC3 and MC4 the same, manufacturing efficiency can be improved.

In addition, in the example of FIG. 6, the joint material 7 disposed between the stacked semiconductor chips 3 and electrically connecting the front surface electrode 3ap of the semiconductor chip 3 on the upper stage side and the back surface electrode 3bp of the semiconductor chip on the lower stage side is formed of material as cited below, for example. For example, the joint material 7 is a solder material 7a formed of a so-called lead-free solder and it is, for example, only tin (Sn), tin-bismuth (Sn—Bi), tin-copper-silver (Sn—Cu—Ag), or the like. Here, the lead-free solder means those containing lead (Pb) at a contained amount of 0.1 wt % or lower and this contained amount is regulated as a standard of the directive on the RoHS (Restriction of Hazardous Substances) Hereinafter, in the present embodiment, when a solder material or a solder component is explained, it means a lead-free solder unless otherwise particularly stated that it is not.

In addition, at the joint portion of the front surface electrode 3ap of the logic chip LC and the bonding lead 2f of the wiring board 2, for example, the front surface electrode 3ap of the logic chip IC and the bonding lead 2f of the wiring board 2 are electrically connected via the bump electrode 7b that is a metal member mainly containing copper (Cu) and formed in a pillar shape (for example, columnar shape) and the solder material 7a. More specifically, at a tip of the bump electrode 7b, a nickel (Ni) film and a solder (e.g., SnAg) film are stacked and the solder film at the tip is joined with the bonding lead 2f, thereby electrically connecting the front surface electrode 3ap of the logic chip LC and the bonding lead 2f of the wiring board 2. However, various modification examples can be considered as the material composing the joint material 7 within the range satisfying requirements on electric characteristics or joint strength. For example, the bump electrode 7b may be used at the joint portion between semiconductor chips 3.

Further, like the logic chip LC, the redistribution chip RDC, or the memory chips MC1, MC2, MC3 and MC4 illustrated in FIG. 6, the semiconductor chip 3 having the through silicon via 3tsv preferably has a thickness, that is, a separated distance between the surface 3a and the back surface 3b being thin (small). When the thickness of the semiconductor chip 3 is small, the transmission distance of the through silicon via 3tsv is shortened; thus, it is preferable in the view point of reducing the impedance component. Also, when an opening portion(s) (including penetrating hole and not-penetrating hole) is formed in the thickness direction of the semiconductor substrate, the deeper the depth of the hole, the lower the processing accuracy. In other words, when the thickness of the semiconductor chip 3 is made small, the processing accuracy of the opening portion for forming the through silicon via 3tsv can be improved. Therefore, since the diameters of the plurality of plurality of through silicon vias 3tsv (length in a direction perpendicular to the thickness direction of the semiconductor chip 3; width) can be even, it is easy to control the impedance component of the plurality of transmission paths.

In the example illustrated in FIG. 6, the thickness T1 of the logic chip LC is smaller than the thickness TA of the stacked body MCS (see FIG. 4) of the plurality of memory chips MC1, MC2, MC3 and MC4 disposed on the logic chip LC. For example, the thickness T1 of the logic chip LC is 50 μm. On the other hand, the thickness TA of the stacked body MCS (see FIG. 4) of the plurality of memory chips MC1, MC2, MC3 and MC4 is about 260 μm.

As described above, when thinning the semiconductor chip 3, there is a concern that the semiconductor chip 3 is damaged if the semiconductor chip 3 is exposed. According to the present embodiment, as illustrated in FIG. 4, the sealing body 4 is adhered to the plurality of semiconductor chips 3 to seal them. Therefore, the sealing body 4 functions as a protective member of the semiconductor chip 3 and damage to the semiconductor chip 3 can be suppressed. In other words, according to the present embodiment, by sealing the plurality of semiconductor chips 3 with a resin, the reliability (durability) of the semiconductor device 1 can be improved.

Also, in the case of the semiconductor device 1 in which the semiconductor chips 3 having the through silicon vias 3tsv are stacked, in view of shortening the transmission distance, it is preferable to narrow the gap between the semiconductor chip 3 and the wiring board 2. For example, in the example illustrated in FIG. 6, a gap G1 between the surface 3a of the logic chip LC and the upper surface 2a of the wiring board 2 is, for example, about 20 to 30 μm. In addition, a gap G2 between the surface 3a of the memory chip MC1 and the upper surface of the wiring board 2 is, for example, 70 to 100 μm. In this manner, in the semiconductor device 1 in which the semiconductor chips 3 having the through silicon vias 3tsv are stacked, it is preferable to shorten the transmission distance by reducing the thickness and the separated distance of the semiconductor chip 3.

<Details about the Planar Layout of Each Semiconductor Chip>

Figure 8:
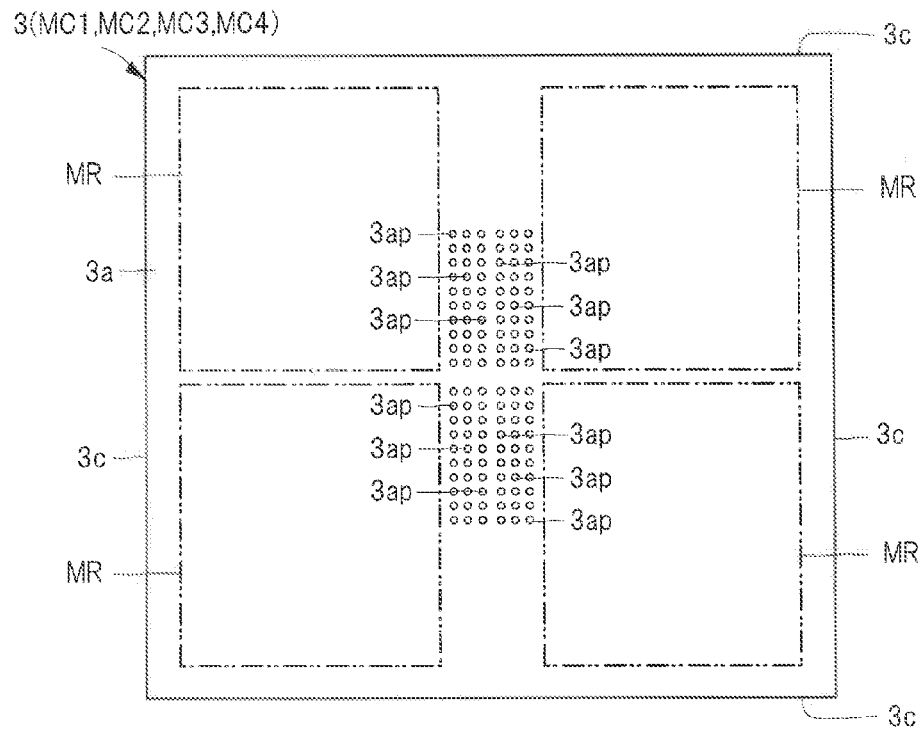
FIG. 8 is a planar view illustrating a layout example on a front surface side of a memory chip illustrated in FIG. 4.
Figure 9:
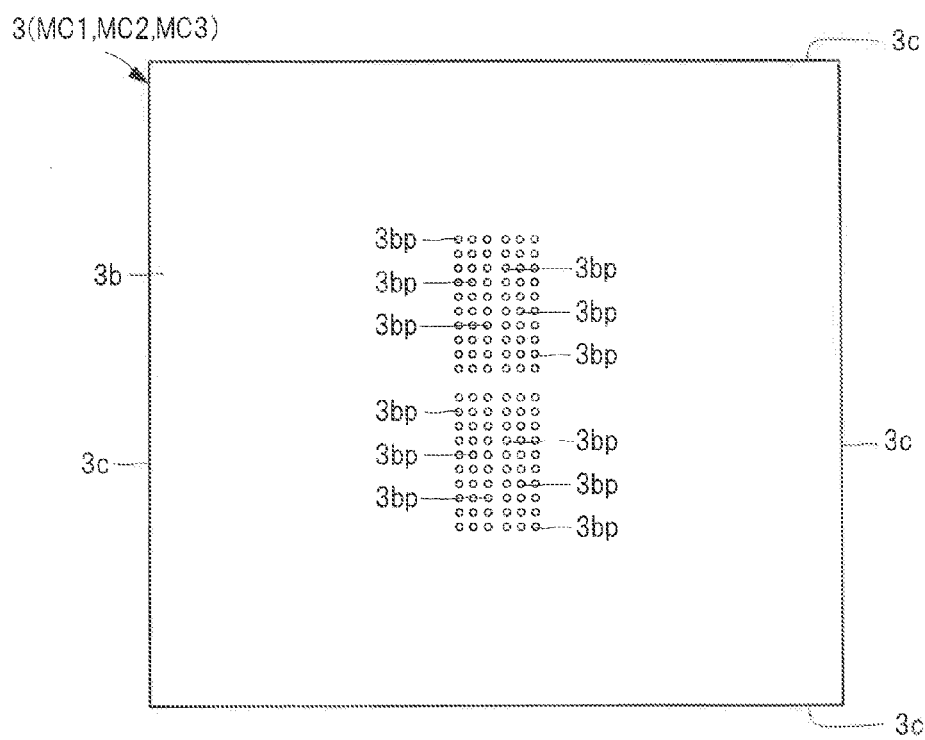
FIG. 9 is a planar view illustrating an example on a back surface side of the memory chip illustrated in FIG. 8.
Figure 10:
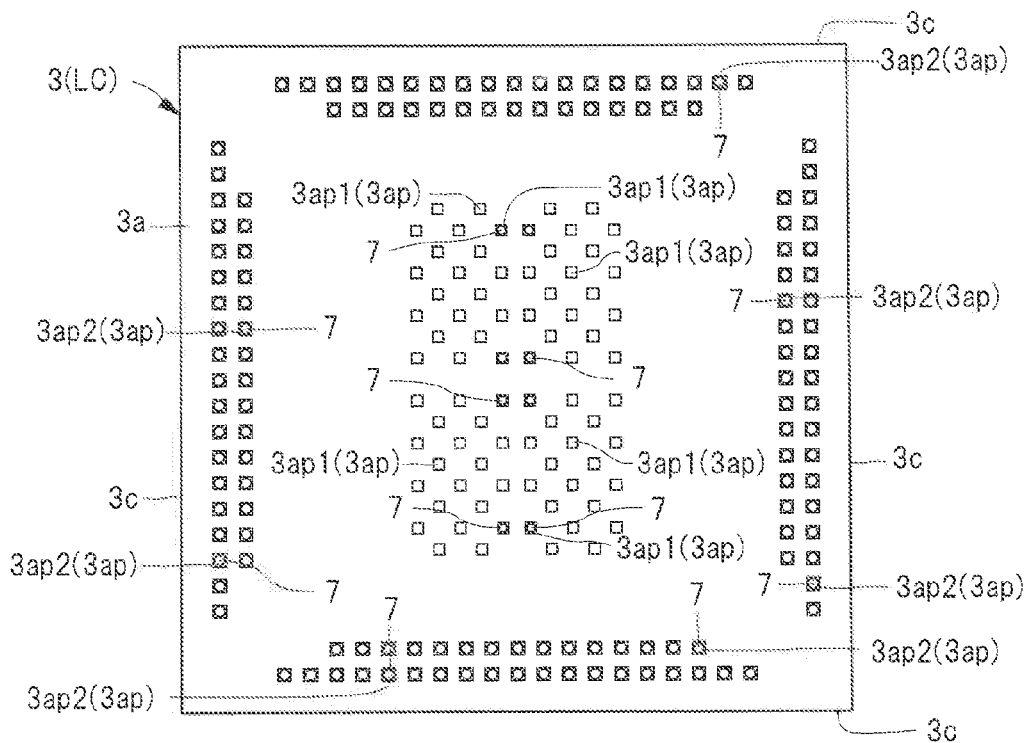
FIG. 10 is a planar view illustrating a layout example on the front surface side of a logic chip illustrated in FIG. 4.
Figure 11:
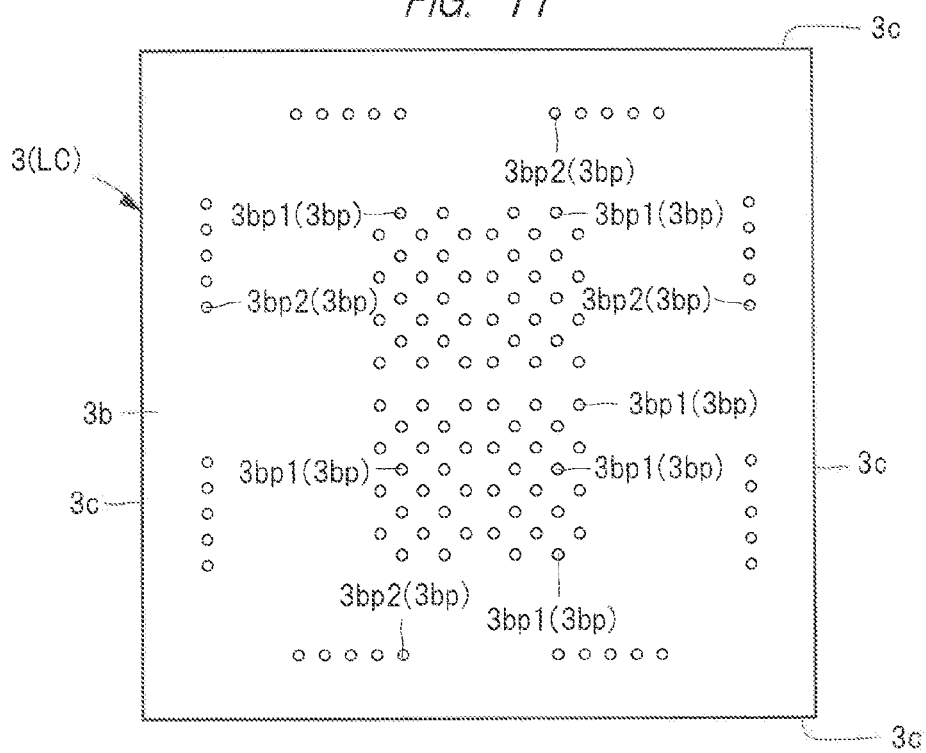
FIG. 11 is a planar view illustrating an example on the back surface side of the logic chip illustrated in FIG. 10.
Figure 12:
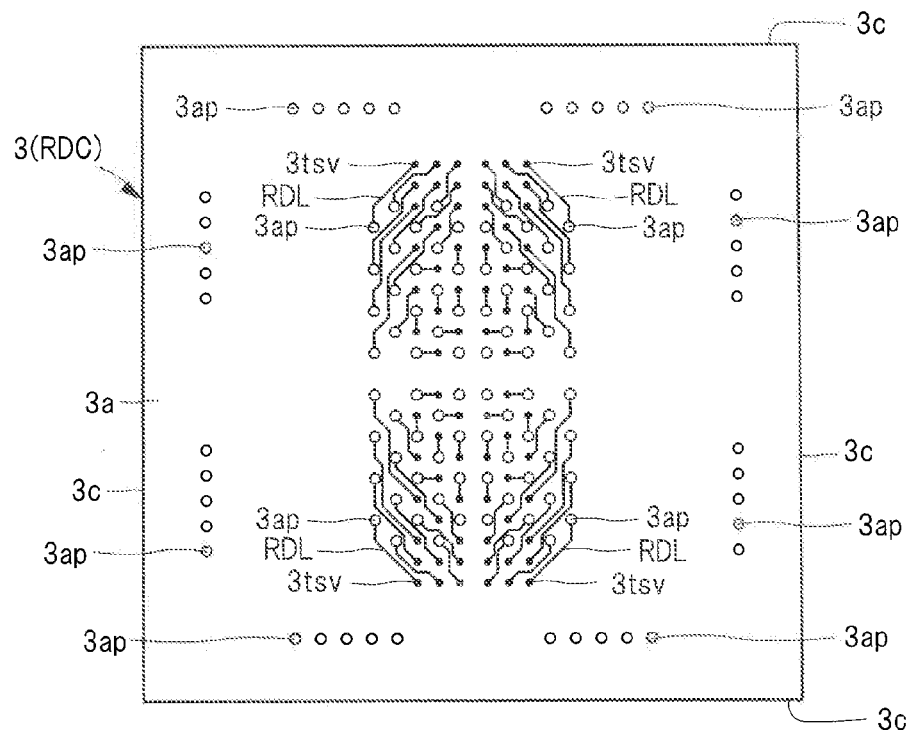
FIG. 12 is a planar view illustrating a layout example on the front surface side of a redistribution chip illustrated in FIG. 4.
Figure 13:
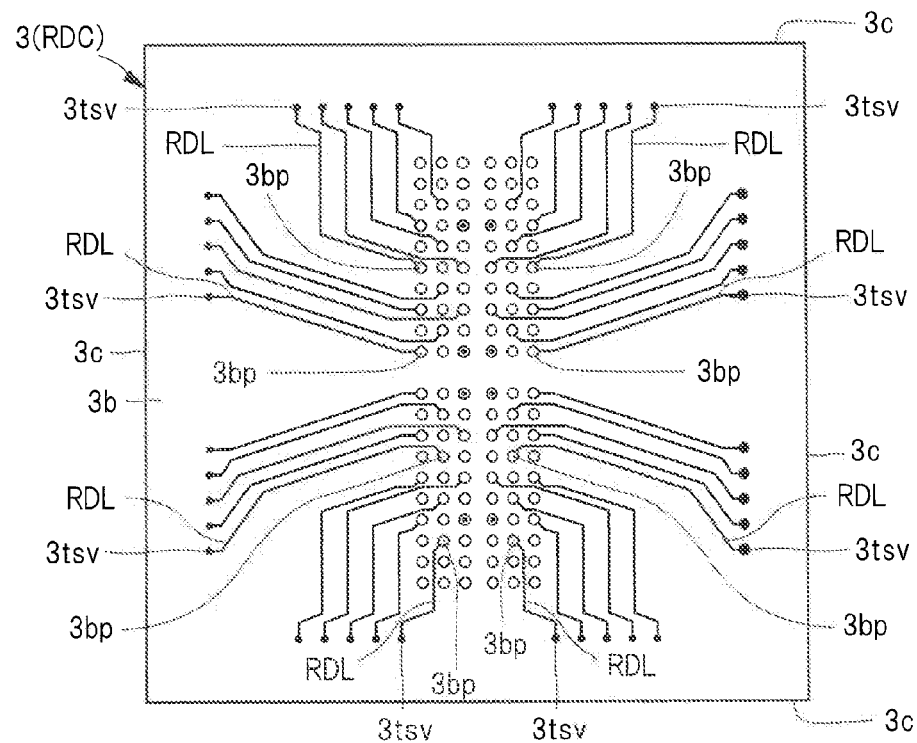
FIG. 13 is a planar view illustrating an example on the back surface side of the redistribution chip illustrated in FIG. 12.

Next, layouts of electrodes etc. in a planar view of each of the plurality of semiconductor chips 3 as illustrated in FIG. 6 will be described. FIG. 8 is a planar view illustrating a layout example on the surface side of the memory chip. FIG. 9 is a planar view illustrating an example on the back surface side of the memory chip illustrated in FIG. 8. FIG. 10 is a planar view illustrating a layout example on the surface side of the logic chip. FIG. 11 is a planar view illustrating an example on the back surface side of the logic chip illustrated in FIG. 10. FIG. 12 is a planar view illustrating a layout example on the surface side of the redistribution chip illustrated in FIG. 4. FIG. 13 is a planar view illustrating an example on the back surface side of the redistribution chip illustrated in FIG. 12.

Note that, although the number of electrodes is illustrated to be smaller for facilitating viewing in FIGS. 8 to 13, the number of electrodes (the front surface electrode 3ap, back surface electrode 3bp and through silicon vias 3tsv) is not limited to the aspect illustrated in FIGS. 8 to 10. In addition, although a back surface diagram of the memory chips MC1, MC2 and MC3 is illustrated in FIG. 9, since the structure of the back surface of the memory chip MC4 to which the back surface electrode 3bp is not formed (see FIG. 4) is illustrated in FIG. 3, illustration is omitted.

In addition, the layout of the electrodes and the lead wiring RDL illustrated in FIGS. 8 to 13 illustrates by an example an aspect of transferring the arrangement of the electrodes in the planar view by the redistribution chip RDC illustrated in FIGS. 12 and 13. It is needless to say that there are various modification examples for the layout of the electrodes and lead wirings RDL corresponding to the layouts of circuits formed to the logic chip LC and the memory chips MC1, MC2, MC3 and MC4.

As illustrated in FIG. 8, the plurality of front surface electrodes 3ap included in the memory chips MC1, MC2, MC3 and MC4 are disposed in a center portion of the surface 3a. Also, as illustrated in FIG. 9, the plurality of back surface electrodes 3bp included in the memory chips MC1, MC2 and MC3 are disposed in a center portion of the back surface 3b. As illustrated in FIG. 6, the plurality of front surface electrodes 3ap of the memory chips MC1, MC2, MC3 and MC4 and the plurality of back surface electrodes 3bp of the memory chips MC1, MC2 and MC3 are disposed at positions overlapping each other in the thickness direction.

Also, as illustrated in FIG. 8, on the surface 3a side (specifically, on the main surface of the semiconductor substrate) of the memory chips MC1, MC2, MC3 and MC4, a plurality of memory regions (memory circuit element array regions) MR are provided. In the example illustrated in FIG. 8, four memory regions MR corresponding to the four channels mentioned above are formed. To each of the memory regions MR, a plurality of memory cells (memory circuit element) are disposed in an array. The main memory circuit MM described with reference to FIG. 5 is formed to each of the plurality of memory regions MR illustrated in FIG. 8.

In the present embodiment, as illustrated in FIG. 4, the logic chip LC, the redistribution chip RDC, and the memory chips MC1, MC2, MC3 and MC4 are stacked such that their center portions of the surface 3a are overlapped each other. Therefore, as illustrated in FIG. 8, by disposing the plurality of front surface electrodes 3ap of the memory chips MC1, MC2, MC3 and MC4 in the center portion of the surface 3a, the distance of the transmission path for electrically connecting the semiconductor chips 3 having different planar sizes can be shortened.

In addition, the plurality of front surface electrodes 3ap of the memory chips MC1, MC2, MC3 and MC4 are collectively disposed in the center portion of the surface 3a. In other words, the plurality of front surface electrodes 3ap included in the memory chips MC1, MC2, MC3 and MC4 are disposed to be surrounded by the main circuit region (memory region MR) provided in a circumferential portion of the surface 3a. Particularly, in the example illustrated in FIG. 8, the front surface electrode 3ap does not exist between the memory region MR disposed in the circumferential portion of the surface 3a and the side surface 3c of the memory chips MC1, MC2, MC3 and MC4.

In this manner, when the plurality of front surface electrodes 3ap are disposed in the center portion of the surface 3a, the memory regions MR for 4 channels can be disposed so as to surround the region in which the surface electrode group is disposed. As a result, the distance from each of the memory regions MR to the front surface electrodes 3ap can be equal. In other words, the transmission distance of each of the plurality of channels can be equal, and thus it is preferable in the capability of reducing error in transmission rate of each channel.

In addition, as illustrated in FIG. 10, a part of the plurality of front surface electrodes 3ap included in the logic chip LC (a plurality of front surface electrodes 3ap1) is disposed in the center portion in the surface 3a. Also, a part of the plurality of front surface electrodes 3ap included in the logic chip LC (a plurality of front surface electrodes 3ap2) is disposed in the circumferential portion of the surface 3a along a side (side surface 3c) of the surface 3a. Further, as illustrated in FIG. 11, a part of the plurality of back surface electrodes 3bp included in the logic chip LC (a plurality of back surface electrodes 3bp1) is disposed in the center portion of the back surface 3b. Moreover, the other part of the plurality of back surface electrodes 3bp included in the logic chip LC (a plurality of back surface electrodes 3bp2) is disposed in the circumferential portion of the back surface 3b along a side (side surface 3c) of the back surface 3b.

Among the plurality of front surface electrodes 3ap illustrated in FIG. 10, the plurality of front surface electrodes 3ap1 disposed in the center portion of the surface 3a are electrically connected to the plurality of back surface electrodes 3bp1 disposed in the center portion of the back surface 3b illustrated in FIG. 11 and the back surface electrode 3bp via the plurality of through silicon vias 3tsv illustrated in FIG. 6. In addition, most of the plurality of front surface electrodes 3ap1 is not joined with the wiring board illustrated in FIG. 6. That is, the plurality of front surface electrodes 3ap1 are mainly for electrodes for an internal interface.

On the contrary, among the plurality of front surface electrodes 3ap illustrated in FIG. 10, most of the front surface electrode 3ap2 disposed in the circumferential portion of the surface 3a are electrically connected to an external device not illustrated via the wiring board 2 illustrated in FIG. 4. More specifically, as illustrated in FIG. 6, via the bump electrode 7b and the solder material 7a, the front surface electrode 3ap of the logic chip LC and the bonding lead 2f of the wiring board 2 are electrically connected. That is, the plurality of front surface electrodes 3ap2 are mainly for electrodes for an external interface.

However, among the plurality of front surface electrode 3aps illustrated in FIG. 10, the plurality of front surface electrodes 3ap2 disposed in the circumferential portion of the surface 3a include those not joined with the through silicon vias 3tsv and those joined with the through silicon vias 3tsv illustrated in FIG. 6 together. That is, in the example illustrated in FIG. 10, the plurality of front surface electrodes 3ap2 include electrodes for an internal interface and electrodes for an external interface together.

In the present embodiment, as illustrated in FIGS. 12 and 13, the through silicon vias 3tsv and the lead wirings RDL formed to the redistribution chip RDC are embedded in the transmission paths for electrically connecting the memory chip MC1 (see FIG. 4) and the logic chip LC (see FIG. 4) such that the arrangements of the electrodes in the planar view are transferred to different ones. Therefore, as illustrated in FIG. 8, even when the plurality of front surface electrodes 3ap of the memory chip MC1 are disposed in the center portion of the surface 3a, it is possible to electrically connect to the plurality of back surface electrode 3bp2 formed in the circumferential portion of the back surface 3b of the logic chip LC as illustrated in FIG. 11. According to such the present embodiment, the planar arrangements of electrodes can be freely adjusted by the redistribution chip RDC and thus the degree of freedom in design of the logic chip LC and the memory chip MC1 can be improved.

Also, in the examples illustrated in FIGS. 12 and 13, the lead wirings RDL are formed to each of the back surface 3b and the surface 3a in the redistribution chip RDC. The lead wirings RDL are integrally formed with the front surface electrode 3ap or the back surface electrode 3bp and electrically connect the front surface electrodes 3ap or the back surface electrodes 3bp and the through silicon vias 3tsv.

In addition, in the example illustrated in FIG. 13, the lead wirings RDL are connected to a part of the plurality of back surface electrodes 3bp collectively disposed at the center of the back surface 3b of the redistribution chip RDC and lead to the through silicon vias 3tsv formed in the circumferential portion of the back surface 3b via the lead wirings RDL. In this manner, in the redistribution chip RDC illustrated in FIG. 12, distance between the front surface electrodes 3ap next to each other can be larger than that between the back surface electrodes 3bp next to each other illustrated in FIG. 13 in the center portion of the surface 3a. In addition, in the surface 3a, the lead wirings RDL can be disposed using the large space between the front surface electrodes 3ap next to each other. That is, as the plurality of lead wirings RDL are formed to each of the surface 3a and the back surface 3b, even when an disposing pitch of the plurality of front surface electrodes 3ap of the memory chip MC1 illustrated in FIG. 8 is small, disposing space of the lead wirings RDL illustrated in FIGS. 12 and 13 can be ensured.

However, the layout illustrated in FIGS. 12 and 13 is presented as an example of an aspect of transferring arrangements of electrodes in the planar view to different ones by the redistribution chip RDC and thus there are various modification examples. For example, when the disposing space of the lead wirings RDL can be ensured, a modification example is conceivable that the lead wirings RDL are disposed to only one of the surface 3a and the back surface 3b.

Meanwhile, when using the front surface electrodes 3ap1 collected in the center portion of the surface 3a of the logic chip LC illustrated in FIG. 10 as electrodes for inner interface, even when the front surface electrodes 3ap1 are not electrically connected to the wiring board 2 illustrated in FIG. 6, the front surface electrodes 3ap1 can function. However, it is preferable in a point that, as illustrated in FIG. 10, when a part of the front surface electrodes 3ap1 is electrically connected to the bonding leads 2f of the wiring board 2 illustrated in FIG. 6, the part of the front surface electrodes 3ap1 can be used as electrodes for an external interface.

For example, when the power circuit DR for driving the main memory circuit MM illustrated in FIG. 5 is formed in the memory chips MC1, MC2, MC3 and MC4, it is conceivable to use a part of the plurality of front surface electrodes 3ap1 illustrated in FIG. 10 is used as terminals for supplying power potential (first reference potential) and a reference potential (second reference potential that is different from the first reference potential; e.g., ground potential). In other words, in the example illustrated in FIG. 10, the plurality of front surface electrodes 3ap1 disposed, in the center portion of the surface 3a of the logic chip LC include first-reference-potential electrodes to which the first reference potential (e.g., power supply potential) is supplied and a second-reference-potential electrodes to which the second reference potential (e.g., ground potential) is supplied. In still other words, in the example illustrated in FIG. 10, the plurality of front surface electrodes 3ap1 disposed in the center portion of the surface 3a include power wirings V2 and V3 (see FIG. 5) for supplying power to drive the circuit formed to the memory chip MC1.

To improve the signal transmission rate, in view of suppressing unstable operation due to instantaneous voltage drop or others, it is preferable to shorten the transmission distance between a power supply source and circuits which consume power. Accordingly, when a part of the front surface electrodes 3ap1 of the logic chip LC is electrically connected to the wiring board 2 and the first reference potential (e.g., power supply potential) and/or the second reference potential (e.g., ground potential) are/is supplied to the part of the front surface electrodes 3ap1 of the logic chip LC, it is preferable in shortening of the distance to the driving circuit of the memory chips MC1, MC2, MC3 and MC4 to each of which a circuit consuming power is formed. In addition, the first-reference-potential electrode to which the first reference potential (e.g., power supply potential) is supplied and the second-reference-potential electrode to which the second reference potential (e.g., ground potential) that is different from the first reference potential is supplied are disposed such that the front surface electrodes 3ap and the back surface electrodes 3bp are overlapped in the thickness direction as illustrated in FIG. 6 and that they are electrically connected via the through silicon vias 3tsv.

Further, in the example illustrated in FIG. 3, the planar size of the redistribution chip RDC is larger than that of the logic chip LC, and smaller than that of the memory chip MC4 (the stacked body MCS). In other words, each of the four side surfaces 3c of the redistribution chip RDC is disposed between the side surface 3c of the memory chip MC4 and the side surface 3c of the logic chip LC. In still other words, the planar size of the redistribution chip RDC allows each of the four side surfaces 3c of the redistribution chip RDC positioned between the side surface 3c of the redistribution chip RDC and the side surface 3c of the logic chip LC when the logic chip LC, the redistribution chip RDC and the memory chip MC1 are mounted (stacked) on the wiring board 2.

Figure 14:
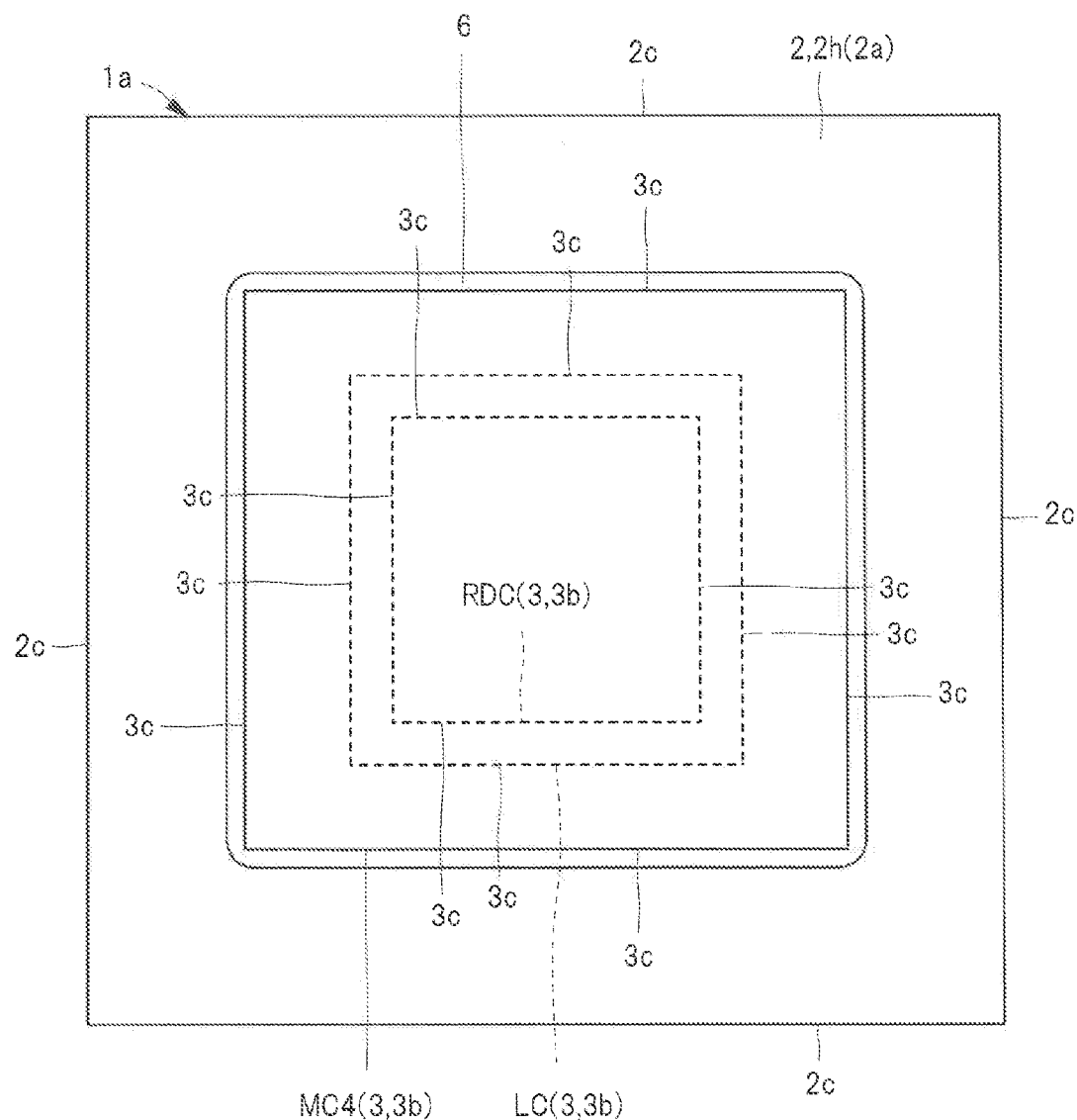
FIG. 14 is a perspective planar view illustrating an inner structure of a semiconductor device which is a modification example with respect to FIG. 3.
Figure 15:
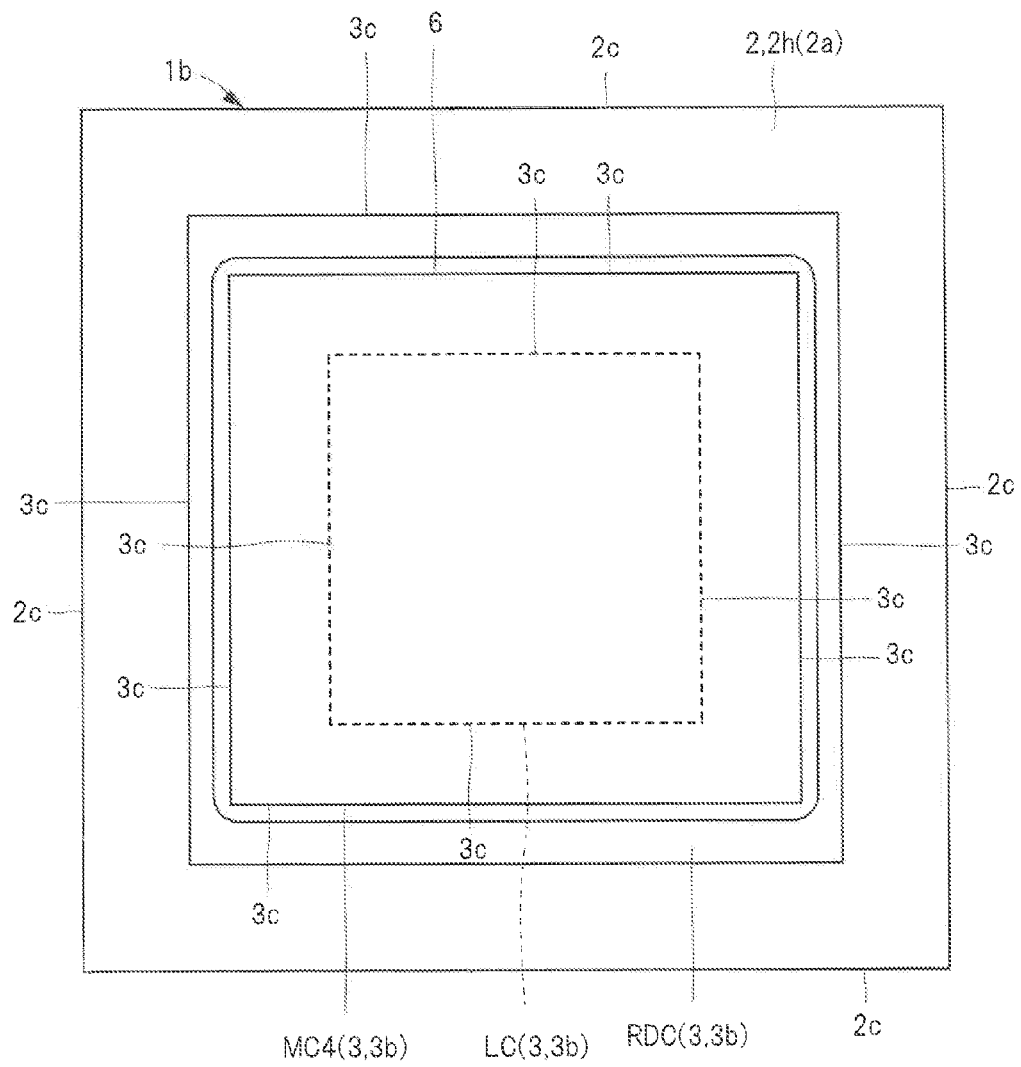
FIG. 15 is a perspective planar view illustrating an inner structure of a semiconductor device which is another modification example with respect to FIG. 3.

From the point of view of adjusting positions of the electrodes of the memory chip MC1 and the logic chip LC by transferring the positions of the electrodes in the planar view, a configuration of a modification example illustrated in FIGS. 14 and 15 can be used. FIGS. 14 and 15 are perspective plan views illustrating an internal structure of a semiconductor device which is a modification example with respect to FIG. 3. In a semiconductor device 1a which is a first modification example illustrated in FIG. 14, the planar size of the redistribution chip RDC is smaller than that of the logic chip LC; and each of the side surfaces 3c of the logic chip LC is disposed between the side surface 3c of the memory chip MC4 and the side surface 3c of the redistribution chip RDC. On the other hand, in a semiconductor device 1b which is a second modification example illustrated in FIG. 15, the planar size of the redistribution chip RDC is larger than that of the memory chip MC4; and each of the four side surfaces 3c of the memory chip MC4 is disposed between the side surface 3c of the logic chip LC and the sides surface 3c of the redistribution chip RDC.

Here, from the view point of improving the degree of freedom in design of the logic chip LC, the whole of the back surface 3b of the logic chip LC is preferably covered with the redistribution chip RDC. By covering the whole of the back surface 3b of the logic chip LC with the redistribution chip RDC, the back surface electrodes 3bp (see FIG. 11) can be disposed at optional positions in the back surface 3b of the logic chip LC. Therefore, the planar size of the redistribution chip RDC is preferably larger or equal to the planar size of the logic chip LC. Moreover, also from the view point of stability upon mounting the stacked body MCS, the planar size of the redistribution chip RDC is preferably larger than that of the logic chip LC.

On the other hand, from the view point of improving the degree of freedom in design of the memory chips MC1, MC2, MC3 and MC4 (see FIG. 8), the whole of the surface 3a of the memory chip MC1 (see FIG. 8) is preferably covered with the redistribution chip RDC. By covering the whole of the memory chip MC1 with the redistribution chip RDC, the front surface electrodes 3ap (see FIG. 8) can be disposed at any optional positions in the surface 3a of the memory chips MC1, MC2, MC3 and MC4 (see FIG. 8). Therefore, as illustrated in FIG. 15, the planar size of the redistribution chip RDC is preferably larger or equal to that of the memory chip MC4.

However, when the planar size of the redistribution chip RDC is larger than that of the memory chip MC4, the circumferential portion of the redistribution chip RDC protrudes and thus it is prone to be damaged. Also, when the front surface electrodes 3ap are formed, at end portions of the circumferential portions of the memory chips MC1, MC2, MC3 and MC4, joint portions of the memory chips MC1, MC2, MC3 and MC4 and the front surface electrodes 3ap and the redistribution chip RDC are easily damaged. Therefore, the side surface 3c of the memory chips MC, MC2; MC3 and MC4 (see FIG. 8) and the front surface electrodes 3ap are preferably disposed with a distance therebetween. Accordingly, even when the planar size of the redistribution chip RDC is smaller than that of the memory chip MC4, as long as the planar size of the redistribution chip RDC is about the same as that of the memory chip MC4, the degree of freedom in design of the memory chips MC1, MC2, MC3 and MC4 (see FIG. 8) can be improved.

Accordingly, as illustrated in FIG. 3, particularly, the planar size of the redistribution chip RDC is preferably larger than that of the logic chip LC and also smaller than that of the memory chip MC4 (stacked body MCS). In other words, particularly, each of the four side surfaces 3c of the redistribution chip RDC is preferably disposed between the side surface 3c of the memory chip MC4 and the side surface 3c of the logic chip LC. In still other words, the planar size of the redistribution chip RDC has such a size that each of the four side surfaces 3c of the redistribution chip RDC is positioned between the side surface 3c of the memory chip MC1 and the side surface 3c of the logic chip LC when the logic chip LC, the redistribution chip RDC, and the memory chip MC1 are mounted (stacked) on the wiring board 2.

<Manufacturing Method of Semiconductor Device>

Figure 16:
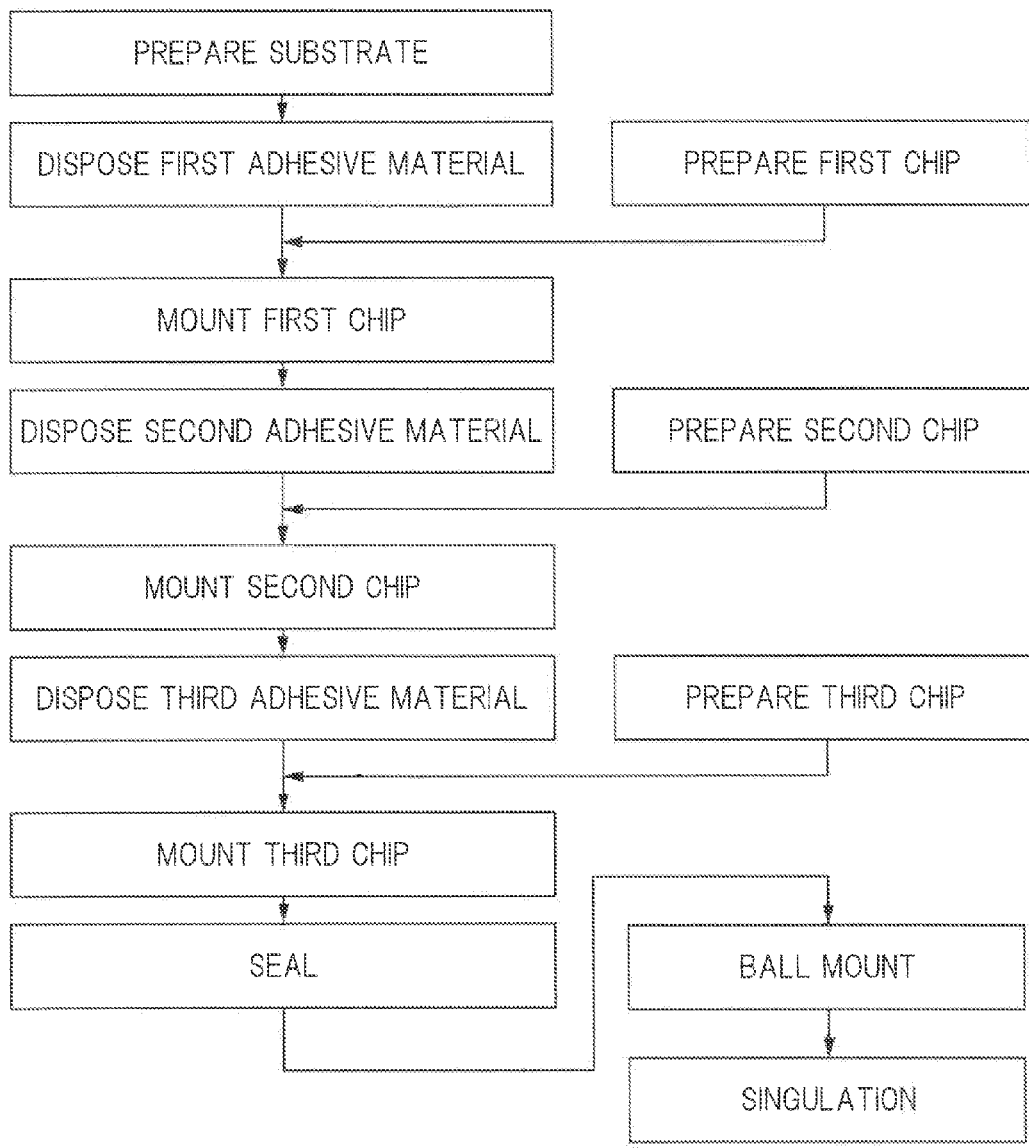
FIG. 16 is an exemplary diagram illustrating an outline of a manufacturing process of the semiconductor device described in FIGS. 1 to 13.

Next, a manufacturing process of the semiconductor device 1 will be described with reference to FIGS. 1 to 13. The semiconductor device 1 is manufactured along a flow illustrated in FIG. 16. FIG. 16 is an explanatory diagram illustrating a summary of the manufacturing process of the semiconductor device 1 which has been described with reference to FIGS. 1 to 13. Details of each step will be described hereinafter with reference to FIGS. 17 to 40.

<Step of Preparing Substrate>

Figure 17:
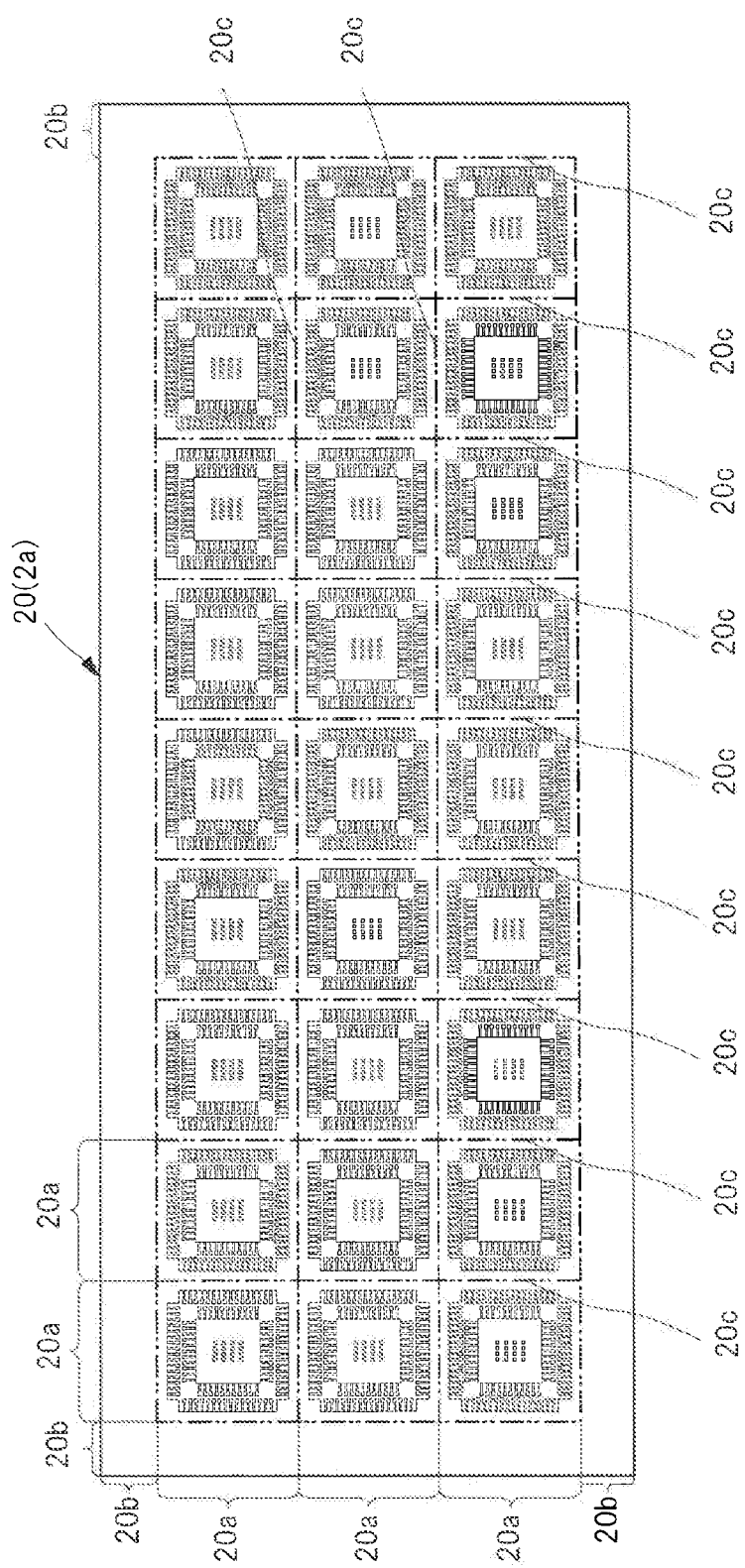
FIG. 17 is a planar view illustrating an overall structure of a wiring board prepared in a board-preparing step illustrated in FIG. 16.
Figure 18:
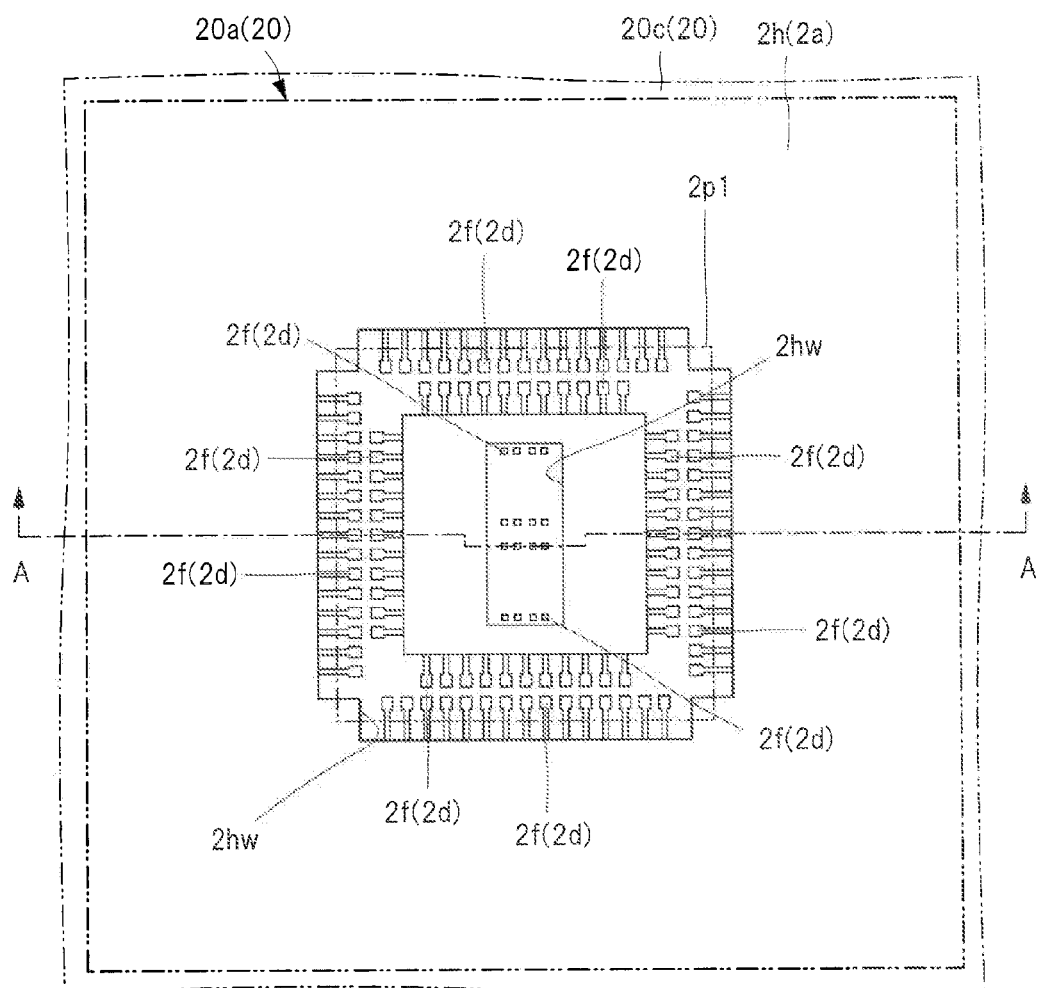
FIG. 18 is an enlarged planar view of one device region illustrated in FIG. 17.
Figure 19:
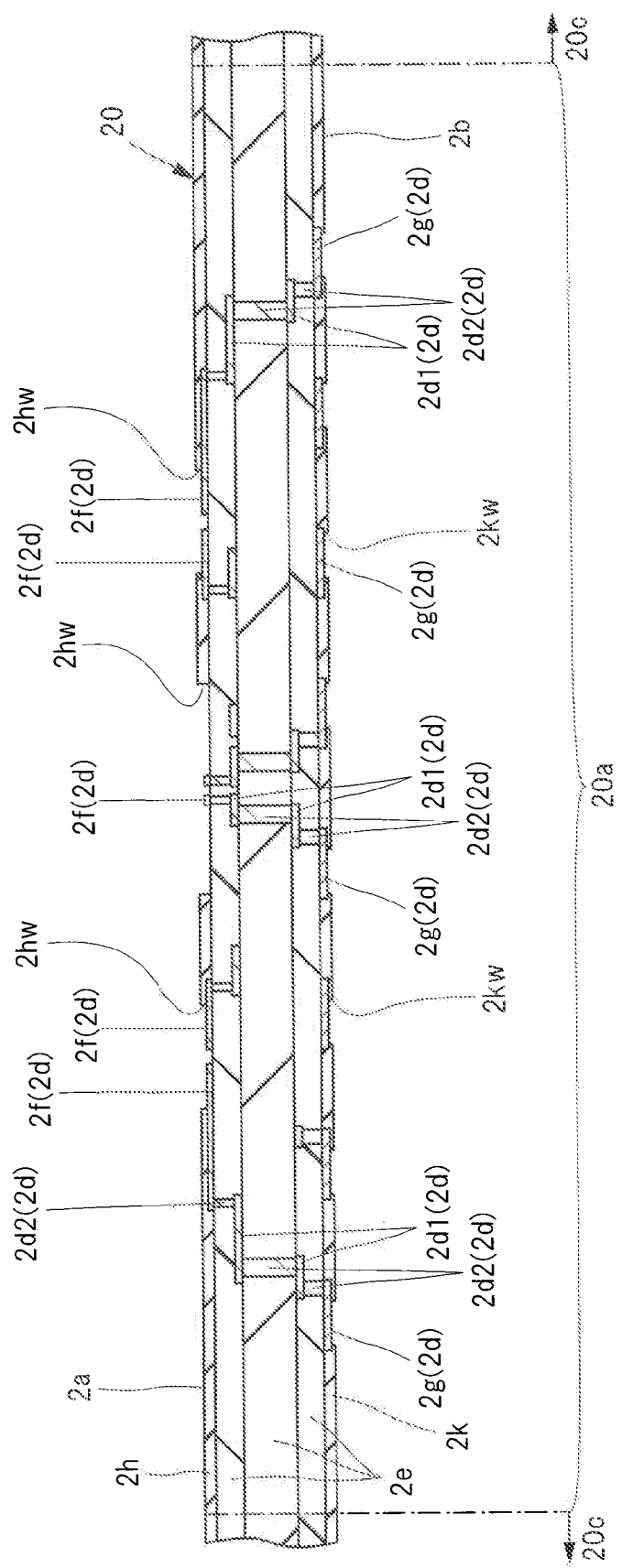
FIG. 19 is an enlarged cross-sectional view taken along the line A-A of FIG. 18.
Figure 20:
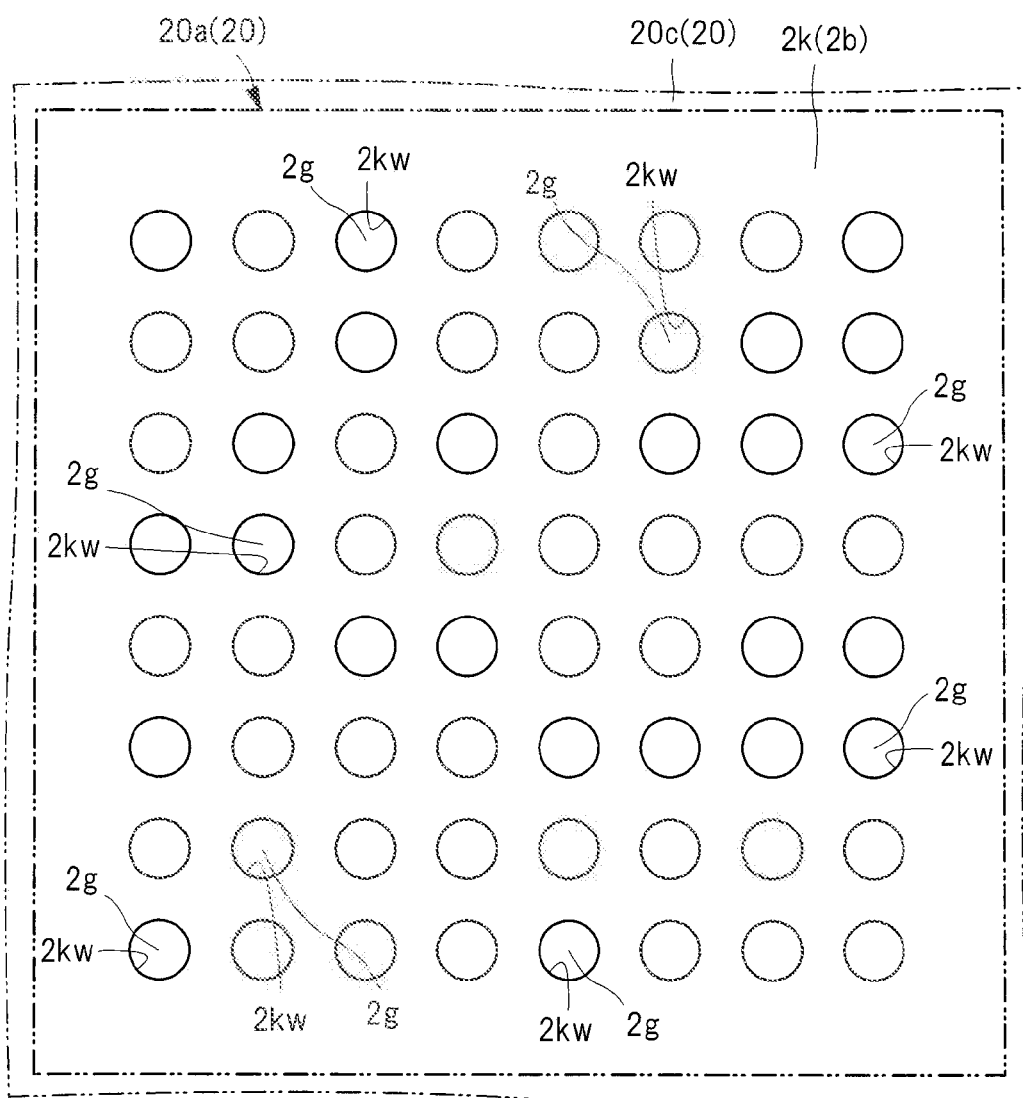
FIG. 20 is an enlarged planar view illustrating a surface opposite to FIG. 18.

First, in a step of preparing a substrate illustrated in FIG. 16, a wiring board 20 illustrated in FIGS. 17 to 20 is prepared. FIG. 17 is a plan view illustrating an entire structure of the wiring board prepared in the step of preparing a substrate illustrated in FIG. 16. FIG. 18 is an enlarged plan view of one device region of those illustrated in FIG. 17. FIG. 19 is an enlarged cross-sectional view taken along the line A-A in FIG. 18. FIG. 20 is an enlarged plan view illustrating a surface opposite to that of FIG. 18. Note that, in FIGS. 17 to 20, to facilitate viewing, the number of terminals is illustrated to be smaller than an actual number; however, the number of terminals (bonding leads 2f, lands 2g) is not limited to the aspect illustrated in FIGS. 17 to 20.

As illustrated in FIG. 17, the wiring board 20 prepared in this step has a plurality of device regions 20a inside a frame portion (outer frame) 20b. Specifically, the plurality of (27 in FIG. 17) device regions 20a are disposed in a matrix. Each of the plurality of device regions 20a corresponds to the wiring board 2 illustrated in FIGS. 1 to 4. The wiring board 20 is a so-called multiple-patterning wiring board having the plurality of device regions 20a and dicing lines (dicing regions) 20c in between the device regions 20a. In this manner, by using a multiple-patterning wiring board having the plurality of device regions 20a, manufacturing efficiency can be improved.

In addition, as illustrated in FIGS. 18 and 19, in each of the device regions 20a, the components of the wiring board 2 described with reference to FIG. 4 are formed. The wiring board has an upper surface 2a, a lower surface 2b opposite to the upper surface 2a, and a plurality of wiring layers (four layers in the example illustrated in FIG. 4) for electrically connecting the upper surface 2a to the lower surface 2b in each of the wiring layer, an insulating layer (core layer) 2e for insulation between the plurality of wirings 2d and the plurality of wirings 2d, and between the wiring layers next to each other is formed. In addition, the wiring 2d includes a wiring 2d1 formed at an upper surface or a lower surface of the insulating layer 2e, and a via wiring 2d2 that is an interlayer conduction path formed to penetrate the insulating layer 2e in the thickness direction.

Also, as illustrated in FIG. 18, the upper surface 2a of the wiring board 20 includes a chip-mounting region (chip-mounting portion) 2p1 which is a region expected to mount the logic chip LC illustrated in FIG. 10. The chip-mounting region 2p1 is present in a center portion of the device region 20a in the upper surface 2a. Note that, while a contour of the chip-mounting region is illustrated by a two-dot chain line in FIG. 18 to indicate a position of the chip-mounting region 2p1, the chip-mounting region 2p1 is a region expected to mount the logic chip LC as mentioned above and thus an actually visible boundary line is not needed to be present.

In addition, to the upper surface 2a of the wiring board 20, a plurality of bonding leads (terminals, chip-mounting-surface-side terminals, electrodes) 2f are formed. The bonding leads 2f are terminals electrically connected to the plurality of front surface electrodes 3ap formed to the surface 3a of the logic chip LC illustrated in FIG. 10 in the step of mounting a first chip illustrated in FIG. 16. In the present embodiment, the logic chip LC is mounted in a so-called face-down mounting method in which the surface 3a side of the logic chip LC faces the upper surface 2a of the wiring board 20; thus, joint portions of the plurality of bonding leads 2f are formed inside the chip-mounting region 2p1.

Further, the upper surface 2a of the wiring board 20 is covered with an insulating film (solder resist film) 2h. An opening portion 2hw is formed in the insulating film 2h and at least a part of the plurality of bonding leads (joint portion with a semiconductor chip, bonding region) is exposed in the opening portion 2hw from the insulating film 2h.

On the other hand, as illustrated in FIG. 20, a plurality of lands 2g are formed to the lower surface 2b of the wiring board 20. The lower surface 2b of the wiring board 20 is covered with an insulating film (solder resist film) 2k. An opening portion 2kw is formed in the insulating film 2k and at least a part of the plurality of lands 2g (joint portion with the solder ball 5) is exposed from the insulating film 2k in the opening portion 2kw.

Further, as illustrated in FIG. 19, the plurality of bonding leads 2f and the plurality of lands 2g are electrically connected to each other via the plurality of wirings 2d. The conductor patterns such as the plurality of wirings 2d, the plurality of bonding leads 2f and the plurality of lands 2g are formed of metal materials mainly containing copper (Cu). Further, the plurality of wirings 2d, the plurality of bonding leads 2f, and the plurality of lands 2g can be formed in, for example, electroplating method. Moreover, as illustrated in FIG. 19, the wiring board 20 having four or more wiring layers (four in FIG. 19) is formed in, for example, a build-up method.

<Step of Disposing First Adhesive Material>

Figure 21:
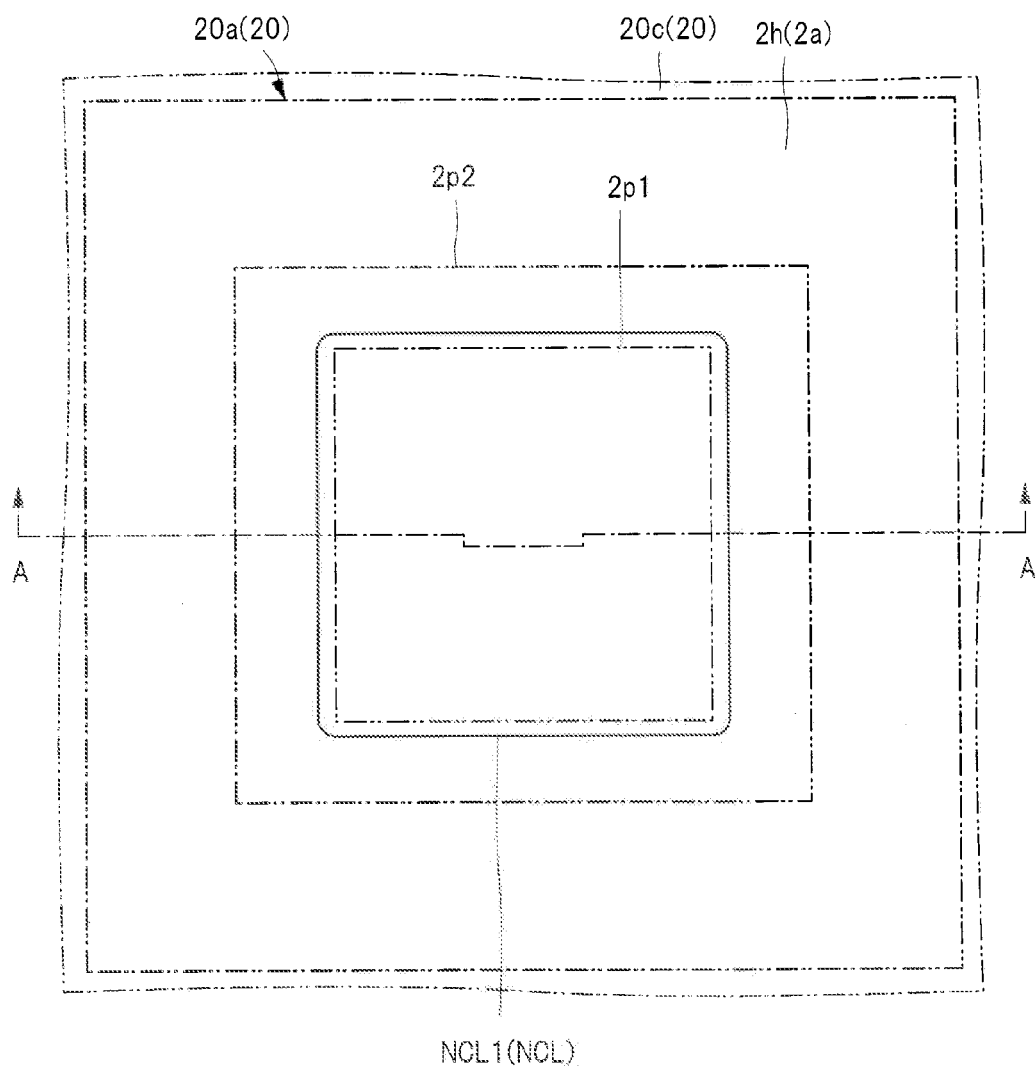
FIG. 21 is an enlarged planar view illustrating a state in which an adhesive material is disposed in a chip-mounting region illustrated in FIG. 13.
Figure 22:
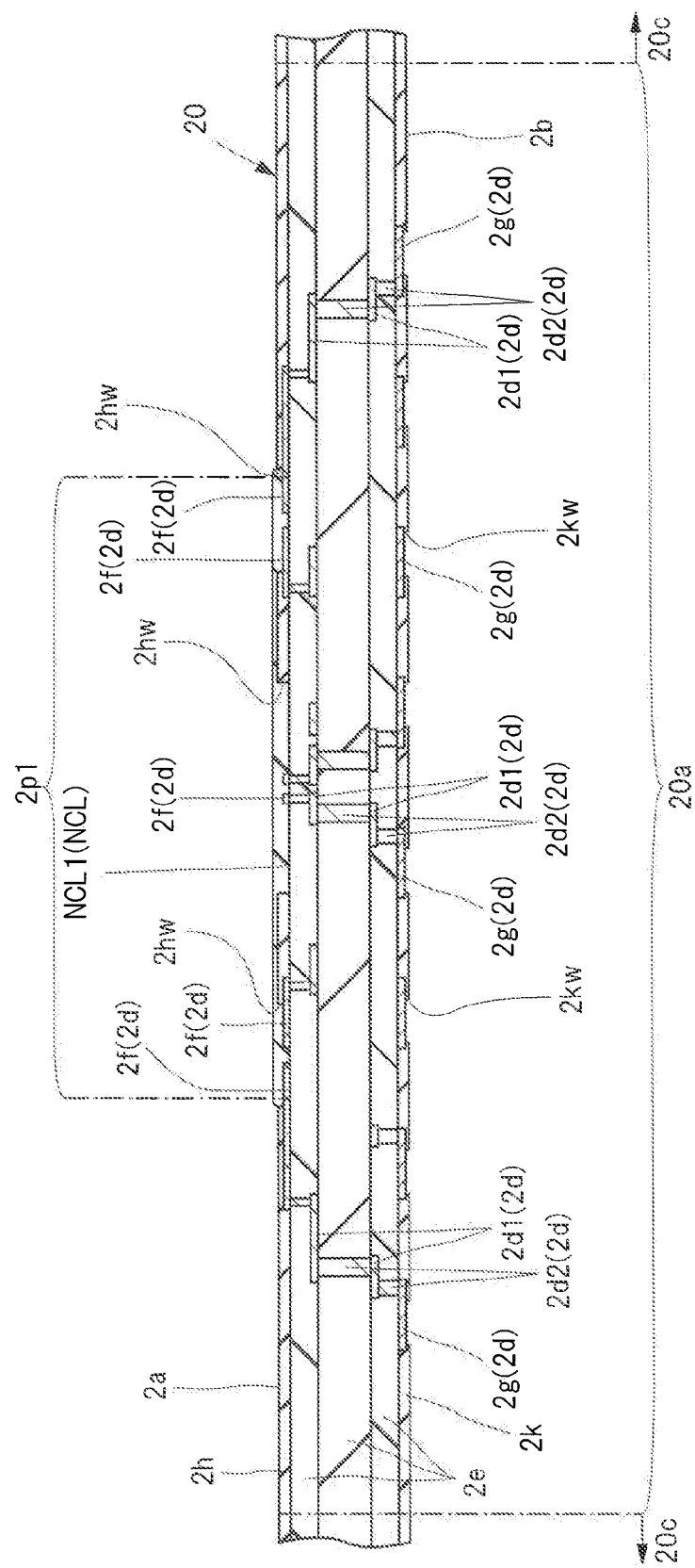
FIG. 22 is an enlarged cross-sectional view taken along the line A-A in FIG. 21.

Next, in a step of disposing a first adhesive material illustrated in FIG. 16, an adhesive material NCL1 is disposed on the chip-mounting region 2p1 of the upper surface 2a of the wiring board 20 as illustrated in FIGS. 21 and 22. FIG. 21 is an enlarged plan view illustrating a state in which the adhesive material is disposed in chip-mounting regions illustrated in FIG. 13, FIG. 22 is an enlarged cross-sectional view taken along the line A-A in FIG. 21. Note that, to indicate positions of the chip-mounting region 2p1 and the chip-mounting region 2p2, contours of the chip-mounting regions 2p1 and 2p2 are illustrated by two-dot chain lines; however, since the chip-mounting regions 2p1 and 2p2 are regions expected to mount the logic chip LC as mentioned above, actually visible lines are not needed to present. Note that, hereinafter, when illustrating the chip-mounting regions 2p1 and 2p2, actually visible boundary lines are not needed to be present in the same manner.

When mounting a semiconductor chip on a wiring board in a face-down mounting method (flip-chip connection method), for example, a method of sealing a connection portion by a resin after electrically connecting the semiconductor chip and the wiring board (post-injection method) is carried out. In this case, the resin is supplied from a nozzle disposed near a gap between the semiconductor chip and the wiring board and buried in the gap using the capillary action.

In the example described in the present embodiment, before mounting the logic chip LC (see FIG. 8) on the wiring board 20 in the step of mounting a first chip described later, the adhesive material NCL1 is disposed in the chip-mounting region 2p1 and the logic chip LC is pressed from above the adhesive material NCL1 for electrically connecting to the wiring board 20 (pre-application method) to mount the logic chip LC.

In the post-injection method described above, since the resin is buried in the gap using the capillary action, processing time (time for injecting the resin) to one device region 20a is long. On the other hand, in the pre-application method described above, upon a tip of the logic chip LC (for example, the solder material 7a formed at a tip of the bump electrode 7b illustrated in FIG. 6) and a joint portion of the bonding lead 2f contact, the adhesive material NCL1 is buried between the wiring board 20 and the logic chip LC. Therefore, as compared with the post-injection method described above, the pre-application method is preferable in such a point that processing time for one device region 20a is reduced and thus manufacturing efficiency can be improved.

However, as a modification example to the present embodiment, the post-injection method can be used by transposing the order of the step of mounting a first chip and the step of disposing an adhesive material illustrated in FIG. 16. For example, if regions for forming product for batch formation are small, differences in processing time is small and thus lowering of manufacturing efficiency can be suppressed even when using the post-injection method.

In addition, the adhesive material NCL1 used in the pre-application method is formed of an insulating (non-conductive) material (for example, resin material). By disposing the adhesive material NCL1 to the joint portion of the logic chip LC (see FIG. 6) and the wiring board 20, the plurality of conductive members (the joint material 7 and the bonding lead 2f illustrated in FIG. 6) provided to joint portions can be electrically insulated from each other.

Further, the adhesive material NCL1 is formed of a resin material having a hardness (degree of hardness) increased by being applied with energy; in the present embodiment, the adhesive material NCL1 contains, for example, a thermosetting resin. Still further, the adhesive material NCL1 before curing is softer than the joint material 7 illustrated in FIG. 6 and thus deformable by pressing the logic chip LC thereto.

Moreover, the adhesive material NCL1 before curing is largely classified into two patterns in view of its handling method etc. One of them is formed of a paste-like resin (insulating material paste) called NCP (Non-Conductive Paste) and applied in the chip-mounting region 2p1 from a nozzle not illustrated. The other is called NCF (Non-Conductive Film) formed of a resin (insulating material film) previously shaped in a film-like form and transferred to the chip-mounting region 2p1 in the same film state to attach. When the insulating material paste (NCP) is used, a step of attaching like the insulating material film (NCF) is not needed and thus stress applied to the semiconductor chip etc. is smaller than using the insulating material film. On the contrary, when the insulating material film (NCF) is used, since it has higher shape-keeping property than the insulating material paste (NCP), the range and thickness for disposing the adhesive material NCL1 can be easily controlled.

In the example illustrated in FIGS. 21 and 22, the adhesive material NCL1 which is an insulating material film (NCF) is disposed on the chip-mounting region 2p1 and attached so as to be adhered to the upper surface 2a of the wiring board 20. However, although not illustrated, an insulating material paste (NCP) may be also used as a modification example.

<Step of Preparing First Chip>

Figure 23:
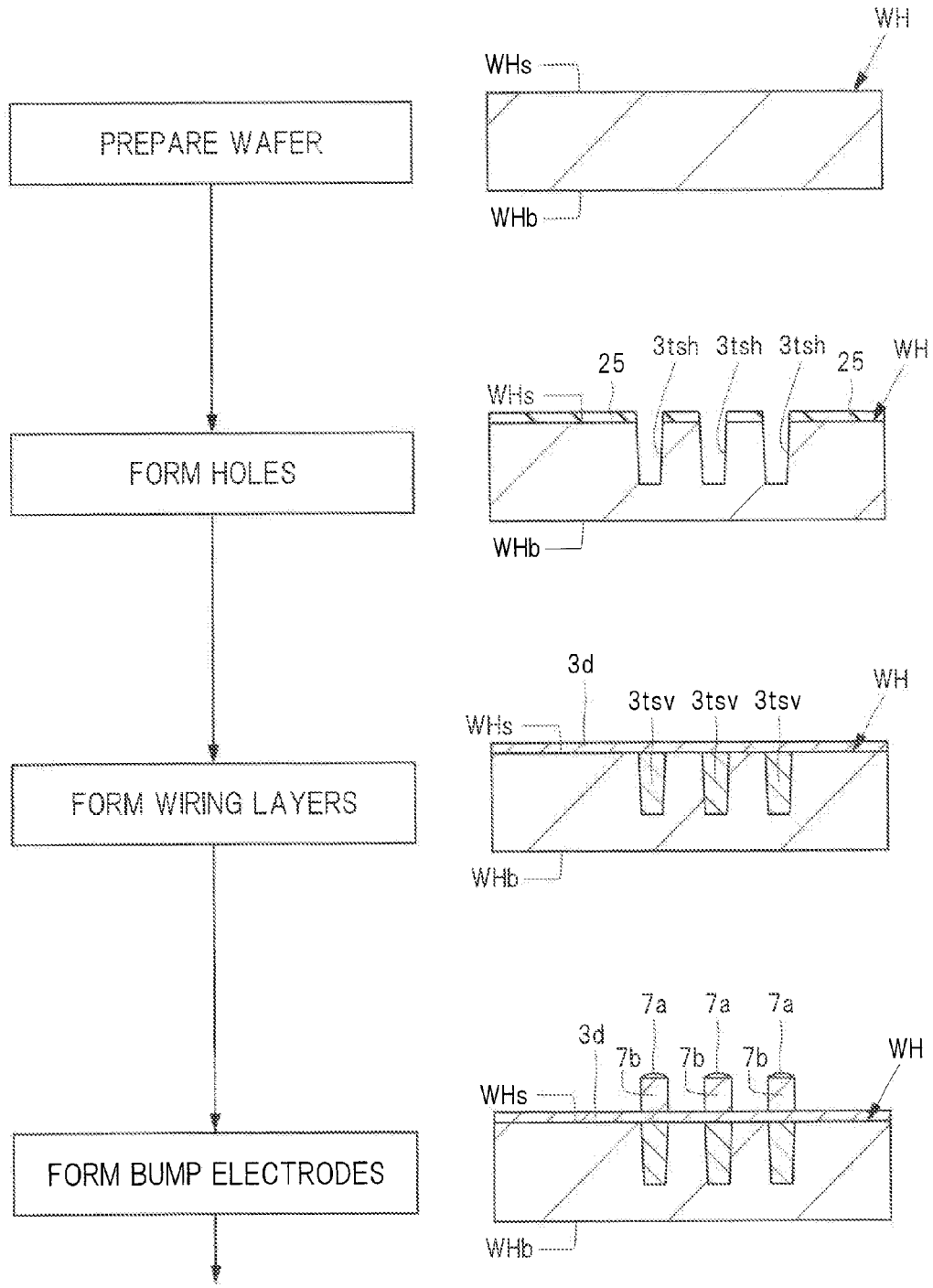
FIG. 23 is an explanatory diagram schematically illustrating a manufacturing process of a semiconductor chip including through silicon vias illustrated in FIG. 6.
Figure 24:
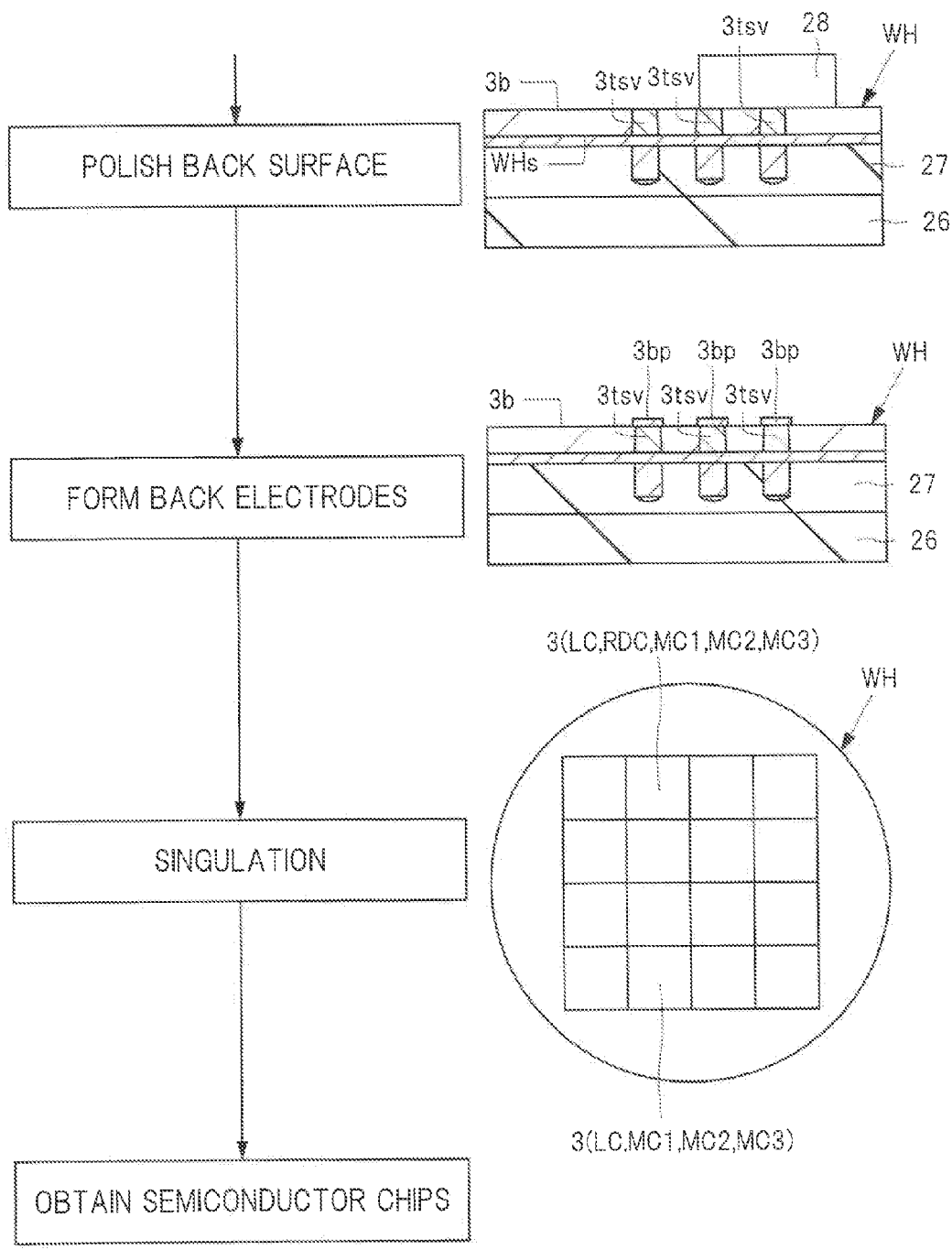
FIG. 24 is an explanatory diagram schematically illustrating an outline of a manufacturing process of the semiconductor chip continued from FIG. 23.

Then, in the step of preparing a first chip illustrated in FIG. 16, the logic chip LC illustrated in FIGS. 10 and 11 is prepared. FIG. 23 is an explanatory diagram schematically illustrating a summary of a manufacturing process of the semiconductor chip having the through silicon vias illustrated in FIG. 6. FIG. 24 is an explanatory diagram schematically illustrating a summary of the manufacturing process of the semiconductor chip continued from FIG. 23. Note that, in FIGS. 23 and 24, a manufacturing method of the through silicon via 3tsv and the back surface electrode 3bp electrically connected to the through silicon via 3tsv is mainly described and illustration and description of forming steps of various circuits other than the through silicon vias 3tsv will be omitted. In addition, the manufacturing method of the semiconductor chip illustrated in FIGS. 23 and 24 can be used for a manufacturing method of the redistribution chip RDC and the memory chips MC1, MC2 and MC3 as well as the logic chip LC illustrated in FIG. 4.

First, as a wafer-preparing step, a wafer (semiconductor substrate) WH illustrated in FIG. 23 is prepared. The wafer WH is a semiconductor substrate formed of, for example, silicon (Si) and has a circular form in a planar view. The wafer WH has a surface (main surface, upper surface) WHs that is a semiconductor-element forming surface, and a back surface (main surface, lower surface) WHb opposite to the surface WHs. Also, a thickness of the wafer WH is, for example, about several hundreds of μm that is larger than those of the logic chip LC, the redistribution chip RDC, and the memory chips MC1, MC2 and MC3 illustrated in FIG. 4.

Next, as a hole-forming step, holes (bore, opening portions) 3tsh for forming the through silicon vias 3tsv illustrated in FIG. 6 are formed. In the example illustrated in FIG. 23, the mask 25 is disposed on the surface WHs of the wafer WH and an etching process is performed to form the holes 3tsh. Note that, the semiconductor elements such as the logic chip LC and the memory chips MC1, MC2 and MC3 may be formed after this step and also before a following step of forming wiring layer, for example.

Next, the through silicon vias 3tsv are formed by burying a metal material such as copper (Cu) inside the holes 3tsh. Next, as a step of forming a wiring layer, a wiring layer (chip wiring layer) 3d is formed on the surface WHs of the wafer WH. In this step, the plurality of front surface electrodes 3ap illustrated in FIG. 6 are formed and the plurality of through silicon vias 3tsv are electrically connected to the plurality of front surface electrodes 3ap each other. Note that, in the case of the redistribution chip RDC, the lead wirings RDL (see FIG. 12) for connecting the front surface electrodes 3ap and the through silicon vias 3tsv are formed. The lead wirings RDL can be formed at one time upon forming the front surface electrodes 3ap. In addition, in this step, the semiconductor elements of the logic chip LC and the memory chips MC1, MC2 and MC3 illustrated in FIG. 4 and the plurality of front surface electrodes 3ap illustrated in FIG. 6 are electrically connected via the wiring layer 3d. In the case of the redistribution chip RDC, when the semiconductor elements are not formed, the step of forming the wiring layer 3d is omitted and substituted by a step of forming the lead wirings RDL. In this manner, the logic chip LC and the memory chips MC1, MC2 and MC3 are electrically connected via the wiring layer 3d.

Next, as a step of forming bump electrodes, the bump electrodes 7b are formed on the front surface electrodes 3ap (FIG. 6). Also, the solder material 7a is formed at a tip of each of the bump electrodes 7b. This solder material 7a functions as a joint material upon mounting the semiconductor chip 3 onto the wiring board 2 or another semiconductor chip 3 therebelow illustrated in FIG. 6. Note that, in the example illustrated in FIG. 6 exemplifies, in other portions than the joint portion of the logic chip LC and the wiring board 2, the semiconductor chip 3 is joined via the solder material 7a without interposing the bump electrode 7b. In this case, the solder material 7a is joined with an exposed surface of the front surface electrode 3ap such that the solder material 7a can be used as a bump electrode (so-called micro bump).

Next, as a step of back-surface polishing illustrated in FIG. 24, the back surface WHb (see FIG. 23) side of the wafer WH is polishes to thin the wafer WH. In this manner, the back surface 3b of the semiconductor chip 3 illustrated in FIG. 6 is exposed. In other words, the through silicon vias 3tsv penetrate the wafer WH in the thickness direction. In addition, the plurality of through silicon vias 3tsv are exposed from the wafer WH at the back surface 3b of the wafer WH. In the example illustrated in FIG. 24, the step of back-surface polishing uses a polishing jig 28 for polishing in a state in which the wafer WH is supported by a supportive base material 26 such as a glass plate and a protective layer 27 for protecting the surface WHs side.

Next, in a step of forming back surface electrodes, plurality of back surface electrodes 3bp are formed to the back surface 3b and electrically connected to the plurality of through silicon vias 3tsv. Note that, in the case of the redistribution chip RDC illustrated in FIG. 4, in this step, the lead wirings RDL (see FIG. 13) for electrically connecting the through silicon vias 3tsv and the back surface electrodes 3bp are formed. The lead wirings RDL can be formed in a lump upon forming the back surface electrodes 3bp.

Next, as a step of singulation, the wafer WH is divided along dicing lines to obtain the plurality of semiconductor chips 3. Then, inspections are performed if necessary. In this manner, the semiconductor chip 3 (logic chip LC, the redistribution chip RDC, and the memory chips MC1, MC2 and MC3) is obtained.

<Step of Mounting First Chip>

Figure 25:
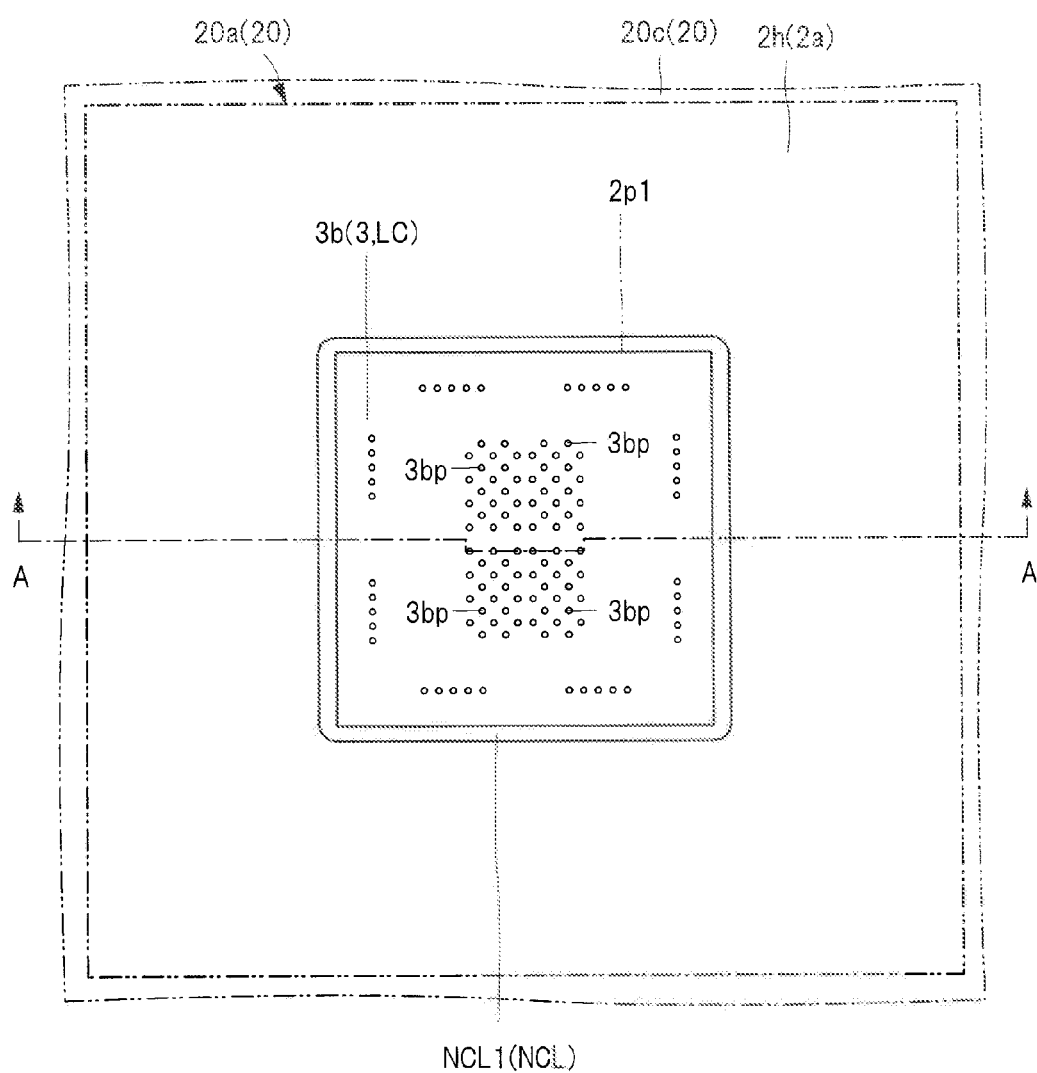
FIG. 25 is an enlarged planar view illustrating a state in which the logic chip is mounted in the chip-mounting region of the wiring board illustrated in FIG. 16.
Figure 26:
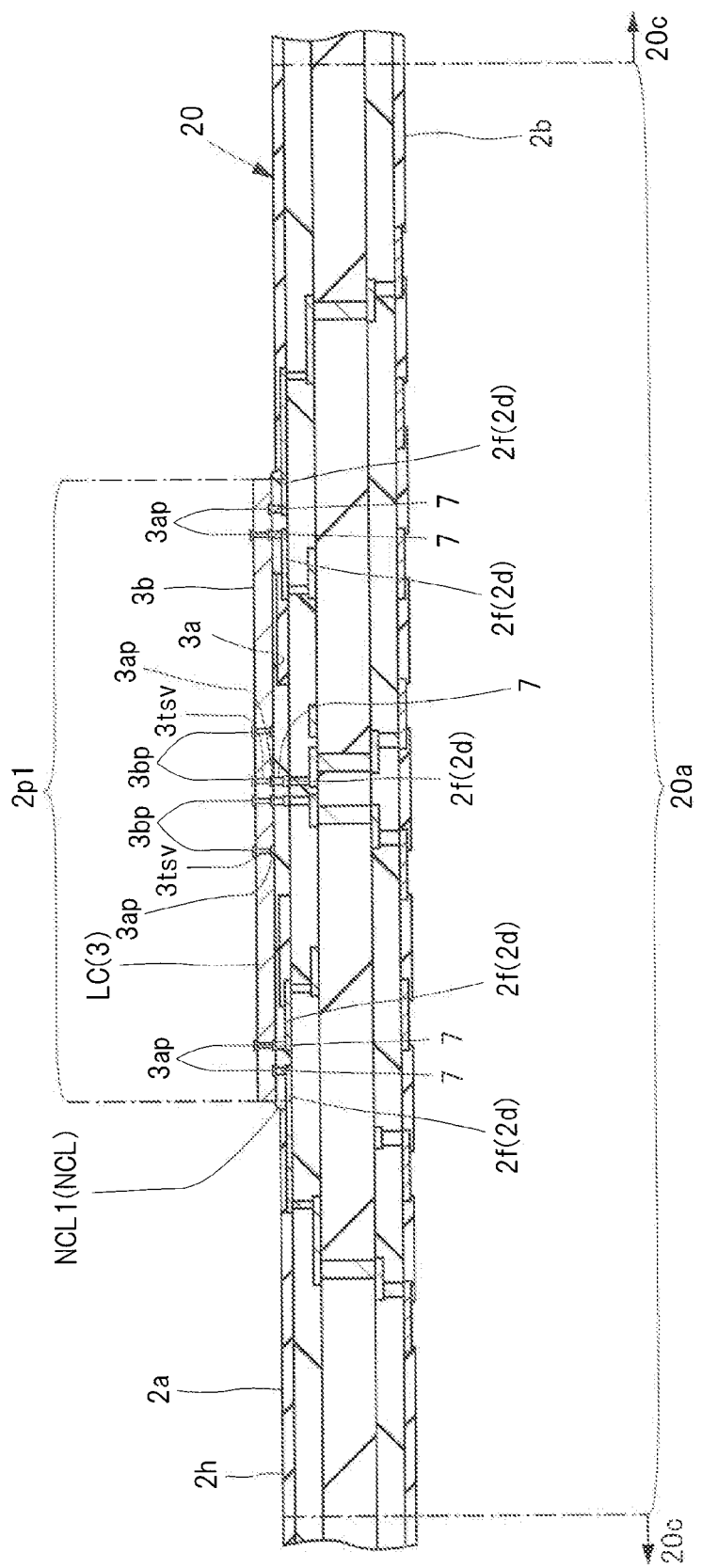
FIG. 26 is an enlarged cross-sectional view taken along the line A-A in FIG. 25.

Next, in the step of mounting a first chip illustrated in FIG. 16, the logic chip LC is mounted on the wiring board 2 as illustrated in FIGS. 25 and 26. FIG. 25 is an enlarged plan view illustrating a state in which the logic chip LC is mounted in the chip-mounting region of the wiring board 2 illustrated in FIG. 16. FIG. 26 is an enlarged cross-sectional view taken along the line A-A in FIG. 25.

In this step, as illustrated in FIG. 26, the logic chip LC is mounted in a so-called face-down mounting method (flip-chip connection method) such that the surface 3a of the logic chip LC faces the upper surface 2a of the wiring board 2. In addition, in this step, the logic chip LC and the wiring board are electrically connected to each other. More specifically, the plurality of front surface electrodes 3ap formed to the surface 3a and the plurality of bonding leads 2f formed to the upper surface 2a of the wiring board 2 are electrically connected to each other via the bump electrode 7b (see FIG. 6) and the solder material 7a (see FIG. 6).

In this step, as illustrated in FIG. 26, the logic chip LC (semiconductor chip 3) is disposed on the chip-mounting region 2p1 of the wiring board 20. The joint material 7 is formed on the surface 3a side of the logic chip LC. To the joint portion of the bonding lead 2f formed to the upper surface 2a of the wiring board 20, a solder layer (illustration omitted) which is a joint material for electrically connecting to the bump electrode 7b illustrated in FIG. 6 is formed. Prior to performing a heading process, the adhesive material NCL1 is soft before curing. Therefore, when the logic chip LC is disposed on the adhesive material NCL1, the joint material 7 is buried inside the adhesive material NCL1.

Next, a heating jig, not illustrated, is pressed onto the back surface 3b side of the logic chip LC to press the logic chip LC toward the wiring board 20. As mentioned, above, prior to the heating process, the adhesive material NCL1 is soft before curing and thus when the logic chip LC is pushed into the logic chip LC by the heating jig, the tips of the plurality of joint materials 7 formed to the surface 3a of the logic chip LC come into contact with the bonding region (specifically, the solder layer not illustrated) of the bonding lead 2f.

Next, in such a state that the logic chip LC is pressed onto the heating jig not illustrated, the logic chip LC and the adhesive material NCL1 are heated by the heating jig. At the joint portion of the logic chip LC and the wiring board 20, the solder layer not illustrated on each of the solder material 7a (see FIG. 23) and the bonding lead 2f is melted and becomes unified. In this manner, as illustrated in FIG. 6, the bump electrode 7b and the bonding lead 2f are electrically connected via the solder material 7a.

Also, the adhesive material NCL1 is cured by heating it. In this manner, the adhesive material. NCL1 being cured is obtained in such a state that a part of the logic chip LC is buried therein. In addition, the back surface electrode 3bp of the logic chip LC is exposed from the cured adhesive material NCL1.

<Step of Disposing Second Adhesive Material>

Figure 27:
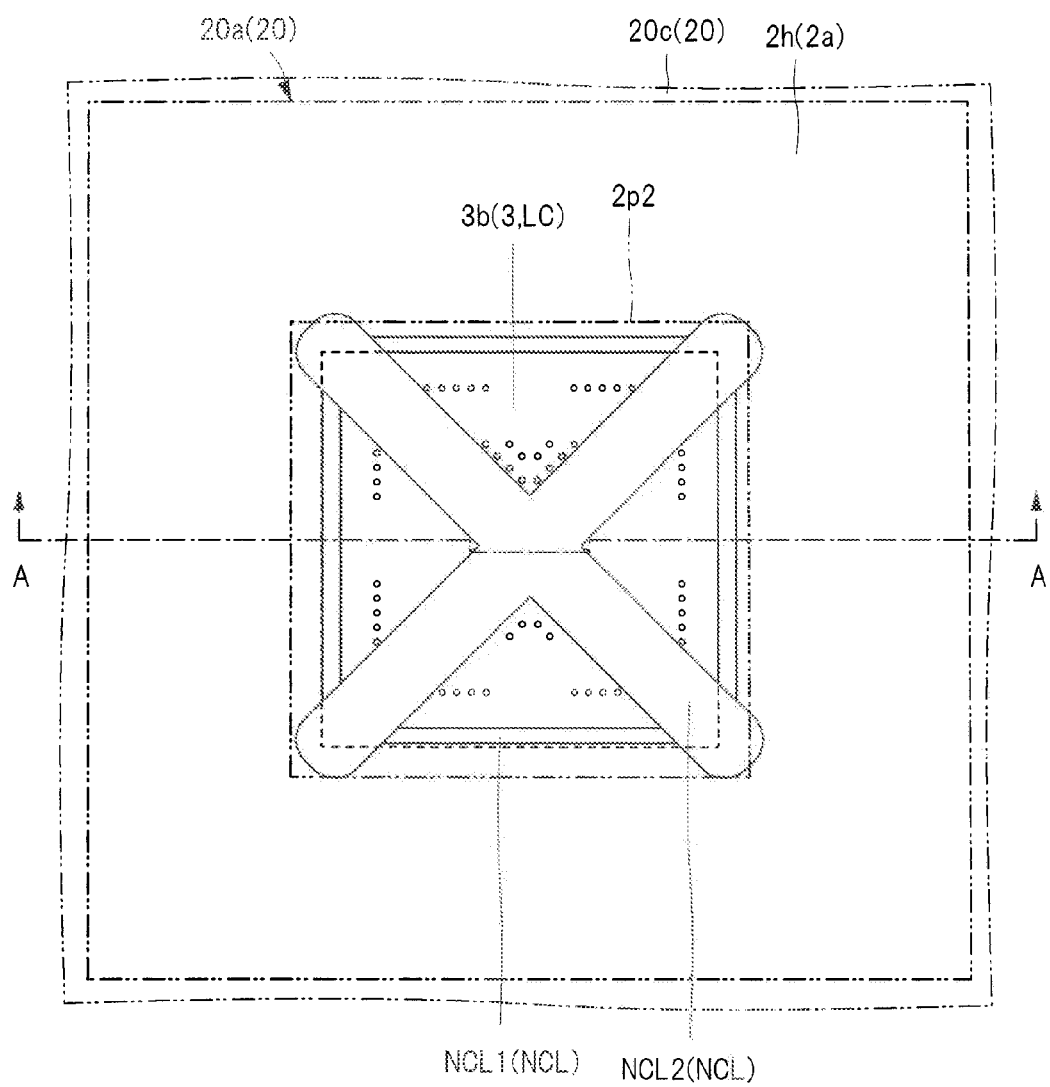
FIG. 27 is an enlarged planar view illustrating a state in which an adhesive material is disposed on a back surface and surrounding of the semiconductor chip illustrated in FIG. 25.
Figure 28:
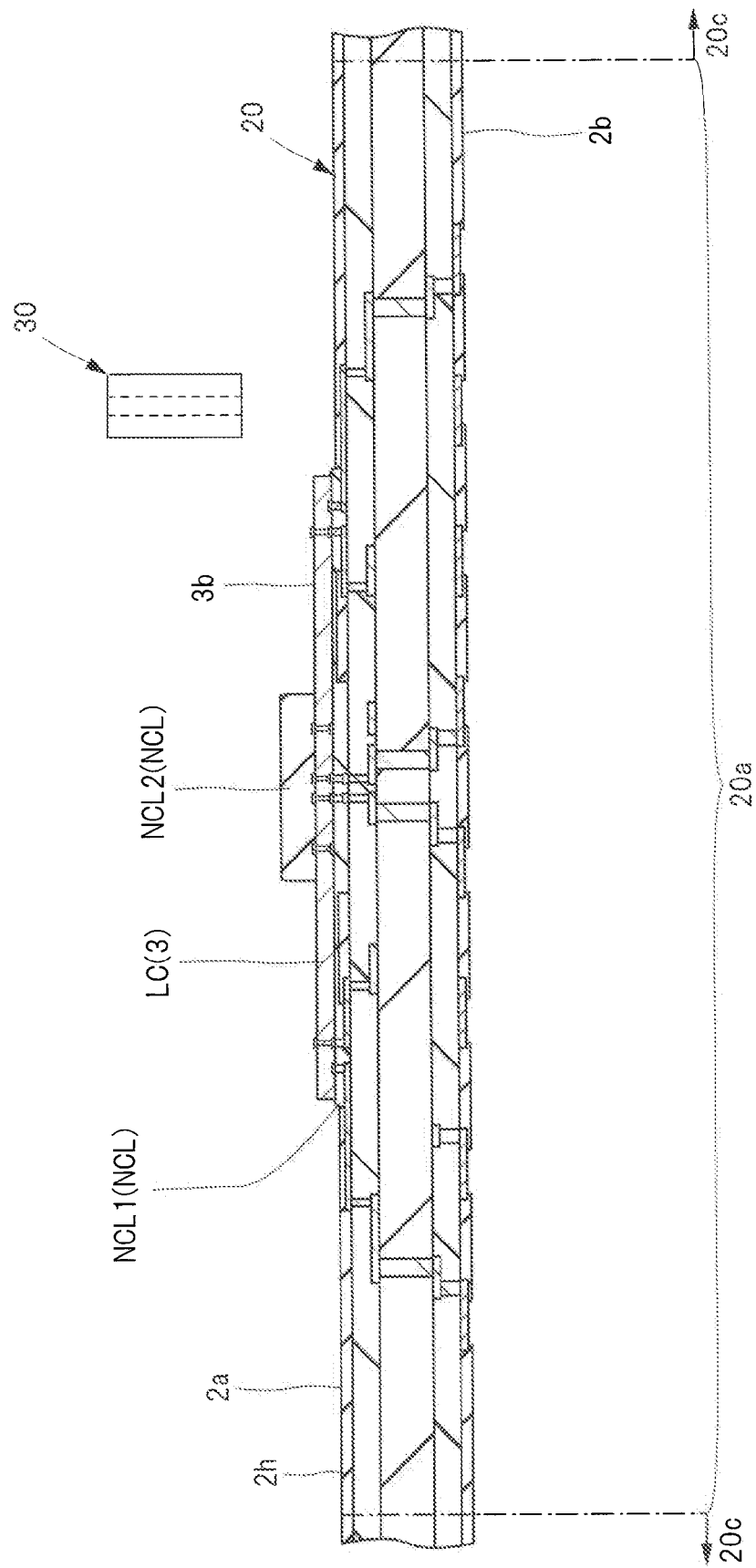
FIG. 28 is an enlarged cross-sectional view taken along the line A-A in FIG. 27.

Next, in a step of disposing a second adhesive material illustrated in FIG. 16, as illustrated in FIG. 27, a second adhesive material NCL2 is disposed on the back surface 3b of the logic chip LC (semiconductor chip 3) and the adhesive material adhesive material NCL1 being exposed from the logic chip LC. FIG. 27 is an enlarged plan view illustrating such a state that the adhesive material is disposed to the back surface and a surrounding of the back surface of the semiconductor chip illustrated in FIG. 25. FIG. 28 is an enlarged cross-sectional view taken along the line A-A in FIG. 27.

As illustrated in FIG. 6 described above, in the semiconductor device 1 of the present embodiment, among the stacked plurality of semiconductor chips 3, each of the logic chip LC mounted at the bottom state (for example, the first stage), the redistribution chip RDC mounted at the second state from the bottom, and the memory chip MC1 mounted at the third stage from the bottom are mounted in the flip-chip connection method. Therefore, although the post-injection method can be used as a modification example as described in the foregoing about the step of disposing the first adhesive material, it is preferable to use the pre-application method described above regarding the points of the capability of reduction of the processing time for one device region 20a (see FIGS. 27 and 28) and improvement in manufacturing efficiency.

In addition, the adhesive material NCL2 used in the pre-application method is formed of an insulating (non-conductive) material (e.g., resin material) as mentioned above. By disposing the adhesive material NCL2 to the joint portion of the logic chip LC (see FIG. 6) and the redistribution chip RDC (see FIG. 6), it is possible to obtain electrical insulation between the plurality of conductive members (e.g., the joint material 7 and back surface electrode 3bp illustrated in FIG. 6).

The adhesive material NCL2 is formed of a resin material having a hardness (degree of hardness) increased by being applied with energy; in the present embodiment, the adhesive material NCL2 contains, for example, a thermosetting resin. Still further, the adhesive material NLC2 before curing is softer than the joint material 7 illustrated in FIG. 6 and thus deformable by pressing the redistribution chip RDC thereto.

Moreover, as adhesive material NCL2 used in this step, either of an NCP (insulating material paste) or NCF (insulting material film) mentioned above can be used. In the example illustrated in FIGS. 27 and 28, the NCP (insulating material paste) is discharged from a nozzle 30 (see FIG. 28) such that the adhesive material NCL2 is disposed on the back surface 3b of the logic chip LC and the adhesive material NCL1 exposed from the logic chip LC.

Note that, the point that the adhesive material NCL2 in a paste-like form is discharged from the nozzle 30 is common with the post-injection method described above in the description about the step of disposing the first adhesive material. However, in the present embodiment, before mounting the memory chip MC1 illustrated in FIG. 4, the adhesive material NCL2 is previously mounted. Therefore, as compared with the post-injection method which injects a resin using the capillary action, the application speed of the adhesive material NCL2 can be significantly improved.

As compared with the insulating material film (NCF), the insulating material paste (NCP) can be rather tightly adhered to the application subject (the logic chip LC in this step) with low load. Therefore, from the view point of reducing stress on the logic chip LC having been already mounted upon this step, using the insulating material paste (NCP) is more preferable. However, although illustration is omitted, the insulating material film (NCF) can be also used as the adhesive material NCL2 as a modification example.

In the example illustrated in FIG. 27, the adhesive material NCL2 is applied in a belt-like form on the back surface 3b of the logic chip LC along diagonal lines of the logic chip LC forming a rectangle in the planar view. The method of applying the paste-like adhesive material NCL2 so as to form it like the two belts crossing each other in the applying region of the adhesive material NCL2 in this manner (called as "cross-application method") is preferable in the point that it is easy to evenly spread the adhesive material NCL2. However, in the step of mounting a second chip described later, another application method different from that of FIG. 27 can be used as long as it can spread the adhesive material NCL2 without creating a gap.

<Step of Preparing Second Chip>

Further, in a step of preparing a second chip illustrated in FIG. 16, the redistribution chip RDC illustrated in FIGS. 12 and 13 is prepared. To the redistribution chip RDC, the plurality of front surface electrodes 3ap formed to the surface 3a, the plurality of back surface electrodes 3bp formed to the back surface 3b, and the plurality of through silicon vias 3tsv electrically connecting the plurality of front surface electrodes 3ap and the plurality of back surface electrodes 3bp are formed. Also, at least a part of the plurality of front surface electrodes 3ap and a part the plurality of back surface electrodes 3bp are disposed at different positions (positions not overlapped in the thickness direction as illustrated in FIG. 6) in the planar view. In the example illustrated in FIGS. 12 and 13, the plurality of pairs of the front surface electrodes 3ap and the back surface electrodes 3bp for supplying a potential for driving circuits (driving power supply voltage) to the memory chips MC1, MC2, MC3 and MC4 are disposed at the same position in the planar view (positions overlapped in the thickness direction as illustrated in FIG. 6). Moreover, to the redistribution chip RDC, to one or both of the surface 3a and the back surface 3b, the lead wiring RDL for electrically connecting the front surface electrode 3ap or the back surface electrode 3bp and the through silicon via 3tsv is formed.

Regarding a method of manufacturing the redistribution chip RDC, since the redistribution chip RDC can be manufactured using the step described above about the step of preparing the first chip, repetitive descriptions will be omitted. Note that the lead wiring RDL of the redistribution chip RDC illustrated in FIGS. 12 and 13 can be formed in a step of forming a wiring layer illustrated in FIG. 23 and a step of forming back surface electrodes illustrated in FIG. 24. In addition, when forming the lead wiring RDL to one of the surface 3a and the back surface 3b, one of the step of forming a wiring layer illustrated in FIG. 23 and the step of forming back surface electrodes illustrated in FIG. 24 can be omitted. Further, when the step of preparing the first chip described above is used, a circuit can be formed by forming semiconductor elements to the redistribution chip RDC.

<Step of Mounting Second Chip>

Figure 29:
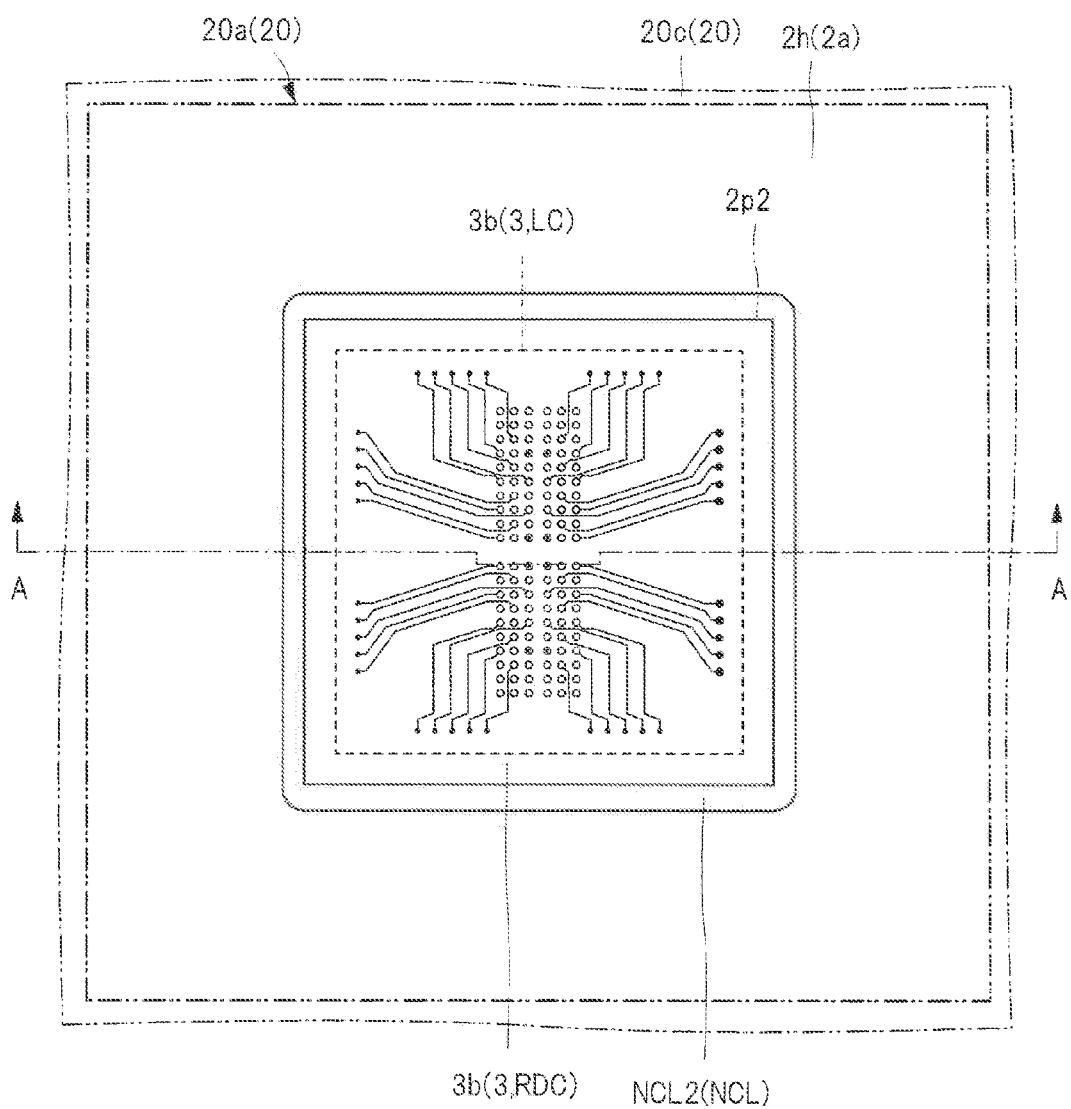
FIG. 29 is an enlarged planar view illustrating a state in which the redistribution chip is mounted on the back surface of the logic chip illustrated in FIG. 27.
Figure 30:
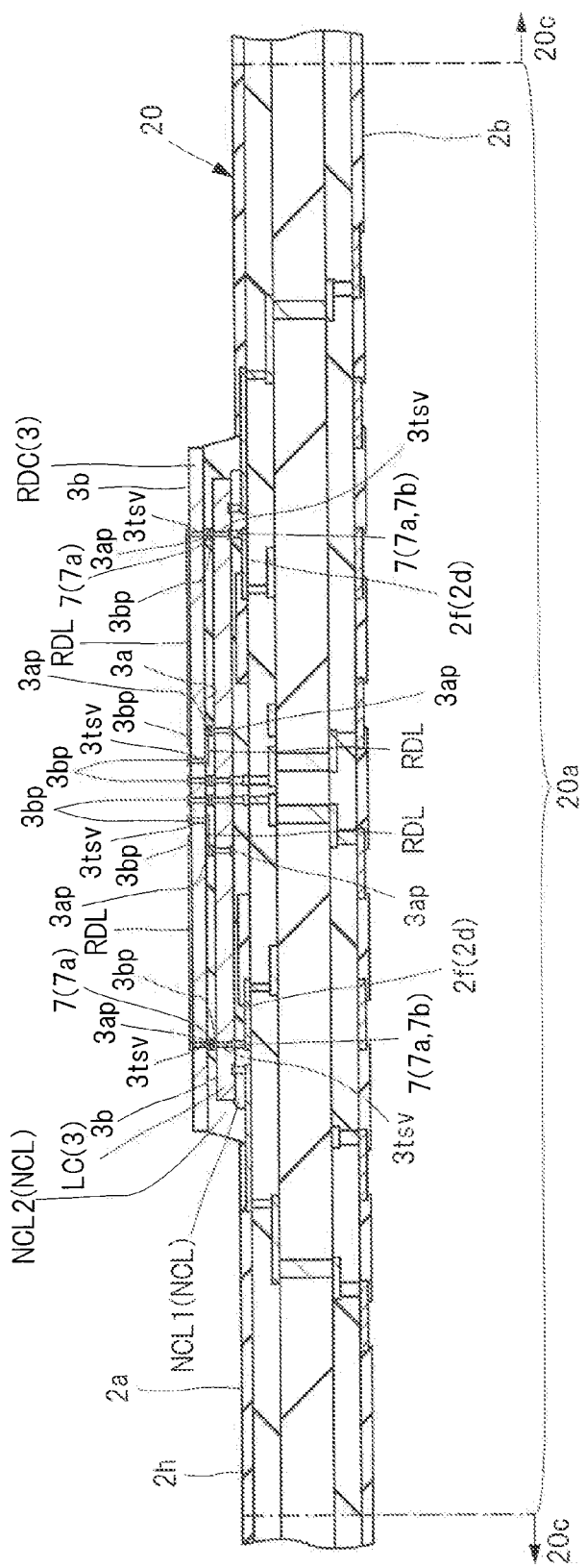
FIG. 30 is an enlarged cross-sectional view taken along the line A-A in FIG. 29.

Next, in a step of mounting the second chip illustrated in FIG. 16, as illustrated in FIGS. 29 and 30, the redistribution chip RDC is mounted over the logic chip LC. FIG. 29 is an enlarged plan view illustrating such a state that the redistribution chip RDC is mounted over the back surface 3b of the logic chip LC illustrated in FIG. 27. FIG. 30 is an enlarged cross-sectional view taken along the line A-A in FIG. 29.

In this step, as illustrated in FIG. 30, the redistribution chip RDC is mounted in the so-called face-down mounting method (flip-chip connection method) such that the surface 3a of the redistribution chip RDC faces the back surface 3b of the logic chip LC (or the upper surface 2a of the wiring board 20). In addition, in this step, the redistribution chip RDC and the logic chip LC are electrically connected. More specifically, as illustrated in FIG. 6, the plurality of front surface electrodes 3ap formed to the surface 3a of the redistribution chip RDC and the plurality of back surface electrodes 3bp formed to the back surface 3b of the logic chip LC are electrically connected via the joint materials 7 (solder material 7a).

In this step, as illustrated in FIG. 29, the redistribution chip RDC (semiconductor chip 3) is disposed on the chip-mounting region (chip-mounting portion) 2p2 of the wiring board 20. The chip-mounting region 2p2 is a region expected to mount the redistribution chip RDC in this step and thus actually visible boundary lines are not needed to exist same as the chip-mounting region 2p1 described in the descriptions about the step of mounting the first chip. The joint material 7 is formed to the surface 3a side of the redistribution chip RDC. The joint material 7 is joined with each of the plurality of front surface electrodes 3ap of the redistribution chip RDC. Further, although illustration is omitted, the joint material 7 can be joined also with the back surface electrode 3bp of the logic chip LC. In this step, each of the plurality of front surface electrodes 3ap of the redistribution chip RDC and each of the plurality of back surface electrodes 3bp of the logic chip LC are disposed to face each other.

Next, a heating jig not illustrated is pressed onto the back surface 3b side of the redistribution chip RDC to press the redistribution chip RDC toward the wiring board 20. Since the adhesive material NCL2 is soft before curing prior to performing a heating process, when the redistribution chip RDC is pushed by the heating jig, the adhesive material NCL2 illustrated in FIG. 28 is pushed into and spread between the back surface 3b of the logic chip LC and the redistribution chip RDC. Also, the tips of the plurality of joint materials 7 formed to the surface 3a of the redistribution chip RDC come into contact with the back surface electrodes 3bp (or the solder materials not illustrated formed on the back surface electrodes 3bp) of the logic chip LC.

Next, in such a state that the redistribution chip RDC is pressed by the heating jig not illustrated, the redistribution chip RDC and the adhesive material NCL2 are heated by the heating jig. At the joint portion of the redistribution chip RDC and the logic chip LC, the solder material 7a is melted and joined with the front surface electrode 3ap and the back surface electrode 3bp. In this manner, as illustrated in FIG. 6, the plurality of front surface electrodes 3ap of the redistribution chip RDC and the plurality of back surface electrodes 3bp of the logic chip LC are electrically connected via the joint materials 7 (solder materials 7a). Also, since the plurality of front surface electrodes 3ap of the redistribution chip RDC and the plurality of back surface electrodes 3bp of the logic chip LC are electrically connected to the plurality of through silicon vias 3tsv, respectively, in this step, the redistribution chip RDC is electrically connected to circuits formed in the logic chip LC via the plurality of through silicon vias 3tsv of the logic chip LC.

Also, the adhesive material NCL2 is cured by heating it. In this manner, the cured adhesive material NCL2 is obtained in such a state that a part of the redistribution chip RDC is buried therein. Moreover, the back surface electrodes 3bp of the redistribution chip RDC are exposed from the cured adhesive material NCL2.

<Step of Disposing Third Adhesive Material>

Figure 31:
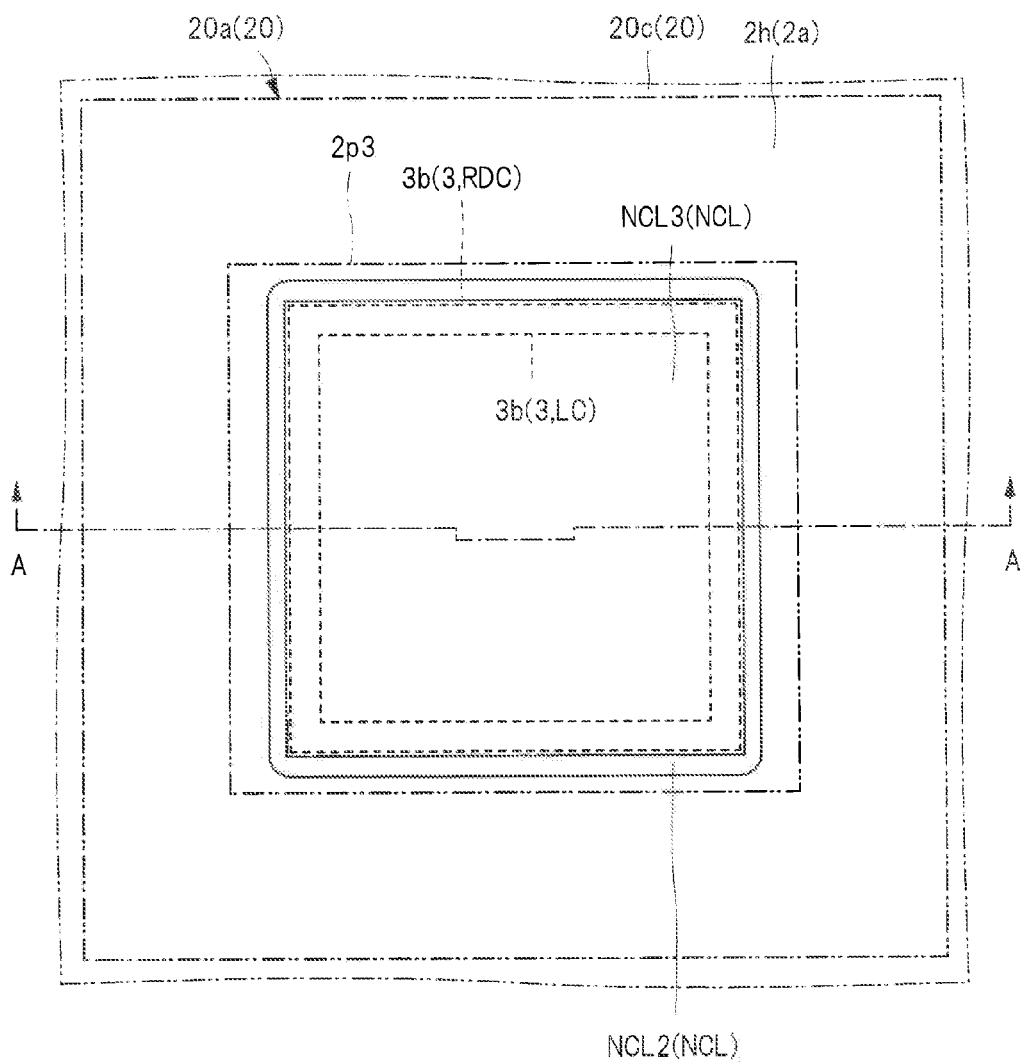
FIG. 31 is an enlarged planar view illustrating a state in which an adhesive material is disposed on the back surface and surrounding of the semiconductor chip illustrated in FIG. 29.
Figure 32:
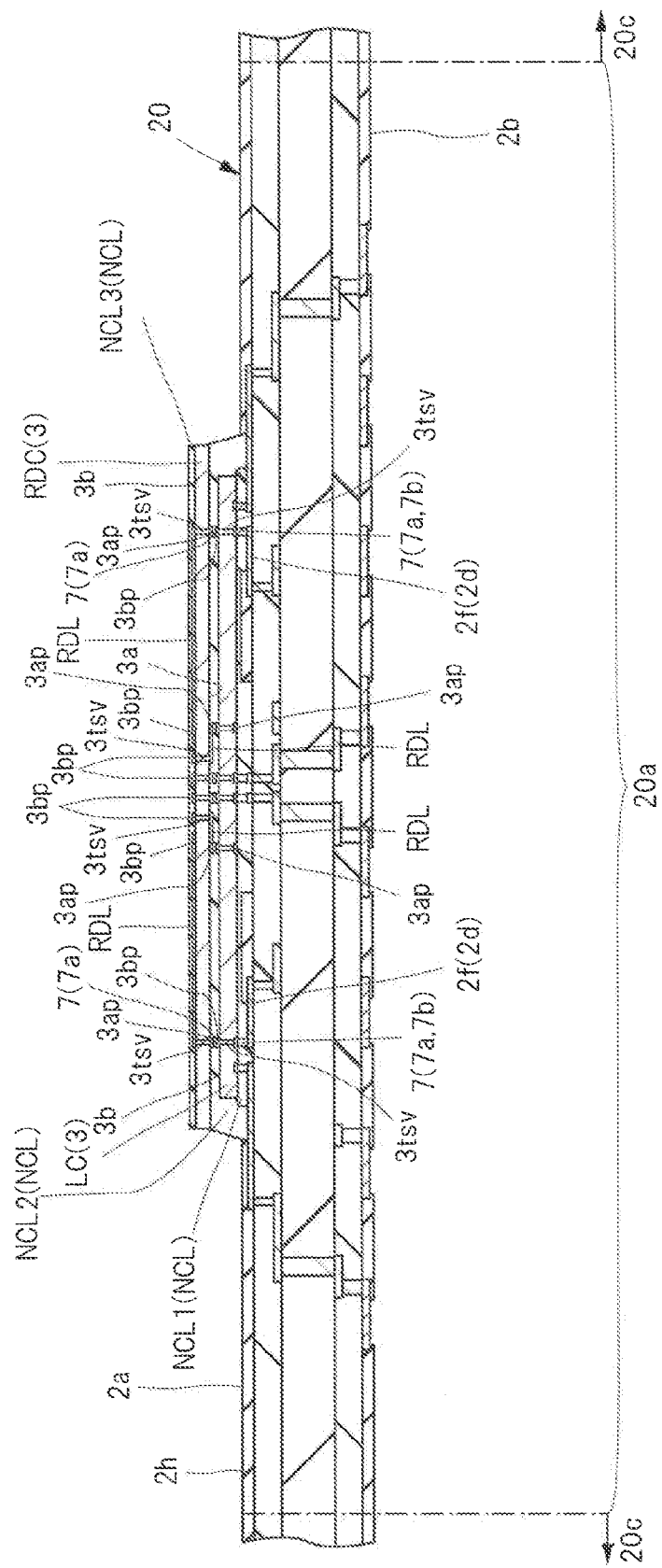
FIG. 32 is an enlarged cross-sectional view taken along the line A-A in FIG. 31.

Next, in a step of disposing a third adhesive material illustrated in FIG. 16, as illustrated in FIG. 31, an adhesive material NCL3 is disposed on the back surface 3b of the redistribution chip RDC (semiconductor chip 3). FIG. 31 is an enlarged plan view illustrating such a state that the adhesive material is disposed to the back surface 3b and its surrounding of the semiconductor chip 3. FIG. 32 is an enlarged cross-sectional view taken along the line A-A in FIG. 31.

As illustrated in FIG. 6 described above, in the semiconductor device 1 of the present embodiment, among the stacked plurality of semiconductor chips 3, each of the logic chip LC mounted at the bottom state (for example, the first stage), the redistribution chip RDC mounted at the second state from the bottom, and the memory chip MC1 mounted at the third stage from the bottom are mounted in the flip-chip connection method. Therefore, although the post-injection method can be used as a modification example as described in the foregoing about the step of disposing the first adhesive material, it is preferable to use the pre-application method regarding the points of the capability of reduction of the processing time for one device region 20a (see FIG. 31) and improvement in manufacturing efficiency.

In addition, the adhesive material NCL3 used in the pre-application method is formed of an insulating (non-conductive) material (e.g., resin material) as mentioned above. By disposing the adhesive material NCL3 to the joint portion of the logic chip LC (see FIG. 6) and the redistribution chip RDC (see FIG. 6), it is possible to obtain electrical insulation between the plurality of conductive members (e.g., the joint material 7 and back surface electrode 3bp illustrated in FIG. 6).

The adhesive material NCL2 is formed of a resin material having a hardness (degree of hardness) increased by being applied with energy; in the present embodiment, the adhesive material NCL3 contains, for example, a thermosetting resin. Still further, the adhesive material NCL2 before curing is softer than the joint material 7 illustrated in FIG. 6 and thus deformable by pressing the redistribution chip RDC thereto.

Moreover, as adhesive material NCL3 used in this step, either of an NCP (insulating material paste) or NCF (insulting material film) mentioned above can be used. In the example illustrated in FIGS. 31 and 32, the adhesive material NCL3 that is an NCF (insulating material film) is disposed on the back surface 3b of the redistribution chip RDC. When an NCF (insulating material film) is used, in this step, the NCF is disposed such that the back surface electrodes 3bp and the lead wirings RDL formed to the back surface 3b of the redistribution chip RDC are covered by and adhered to the adhesive material NCL3.

<Step of Preparing Third Chip>

Figure 34:
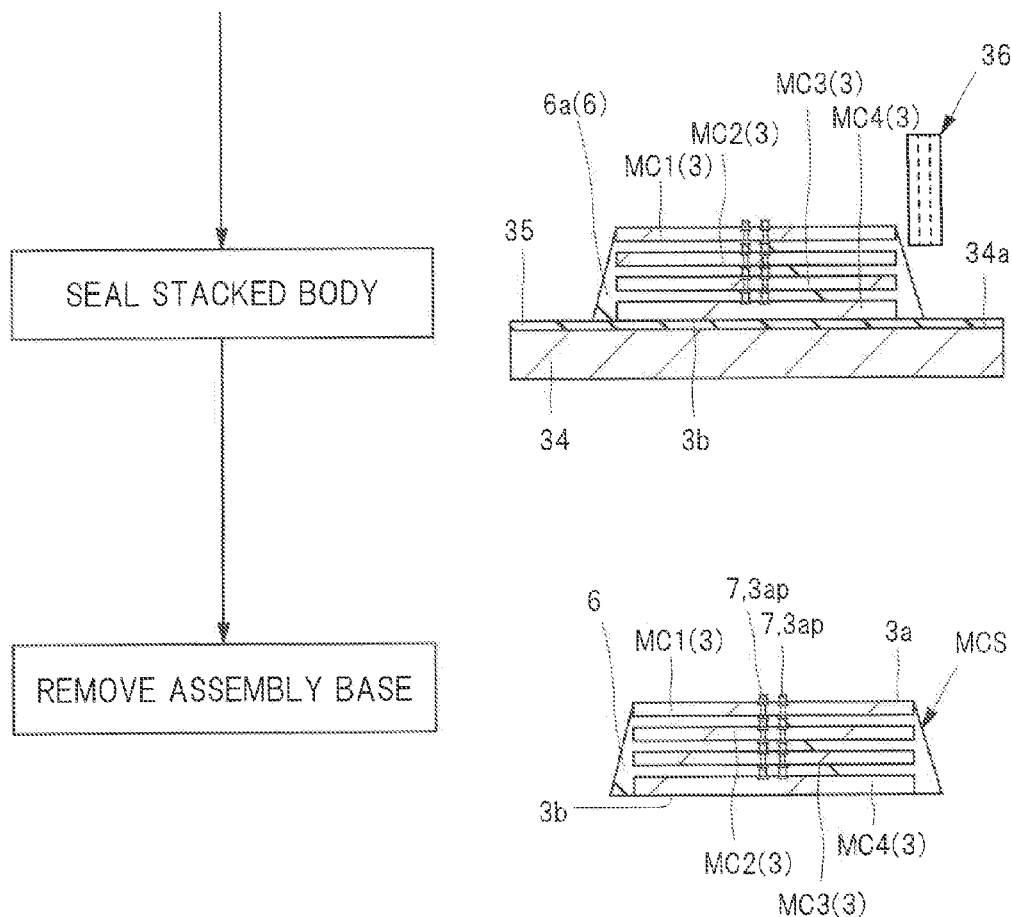
FIG. 34 is an explanatory diagram schematically illustrating an outline of the assembling step of the stacked body of the memory chip continued from FIG. 33.

In a step of preparing a third chip illustrated in FIG. 16, the stacked body MCS of the memory chips MC1, MC2, MC3 and MC4 illustrated in FIG. 4 is prepared. As a modification example to the present embodiment, the memory chips MC1, MC2, MC3 and MC4 can be sequentially stacked on the logic chip LC. However, in the present embodiment, an aspect in which the memory chips MC1, MC2, MC3 and MC4 are previously stacked and the stacked body (memory-chip stacked body, semiconductor chip stacked body) MCS illustrated in FIG. 34 are formed will be described. As described below, the step of forming the stacked body MCS of the memory chips MC1, MC2, MC3 and MC4, may be performed independently from other steps, for example, at another place than that of the other step of preparing the third chip illustrated in FIG. 16. For example, the stacked body MCS can be prepared as a purchased part. Therefore, it is advantageous in simplifying the assembly step illustrated in FIG. 16 and improving the manufacturing efficiency as a whole.

Figure 33:
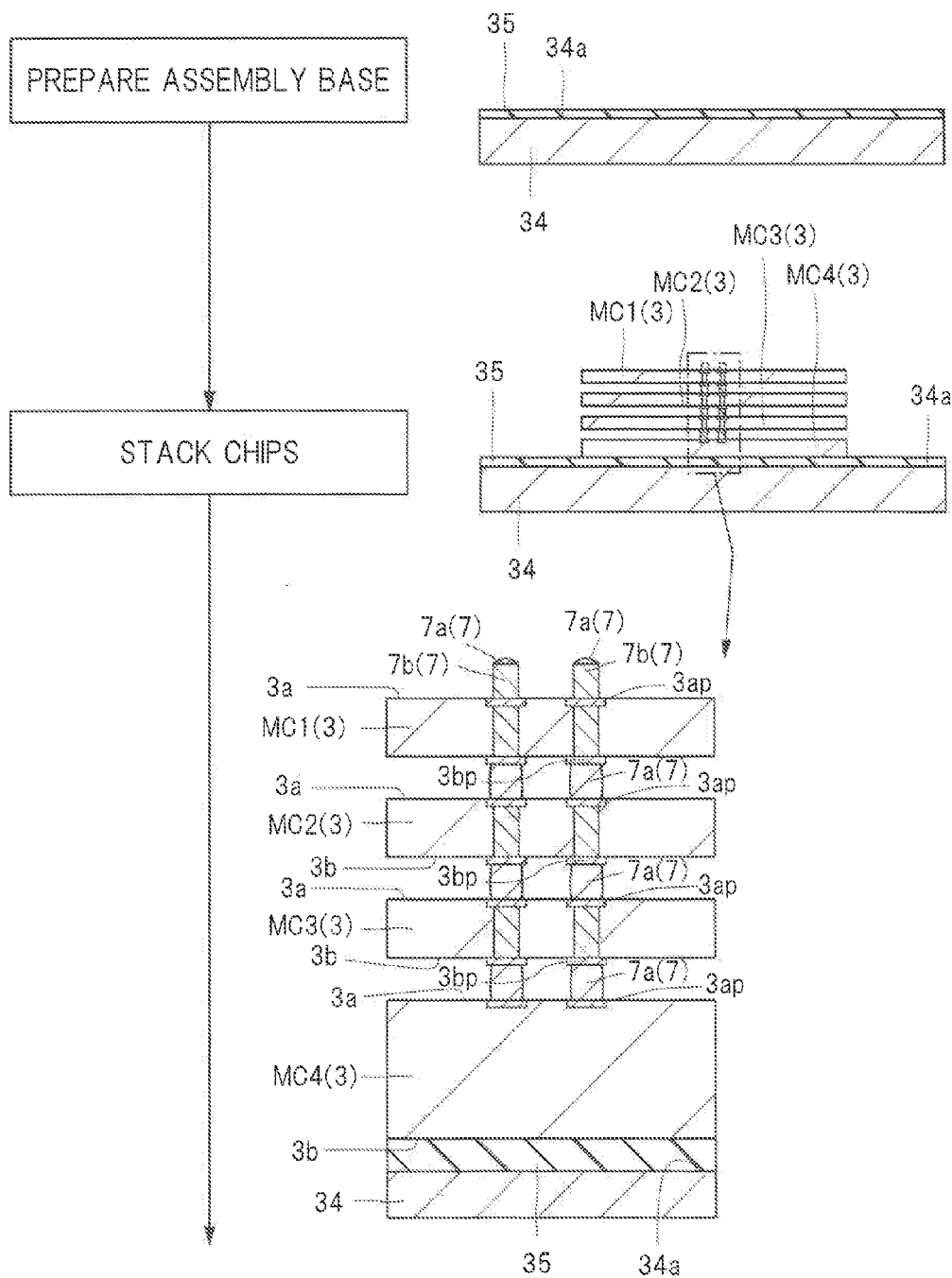
FIG. 33 is an explanatory diagram schematically illustrating an outline of an assembling step of a stacked body of the memory chip illustrated in FIG. 4.

FIG. 33 is an explanatory diagram schematically illustrating a summary of an assembly step of the stacked body of the memory chips illustrated in FIG. 4. FIG. 34 is an explanatory diagram schematically illustrating a summary of the assembly step of the memory chips continued from FIG. 33. Note that a manufacturing method of each of the plurality of memory chips MC1, MC2, MC3 and MC4 illustrated in FIGS. 33 and 34 can be that used for the method of manufacturing the semiconductor chip described with reference to FIGS. 23 and 24 and thus descriptions thereof will be omitted.

First, as a step of preparing an assembly base material, a base material for assembling the stacked body MCS (assembly base material) illustrated in FIG. 34 is prepared. The base material 34 has an assembly surface 34a for stacking the plurality of memory chips MC1, MC2, MC3 and MC4 and an adhesive layer 35 is provided to the assembly surface 34a.

Next, as a step of stacking chips, the memory chips MC1, MC2, MC3 and MC4 are stacked on the assembly surface 34a of the base material 34. In the example illustrated in FIG. 33, the memory chips MC1, MC2, MC3 and MC4 are sequentially stacked in this order such that the back surface 3b of each of the semiconductor chips to be stacked faces the assembly surface 34a of the base material. The back surface electrodes 3bp of the semiconductor chip 3 on the upper stage side are joined with the front surface electrodes 3ap of the semiconductor chip on the lower stage side by, for example, the joint material 7 (solder ember 7a). In addition, the bump electrode 7b and the solder material 7a to be joined with the tip of the bump electrode 7b are formed to the front surface electrodes 3ap of the memory chip MC1 provided to the top stage.

Next, in a step of sealing the stacked body illustrated in FIG. 34, a resin (underfill resin) is supplied between the stacked plurality of semiconductor chips 3 to form a sealed body (sealed body for stacked-chip body, resin body for stacked-chip body) 6. The sealed body 6 is formed by the post-injection method which is mentioned in the step of disposing the first adhesive material described above. That is, after tacking the semiconductor chips 3 beforehand, an underfill resin 6a is supplied from a nozzle 36 and buried between the stacked plurality of semiconductor chips 3. The underfill resin 6a has a lower viscosity than a resin for sealing used in a step of sealing illustrated in FIG. 16 and thus it can be buried between the plurality of semiconductor chips 3 using the capillary action. Thereafter, the underfill resin 6a buried between the semiconductor chips 3 is cured to obtain the sealed body 6.

This method of forming the sealed body by the post-injection method is excellent in characteristics of burying in a gap as compared with a so-called transfer-mold method; thus, it is effectively used in such a case that a gap(s) between the stacked semiconductor chips 3 is narrow. Also, as illustrated in FIG. 34, when the gaps to which the underfill resin 6a is buried are formed across a plurality of stages, the underfill resin 6a can be buried in a lump to the plurality of gaps. Therefore, the processing time can be shortened as a whole.

Next, in a step of removing the assembly base material, the base material 34 and the adhesive layer 35 are removed by exfoliating them from the back surface 3b of the memory chip MC4. As a method of removing the assembly base material 34 and the adhesive layer 35, a method of curing a resin component (for example, ultraviolet curable resin) contained in the adhesive layer 35 may be used. According to the steps described above, the stacked body MCS in which the plurality of memory chips MC1, MC2, MC3 and MC4 are stacked and connection portions of the respective memory chips MC1, MC2, MC3 and MC4 are sealed by the sealed body 6 is obtained. This stacked body MCS can be regarded as one memory chip having a surface 3a (surface 3a of the memory chip MC1) to which the plurality of front surface electrodes 3ap are formed, and the back surface 3b (back surface 3b of the memory chip MC4) positioned opposite to the surface 3a.

<Step of Mounting Third Chip>

Figure 35:
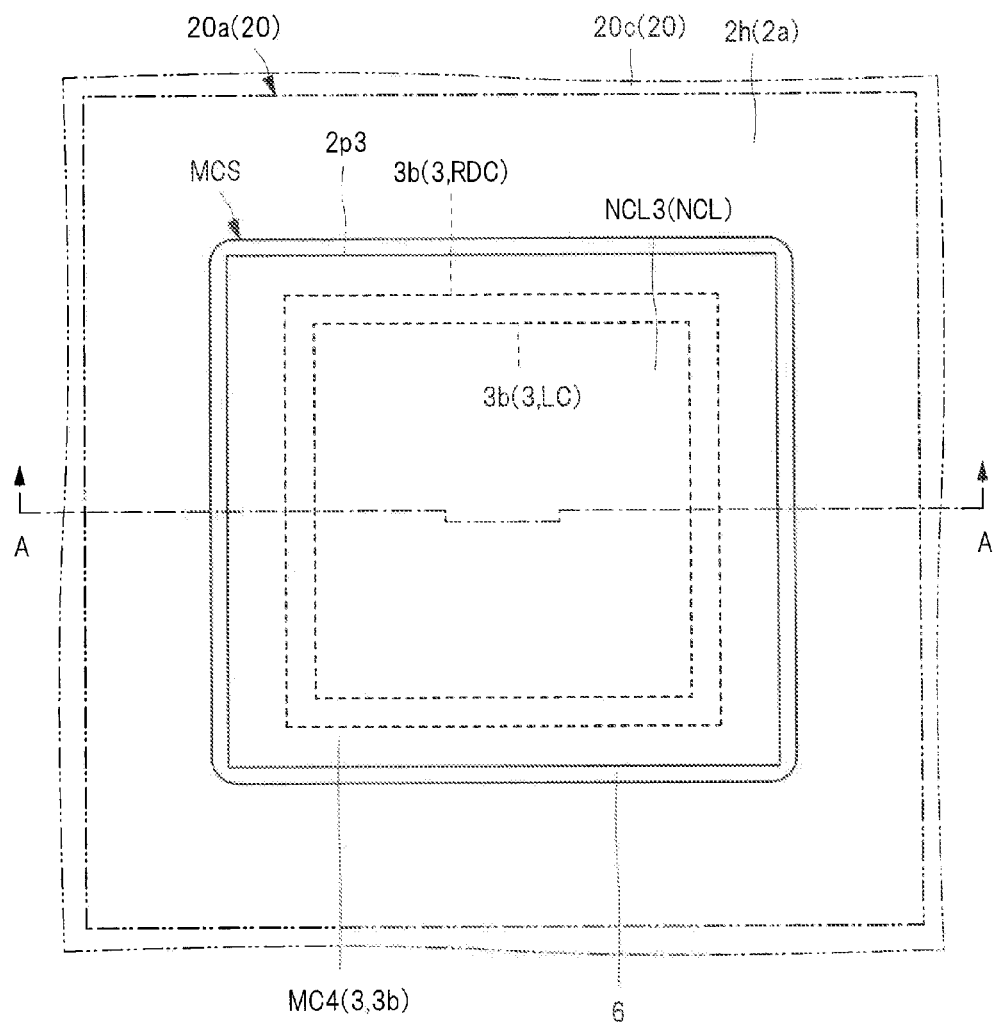
FIG. 35 is an enlarged planar view illustrating a state in which the stacked body of the memory chip on a back surface of the redistribution chip illustrated in FIG. 31.
Figure 36:
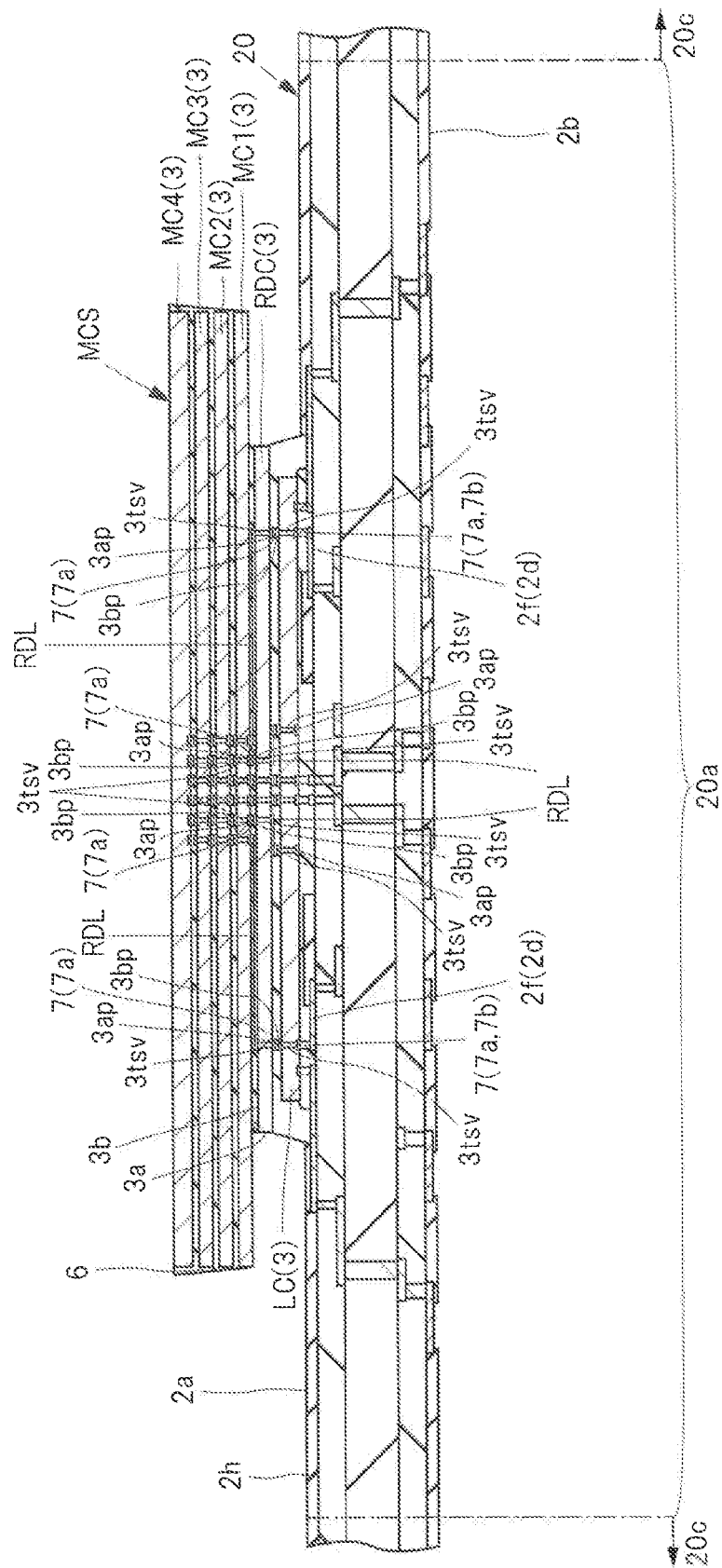
FIG. 36 is an enlarged cross-sectional view taken along the line A-A in FIG. 35.

Next, in a step of mounting the third chip illustrated in FIG. 16, as illustrated in FIGS. 35 and 36, the redistribution chip RDC is mounted over the logic chip LC. FIG. 35 is an enlarged plan view illustrating such a state that the stacked body MCS of the memory chips is mounted on the back surface 3b of the redistribution chip RDC illustrated in FIG. 31, FIG. 36 is an enlarged cross-sectional view taken along the line A-A in FIG. 35.

In this step, as illustrated in FIG. 36, the stacked body MCS is mounted in the so-called face-down mounting method (flip-chip connection method) such that the surface 3a of the stacked body MCS faces the back surface 3b of the redistribution chip RDC (or the upper surface 2a of the wiring board 20). In addition, in this step, the stacked body MCS and the redistribution chip RDC are electrically connected. More specifically, as illustrated in FIG. 6, the plurality of front surface electrodes 3ap formed to the surface 3a of the stacked body MCS and the plurality of back surface electrodes 3bp formed to the back surface 3b of the redistribution chip RDC are electrically connected via the joint materials 7 (solder materials 7a).

In this step, as illustrated in FIG. 35, the stacked body MCS (semiconductor chip 3) is disposed on the chip-mounting region (chip-mounting portion) 2p3 of the wiring board 20. The chip-mounting region 2p3 is a region expected to mount the stacked body MCS in this step and thus actually visible lines are not needed to exist same as the chip-mounting region 2p1 described above in the description of the step of mounting the first chip. The joint material 7 is formed to the surface 3a side of the stacked body MCS. The joint material 7 is joined with each of the plurality of front surface electrodes 3ap of the stacked body MCS. Further, although illustration is omitted, the joint material 7 can be joined also with each of the back surface electrode 3bp of the redistribution chip RDC. In this step, each of the plurality of front surface electrodes 3ap of the stacked body MCS and each of the plurality of back surface electrodes 3bp of the redistribution chip RDC are disposed to face each other.

Next, a heating jig not illustrated is pressed onto the back surface 3b side of the stacked body MCS to press the stacked body MCS toward the wiring board 20. Since the adhesive material NCL3 is soft before curing prior to performing a heating process, when the stacked body MCS is pushed by the heating jig, the tips of the plurality of joint materials 7 formed to the surface 3a of the stacked body MCS come into contact with the back surface electrodes 3bp (or the solder materials not illustrated formed on the back surface electrodes 3bp) of the redistribution chip RDC.

Next, in such a state that the stacked body MCS is pressed by the heating jig not illustrated, the stacked body MCS and the adhesive material NCL3 are heated by the heating jig. At the joint portion of the stacked body MCS and the redistribution chip RDC, the solder material 7a is melted and joined with the front surface electrode 3ap and the back surface electrode 3bp. In this manner, as illustrated in FIG. 6, the plurality of front surface electrodes 3ap of the stacked body MCS and the plurality of back surface electrodes 3bp of the redistribution chip RDC are electrically connected via the joint materials 7 (solder materials 7a), respectively. Also, since the plurality of back surface electrodes 3bp of the redistribution chip RDC are electrically connected to the plurality of through silicon vias 3tsv respectively, in this step, the stacked body MCS is electrically connected to circuits formed in the logic chip LC via the redistribution chip RDC and the plurality of through silicon vias 3tsv of the logic chip LC.

Also, the adhesive material NCL3 is cured by heating it. In this manner, the cured adhesive material NCL3 is obtained in such a state that a part of the stacked body MCS is buried therein. Moreover, the back surface electrodes 3bp of the stacked body MCS are exposed from the cured adhesive material NCL3.

<Step of Sealing>

Figure 37:
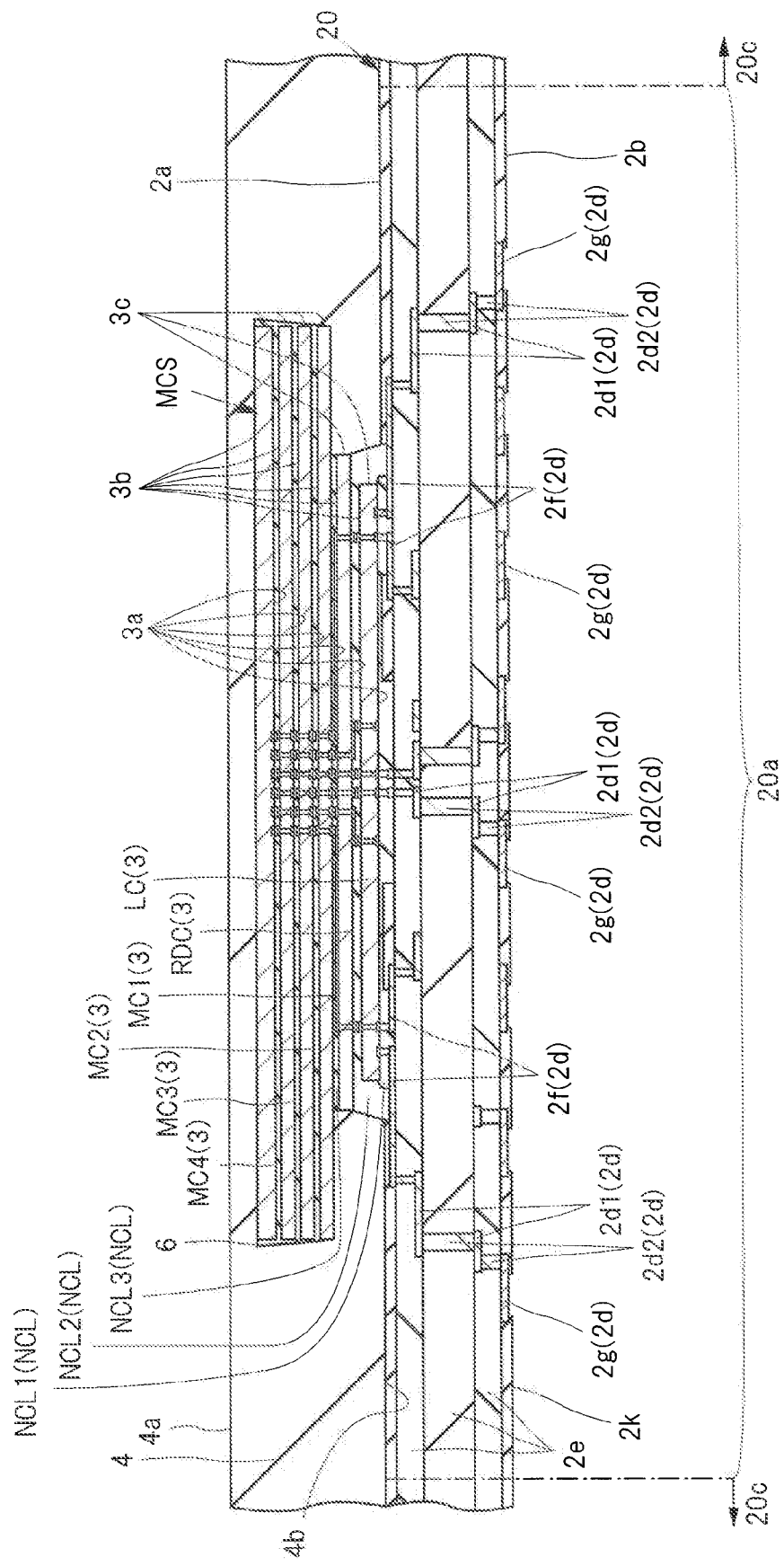
FIG. 37 is an enlarged cross-sectional view illustrating a state in which a sealing body is formed on the wiring board illustrated in FIG. 36 and a plurality of semiconductor chips stacked are sealed.
Figure 38:
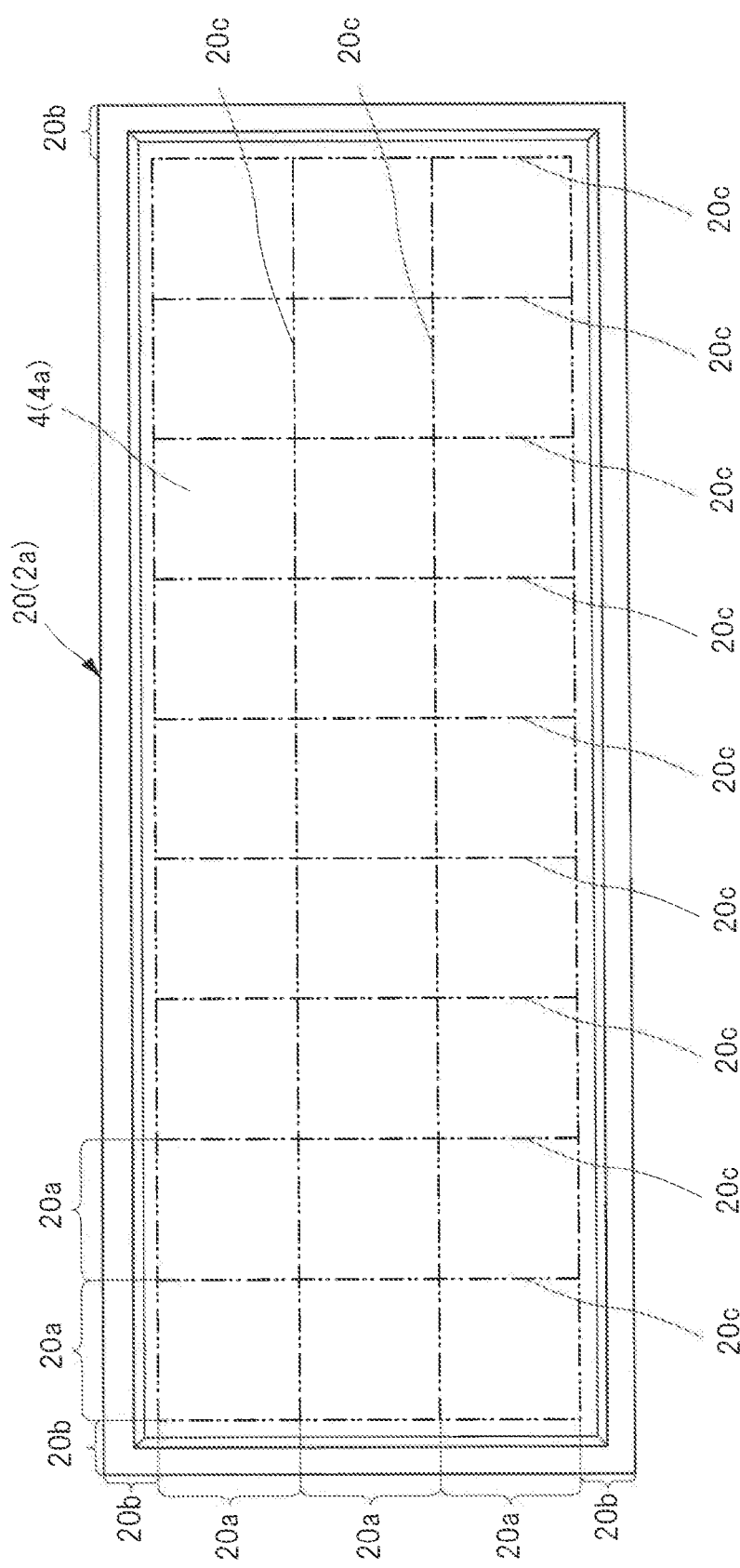
FIG. 38 is a planar view illustrating an overall structure of the sealing body illustrated in FIG. 37.

Next, in a step of sealing illustrated in FIG. 16, as illustrated in FIG. 37, the upper surface 2a of the wiring board 20, the logic chip LC, the redistribution chip RDC, and the stacked body MCS of the plurality of memory chips MC1, MC2, MC3 and MC4 are sealed by a resin to form the sealed body 4. FIG. 37 is an enlarged cross-sectional view illustrating such a state that a sealed body is formed on the wiring board illustrated in FIG. 36 and the stacked plurality of semiconductor chips are sealed. FIG. 38 is a plan view illustrating an entire structure of the sealed body illustrated in FIG. 37.

In the present embodiment, as illustrated in FIG. 38, the sealed body 4 for sealing the plurality of device regions 20a (a plurality of semiconductor chips mounted to the plurality of device regions 20a, respectively) in a lump. Such a method of forming the sealed, body 4 is called "block molding" method and a semiconductor package manufactured by this block molding is called "MAP (multi array package)" type of semiconductor device. Since the gap between the device regions 20a can be small in the block molding, an effective area in one wiring board 20 is large. That is, the number of products obtained from one wiring board 20 is increased. In this manner, by enlarging the effective area in one wiring board 20, efficiency of the manufacturing process can be increased.

In addition, in the present embodiment, the resin is thermally cured after inserting the resin being softened by heating it inside a mold not illustrated with pressure and molding the same, that is, the sealed body 4 is formed by a so-called transfer mold method. The sealed body 4 formed by the transfer mold method has a higher durability than those in which a liquid resin is cured like the sealed body 6 for sealing the stacked body MCS illustrated in FIG. 37 and thus is suitable as a protective member. Also, by mixing filler particles such as silica (silicon dioxide; $SiO_2$) in the thermosetting resin, the function of the sealed body 4 (for example, resistance against warping deformation) can be improved.

Note that, in the present embodiment, the joint portions (electrical connection portions) of the stacked plurality of semiconductor chips 3 are sealed by the adhesive materials NCL1, NCL2 and NCL3, and the sealed body 6. Therefore, as a modification example, an aspect not forming the sealed body 4 can be used. In this case, this step of sealing can be omitted.

<Step of Ball Mounting>

Figure 39:
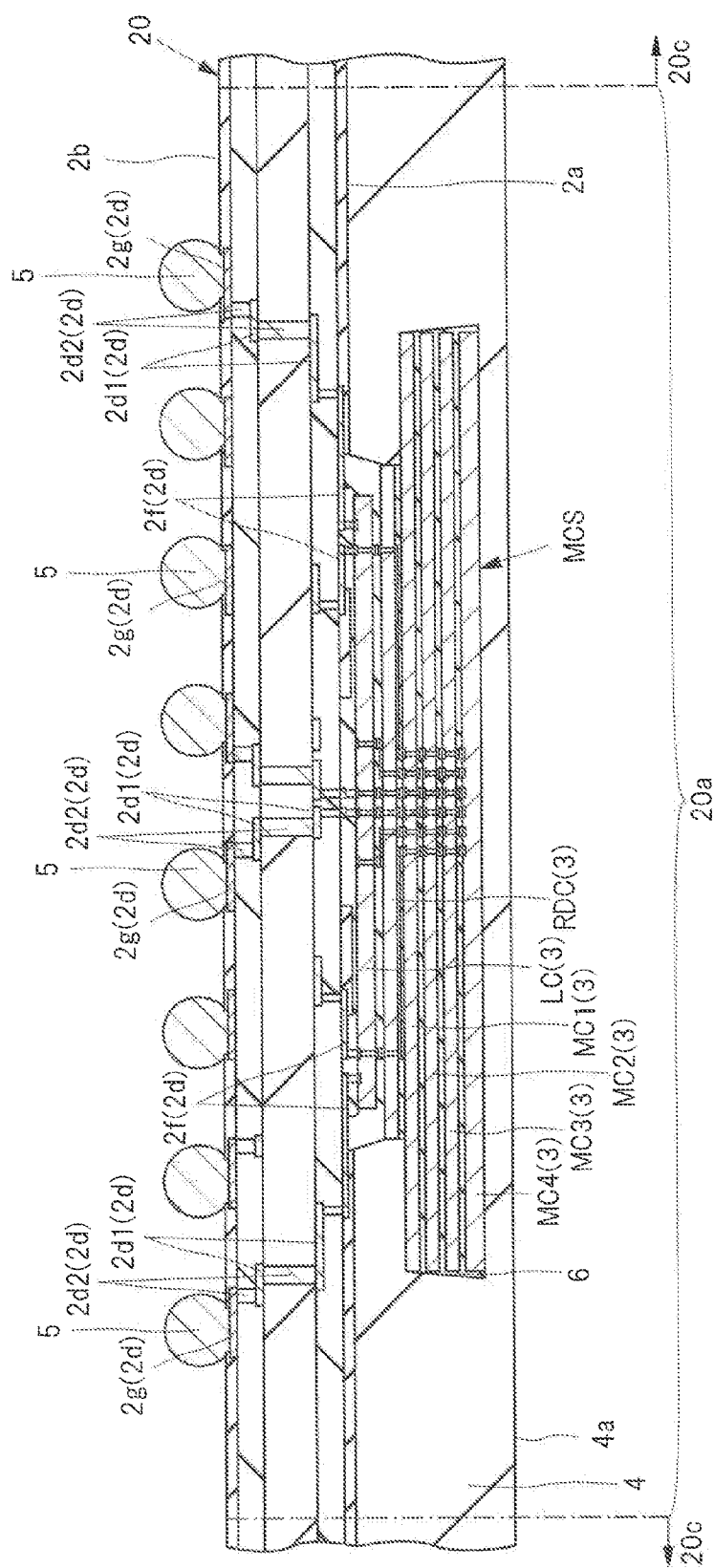
FIG. 39 is an enlarged cross-sectional view illustrating a state in which solder balls are joined on a plurality of lands of the wiring board illustrated in FIG. 37.

Next, in a step of ball mounting illustrated in FIG. 16, as illustrated in FIG. 39, a plurality of solder balls 5 to be external terminal later are joined to the plurality of lands 2g formed to the lower surface 2b of the wiring board 20, FIG. 39 is an enlarged cross-sectional view illustrating a state in which the solder balls 5 are joined on the plurality of lands 2g of the wiring board 20.

In this step, after flipping the wiring board 20 upside and down as illustrated in FIG. 39, the solder balls 5 are disposed on the plurality of 2g exposed in the lower surface 2b of the wiring board 20, respectively, and then, the plurality of solder balls 5 and the lands 2g are joined by heating. In this step, the plurality of solder balls 5 are electrically connected to the plurality of semiconductor chips 3 (the logic chip LC, the redistribution chip RDC, and the memory chips MC1, MC2, MC3 and MC4) via the wiring board 20. However, the technique described in the present embodiment is not limited to the use for a semiconductor device of so-called BGA (ball grid array) in which the solder balls 5 are joined in an array. For example, as a modification example to the present embodiment, the semiconductor device can be used for a so-called LGA (Land Grid Array) type semiconductor device which is shipped in such a state that the lands 2g are exposed without forming the solder balls 5 or a solder paste is applied to the lands 2g by a thickness smaller than that of the solder balls 5. In the case of the LGA type semiconductor device, the step of ball mounting can be omitted.

<Step of Singulation>

Figure 40:
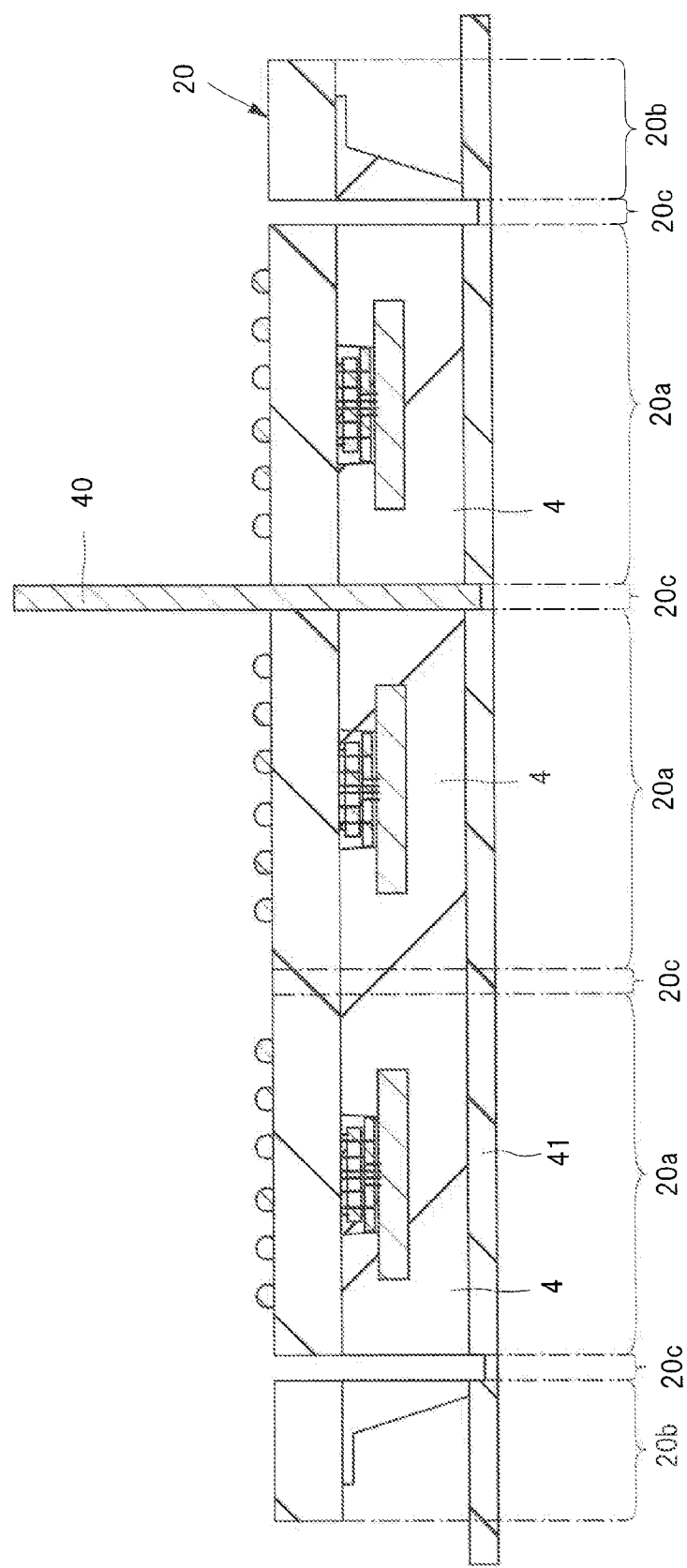
FIG. 40 is a cross-sectional view illustrating a state in which the wiring board of multiple chips illustrated in FIG. 39 is singulated.

Next, in a step of singulation illustrated in FIG. 16, as illustrated in FIG. 40, the wiring board 20 is divided per the device region 20a. FIG. 40 is a cross-sectional view illustrating a state in which the wiring board for obtaining multiple circuits illustrated in FIG. 39 is singulated. In this step, as illustrated in FIG. 40, the wiring board 20 and the sealed body 4 are cut along dicing lines (dicing regions) 20c to obtain the plurality of singulated semiconductor chips 1 (see FIG. 4). Although a method of cutting is not limited, in the example illustrated in FIG. 40, an aspect of cutting by subjecting the wiring board 20 and the sealed body 4 adhered and fixed to a tape material (dicing tape) 41 to a cutting work from the lower surface 2b side of the wiring board 20 using a dicing blade (rotary blade) 40. However, the technique described in the present embodiment is not limited to the case of using the wiring board 20 which is for obtaining multiple circuits having a plurality of device regions 20a. For example, the present embodiment can be used for a semiconductor device in which the plurality of semiconductor chips 3 are stacked on the wiring board 2 (see FIG. 4) corresponding to one semiconductor device. In this case, this step of singulation can be omitted.

According to respective steps described in the foregoing, the semiconductor device 1 described with reference to FIGS. 1 to 13 is obtained. Thereafter, necessary inspections and tests such as a visual inspection and electrical tests etc. are performed on the semiconductor device 1 and the semiconductor device 1 is shipped or mounted on a mounting board not illustrated.

Second Embodiment

In the first embodiment, as an embodiment capable of improving the degree of freedom of design for a logic chip LC and a memory chip MC1, an embodiment of disposing a redistribution chip RDC between the logic chip LC and the memory chip MC and electrically connecting the logic chip LC and the memory chip MC1 via the redistribution chip RDC has been described. In a second embodiment, an embodiment of disposing the logic chip LC and the redistribution chip RDC on the wiring board 2 will be described. Note that the descriptions will be focused on differences from the first embodiment which has been already described above and thus repetitive descriptions will be omitted in principle.

Figure 42:
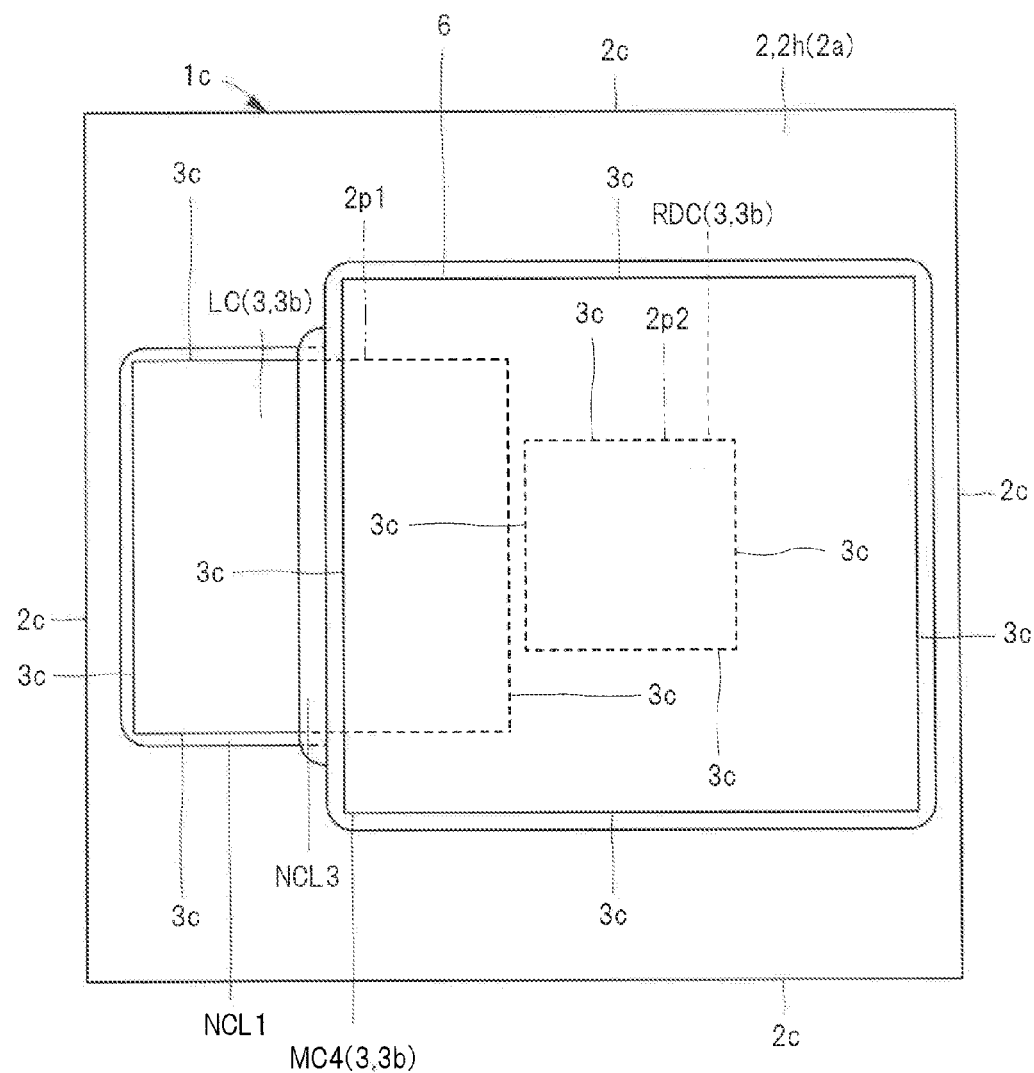
FIG. 42 is a perspective planar view illustrating an inner structure of the semiconductor device on a wiring board in a state in which a sealing body illustrated in FIG. 41 is omitted.
Figure 43:
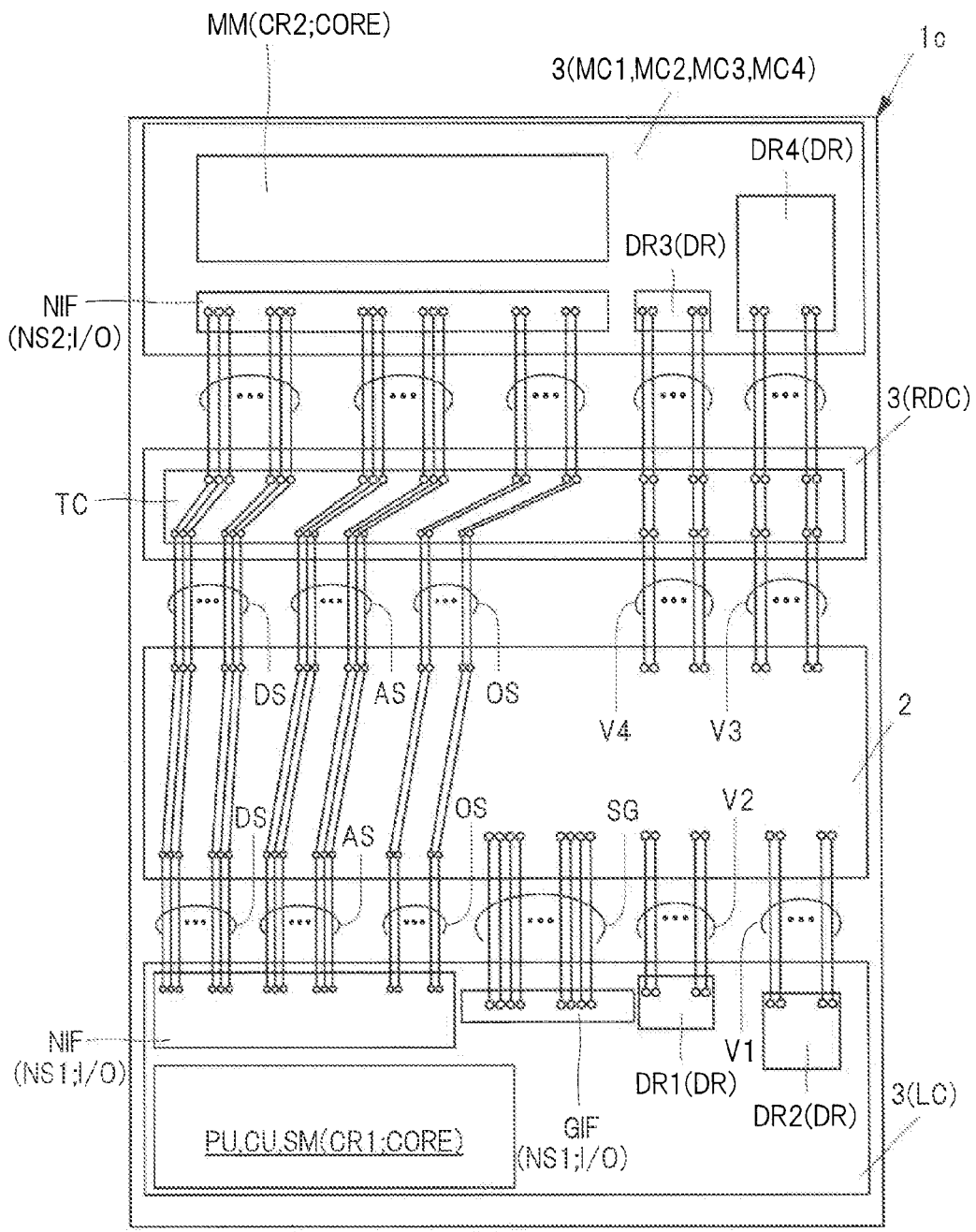
FIG. 43 is an explanatory diagram schematically illustrating a circuit configuration example of the semiconductor device illustrated in FIGS. 41 and 42.

FIG. 41 is a cross-sectional view of a semiconductor device which is a modification example to FIG. 4. FIG. 42 is a perspective plan view illustrating an inner structure of the semiconductor device on a wiring board in such a state that a sealing body illustrated in FIG. 41 is eliminated. FIG. 43 is a schematic explanatory diagram illustrating a circuit configuration example of the semiconductor device illustrated in FIG. 42. Note that, to facilitate viewing, the number of terminals is illustrated to be smaller than an actual number; also, the number of terminals (bonding leads 2f, lands 2g and solder balls 5) is not limited to the embodiment illustrated in FIG. 41. In FIG. 42, to facilitate viewing of differences in positional relation and planar size in the plan view between the logic chip LC and the memory chip MC4, the contours of the logic chip LC and the redistribution chip RDC are illustrated by dotted lines (a part of the contour of the logic chip LC is a solid line).

First, a semiconductor device 1c is different from the semiconductor device 1 illustrated in FIG. 4 in the points that the logic chip LC and the redistribution chip RDC are mounted over the wiring board 2 next to each other not to overlap each other in the thickness direction as illustrated in FIG. 41; and the stacked body MCS is stacked on the redistribution chip RDC such that the stacked body MCS overlaps the logic chip LC and the redistribution chip RDC. In other words, as illustrated in FIG. 42, in the semiconductor device 1c, a chip-mounting region (chip-mounting portion) 2p1 in which the logic chip LC is mounted and a chip-mounting region (chip-mounting portion) 2p2 in which the redistribution chip RDC is mounted are not overlapped in the plan view and disposed next to each other on the upper surface 2a side of the wiring board 2.

When the plurality of semiconductor chip 3 are mounted next to each other on the wiring board 2 like the semiconductor device 1c, the stacked thickness of the semiconductor chips 3 can be reduced. Therefore, the thickness of the semiconductor device 1c can be smaller than that of the semiconductor device 1 (see FIG. 4) described in the first embodiment above. In addition, when the semiconductor chips 3 are mounted in the face-down mounting method (flip-chip connection method), it is easier to mount on the wiring board 2 than to mount on the semiconductor chip 3.

Also, as illustrated in FIG. 41, the logic chip LC and the redistribution chip RDC of the semiconductor device 1c are mounted on the wiring board 2 in the face-down mounting method (flip-chip mounting method) in such a state that each of the surfaces 3a faces the upper surface 2a of the wiring board 2. In addition, on the redistribution chip RDC, the stacked body MCS of the memory chips MC1, MC2, MC3 and MC4 is mounted on the wiring board 2 in the face-down mounting method (flip-chip connection method). The redistribution chip RDC and the stacked body MCS of the memory chips MC1, MC2, MC3 and MC4 are electrically connected to each other via the plurality of through silicon vias 3tsv formed to the redistribution chip RDC. Moreover, the semiconductor device 1c is different from the semiconductor device 1 illustrated in FIG. 4 in the point that the plurality of front surface electrodes 3ap of the logic chip LC and the plurality of front surface electrodes 3ap of the redistribution chip RDC are electrically connected via a plurality of wirings 2d included in the wiring board 2.

For example, FIG. 43 describes a circuit configuration example for connecting the logic chip LC and the redistribution chip RDC to which the stacked body MCS of the memory chips MC1, MC2, MC3 and MC4 are mounted are electrically connected via the mounting board 2 like the semiconductor chip 1c. In the example illustrated in FIG. 43, the wiring board 2 is interposed between transmission paths connecting an inner interface circuit NIF included in the logic chip LC and a relay circuit TC of the redistribution chip RDC. Therefore, by the plurality of wirings 2d (see FIG. 41) formed to the wiring board 2, positions of electrodes (external terminals) of the logic chip LC and the redistribution chip RDC can be adjusted.

More specifically, in the case of the semiconductor chip 1c, it is not needed to form the through silicon vias 3tsv (see FIG. 6) to the logic chip LC, to connect the inner interface circuit NIF included in the logic chip LC and the inner interface circuit NIP of the memory chips MC1, MC2, MC3 and MC4.

Therefore, in the example illustrated in FIG. 41, the logic chip LC does not include the through silicon vias 3tsv for electrically connecting the surface 3a side and the back surface 3b side in the logic chip LC. Further, the back surface electrodes 3bp (see FIG. 6) are not formed to the back surface electrodes 3bp (see FIG. 6) are not formed to the back surface 3b of the logic chip LC. Therefore, in the case of the semiconductor device 1c, it is easier to simplify the structure of the logic chip LC than the semiconductor device 1 described above and thus the freedom in design is improved. Also, since the steps of forming the through silicon vias 3tsv and the back surface electrodes 3bp can be omitted at the stage of manufacturing the logic chip LC, manufacturing efficiency can be improved.

However, as illustrated in FIG. 41, a part of the back surface 3b of the logic chip LC is exposed from the stacked body MCS, the present embodiment can be used for an aspect of mounting another electronic tool (for example, semiconductor chip 3) in a region in which the back surface 3b is exposed by the face-down mounting method (flip-chip connecting method). In this case, by connecting the through silicon vias 3tsv and the back surface electrodes 3bp as illustrated in FIG. 6 to the logic chip LC, not-illustrated electronic parts mounted on the logic chip LC and the logic chip LC can be electrically connected.

In addition, when the positions of the logic chip LC and the electrodes (external terminals) of the redistribution chip RDC are adjusted by the wiring board 2, for example, as illustrated in FIG. 42, the planar size of the redistribution chip RDC included in the semiconductor device 1c can be made smaller than that of the redistribution chip RDC included in the semiconductor device 1. In the example illustrated in FIG. 42, the planar size of the redistribution chip RDC is smaller than that of the memory chip MC4 and that of the logic chip LC. In addition, in the example illustrated in FIG. 41, the redistribution chip RDC has the lead wirings RDL formed to each of the surface 3a and the back surface 3b. However, a configuration in which the lead wirings RDL are not formed can be used as a modification example. In this case, the planar size of the redistribution chip RDC can be further reduced. However, when the lead wirings RDL are not formed to the redistribution chip RDC, the plurality of bonding leads 2f should be formed to the upper surface 2a of the wiring board 2 to fit to the layout of the front surface electrodes 3ap of the memory chip. Therefore, in consideration of an easy design (layout) of the plurality of bonding leads 2f, the lead wirings RDL are preferably formed to the redistribution chip RDC.

While the manufacturing efficiency of the redistribution chip RDC is improved when the planar size of the redistribution chip RDC is reduced, upon mounting the stacked body MCS on the redistribution chip RDC, it is difficult to stabilize the stacked body. Accordingly, as illustrated in FIGS. 41 and 42, at least a part of the logic chip LC is preferably disposed between the surface 3a of the memory chip MC1 and the upper surface 2a of the wiring board 2. In other words, at least a part of the logic chip LC is preferable covered with the memory chip MC1. In this manner, the disposing range of the adhesive material NCL3 for adhering and fixing the stacked body MCS upon mounting the memory chip MC1 on the redistribution chip RDC can be spread to the area on the back surface 3b of the redistribution chip RDC and the back surface 3b of the logic chip LC, and thus the stacked body MCS is not prone to tilt upon mounting. In other words, stability upon mounting the stacked body MCS on the redistribution chip RDC is improved.

In view of improving the stability upon mounting the stacked body MCS on the redistribution chip RDC, the height of the back surface 3b of the redistribution chip RDC is at about the same level as the height of the back surface 3b of the logic chip LC. However, in view of suppressing damages upon mounting the stacked body MCS due to contact between the surface 3a of the memory chip MC1 and the back surface 3b of the logic chip LC, the height of the back surface 3b of the redistribution chip RDC is preferably larger than that of the back surface 3b of the logic chip LC as illustrated in FIG. 41. Since the redistribution chip RDC and the stacked body MCS are connected via the plurality of joint materials 7 (see FIG. 6), the surface 3a of the memory chip MC1 and the back surface 3b of the redistribution chip RDC are difficult to contact with each other. However, as the joint materials 7 are not provided between the surface 3a of the memory chip MC and the back surface 3b of the logic chip LC, the back surface 3b of the logic chip LC is preferably disposed at a position lower than that of the back surface 3b of the redistribution chip RDC.

Further, in the example illustrated in FIG. 43, the power line V2 connected to the power circuit (power circuit for input/output) DR1 for driving the input/output circuit NS1 of the logic chip LC and the power line V4 connected to the power circuit (power circuit for input/output) DR3 for driving the input/output circuit NS2 of the memory chips MC1, MC2, MC3 and MC4 are independently connected to the wiring board 2, respectively. In the semiconductor device 1c, the redistribution chip RDC and the logic chip LC are connected to the wiring board 2, respectively, and thus even when the power lines V2 and V4 are independently provided, the number of terminals (electrodes) formed to the logic chip LC is not increased.

Also, in the semiconductor device 1c, the power line V4 connected to the power circuit (power circuit for input/output) DR3 for driving the input/output circuit NS2 of the memory chips MC1, MC2, MC3 and MC4 and the power line V3 connected to the power circuit (power circuit for input/output) DR4 for driving the core circuit CR2 of the memory chips MC1, MC2, MC3 and MC4 are connected to the wiring board 2, respectively, and not connected to the logic chip LC. Therefore, the transmission distance between the power supply source and the circuit (s) consuming power can be further shortened and thus preferable in suppressing unstable operation due to instantaneous voltage drop etc.

Other than the differences described above, the semiconductor device 1c illustrated in FIGS. 41 to 43 is the same as the semiconductor device 1 illustrated in FIGS. 3 to 5 and thus repetitive descriptions will be omitted. In addition, a method of manufacturing the semiconductor device 1c is different from the method of manufacturing the semiconductor device 1 in disposing the adhesive material NCL2 in the chip-mounting region 2p2 (see FIG. 42) disposed next to the chip-mounting region 2p1 (see FIG. 42) in the step of disposing the second adhesive material illustrated in FIG. 16 described in the first embodiment above. Further, the method of manufacturing the semiconductor device 1c is different from the method of manufacturing the semiconductor device 1 in electrically connecting the redistribution chip RDC and the wiring board 2 in the step of mounting the second chip illustrated in FIG. 16. Other than the differences described above, the method of manufacturing the semiconductor device 1 described in the first embodiment can be used; thus, repetitive descriptions are omitted.

Other Modification Examples

In the foregoing, the invention made by the inventors of the present invention has been concretely described based on the embodiments. However, it is needless to say that the present invention is not limited to the foregoing embodiments and various modifications and alterations can be made within the scope of the present invention.

Figure 44:
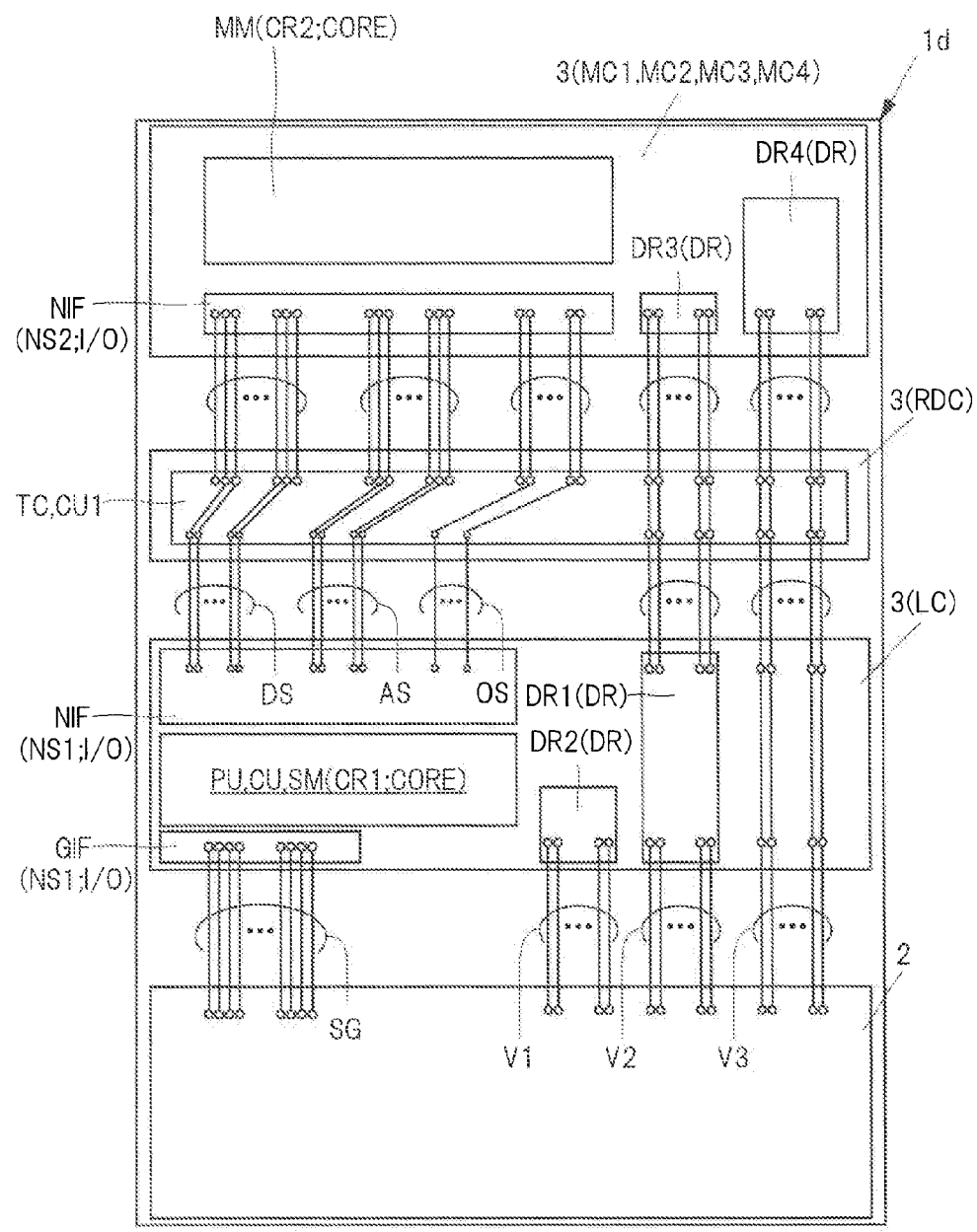
FIG. 44 is an explanatory diagram schematically illustrating a circuit configuration example of a semiconductor device according to a modification example with respect to FIG. 5.

For example, in the first embodiment and the second embodiment, aspects of using the redistribution chip RDC (see FIG. 6) in which the simple relay circuit TC (see FIG. 5) configured of a conductor pattern such as the lead wirings RDL (see FIG. 6) is formed have been described. However, as another modification example, like a semiconductor device 1d illustrated in FIG. 44, a part of the control circuit CU1 for controlling operation of the main memory circuit MM of the memory chips MC1, MC2, MC3 and MC4 can be formed to the redistribution chip RDC in addition to the relay circuit TC. FIG. 44 is an explanatory diagram schematically illustrating a circuit configuration example of the semiconductor device that is a modification example to the FIG. 5.

In the redistribution chip RDC included in the semiconductor device 1d illustrated in FIG. 44, the control circuit CU1 which increases the communication frequency (the number of clocks) of signal lines is formed in addition to the relay circuit TC. In this case, the number of signal lines connecting the redistribution chip RDC and the logic chip LC can be smaller than the signal lines connecting the memory chip MC1 and the redistribution chip RDC. That is, the number of the back surface electrodes 3bp (see FIG. 6) and the number of through silicon vias 3tsv (see FIG. 6) included in the logic chip LC can be reduced. In other words, the number of the front surface electrodes 3ap can be smaller than the number of back surface electrodes 3bp of the redistribution chip RDC. As a result, limitations needed to form the through silicon vias 3tsv to the logic chip LC are reduced and thus the degree of freedom of design of the logic chip LC can be improved.

Further, as illustrated in FIG. 44, the technique of forming the control circuit CU1 for controlling operation of the main memory circuit MM of the memory chips MC1, MC2, MC3 and MC4 to the redistribution chip RDC may be also used in combination with the semiconductor device 1c described in the second embodiment.

Figure 45:
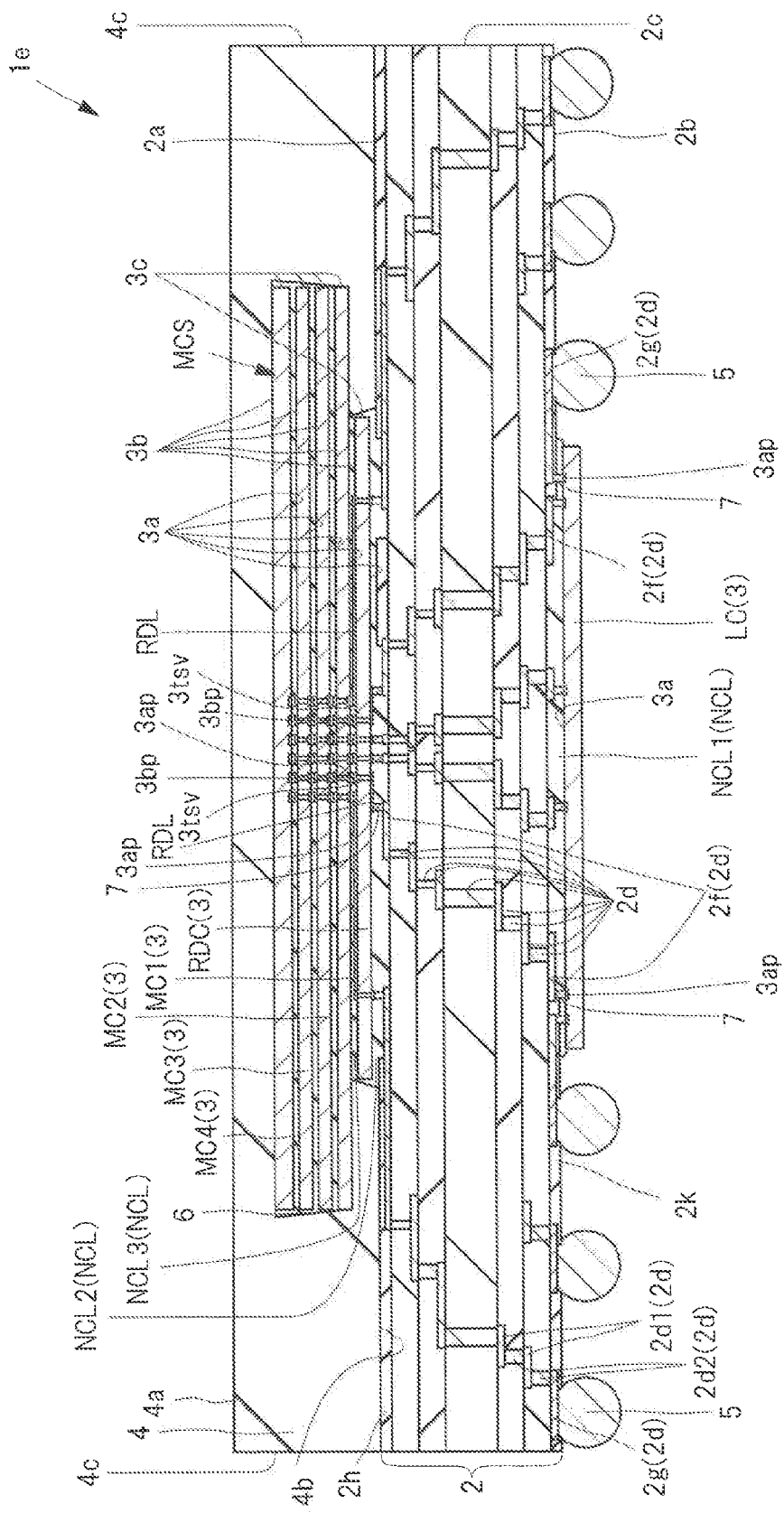
FIG. 45 is a cross-sectional view of a semiconductor device according to a modification example with respect to FIG. 41.

Still further, in the first and second embodiments, aspects of mounting the logic chip LC, the redistribution chip RDC, and the plurality of memory chips MC1, MC2, MC3 and MC4 are mounted on the upper surface 2a side of the wiring board 2, respectively, have been described. However, as a modification example, like a semiconductor device 1e illustrated in FIG. 45, the logic chip LC can be mounted on the lower surface 2b side, the lower surface 2b being a mounting surface of the wiring board 2. FIG. 45 is a cross-sectional view of the semiconductor device which is a modification example to FIG. 41. The semiconductor device 1e illustrated in FIG. 45 is different from the semiconductor device 1c illustrated in FIG. 41 in mounting the logic chip LC on the lower surface 2b side that is a mounting surface of the wiring board 2. In other words, in the semiconductor device 1e, the wiring board 2 is disposed between the logic chip LC and the redistribution chip RDC.

In still other words, the wiring board 2 of the semiconductor device 1e has a chip-mounting region for mounting the logic chip LC in the lower surface 2b and a chip-mounting regions for mounting the redistribution chip RDC in the upper surface 2a, respectively. In addition, the logic chip LC and the redistribution chip RDC are mounted on the wiring board 2 by the face-down mounting method (flip-chip connection method). That is, the redistribution chip RDC is mounted on the wiring board 2 such that the surface 3a faces the upper surface 2a of the wiring board 2. Also, the logic chip LC is mounted on the wiring board 2 such that the surface 3a faces the lower surface 2b of the wiring board 2.

Further, in the example illustrated in FIG. 45, the logic chip LC and the redistribution chip RDC are disposed at positions overlapping in the thickness direction. In this manner, the distance of transmission paths for electrically connecting the logic chip LC and the redistribution chip RDC can be shortened. In addition, the logic chip LC is disposed at a center portion of the lower surface 2b of the wiring board 2. A plurality of lands 2g (solder balls 5) which are external terminals of the semiconductor device 1e are disposed in a circumference of the logic chip LC. In this case, the distance between the external interface circuit (for example, the external interface circuit GIF illustrated in FIG. 44) of the semiconductor chip and the external terminals can be shortened.

However, when the semiconductor chips 3 are mounted onto each of the upper and lower surfaces of the wiring board 2, respectively, like the semiconductor device 1e, the layout of drawing the wirings 2d inside the wiring board 2 is complicated and the number of wiring layers tends to be increased. Also, providing a chip-mounting region on the mounting surface side of the wiring board 2 may cause a shortage of disposing space of the external terminals and thus the mounting area is prone to be large. Therefore, from the view of reducing the number of wiring layers or reducing the mounting area, the logic chip LC and the redistribution chip RDC are preferably mounted on the upper surface 2a side that is a chip-mounting surface like the semiconductor device 1 illustrated in FIG. 4 and the semiconductor device 1c illustrated in FIG. 41.

What is claimed is:

1. A semiconductor device comprising:
    a wiring board having a first surface and a second surface opposite to the first surface;
    a first semiconductor chip having a first front surface, a plurality of first front surface electrodes formed on the first front surface, a first back surface opposite to the first front surface, and a plurality of back surface electrodes formed on the first back surface and electrically connected to the first front surface electrodes, respectively, the first back surface electrodes being formed at positions overlapping the first front surface electrodes in a plan view, respectively, the first semiconductor chip being mounted over the first surface of the wiring board such that the first front surface faces the first surface of the wiring board;
    a second semiconductor chip having a second front surface, a plurality of second front surface electrodes formed on the second front surface and electrically connected to the first back surface electrodes, respectively, a second back surface opposite to the second front surface, and a plurality of second back surface electrodes formed on the second back surface and electrically connected to the second front surface electrodes, respectively, a plurality of through silicon vias penetrating from one of the second front surface and the second back surface to the other, and a plurality of lead wirings formed on the second front surface or the second back surface and electrically connecting the through silicon vias and the second front surface electrodes or the second back surface electrodes, the second semiconductor chip being mounted over the first back surface of the first semiconductor chip;
    a third semiconductor chip having a third front surface, a plurality of third front surface electrodes electrically connected to the second back surface electrodes, respectively, and a third back surface opposite to the third front surface, the third semiconductor chip being mounted over the second semiconductor chip such that the third front surface faces the second semiconductor chip; and
    a plurality of external terminals formed on the second surface of the wiring board,
    wherein the third semiconductor chip has a planar size larger than a planar size of the first semiconductor chip,
    wherein a first circuit is formed in the third semiconductor chip,
    wherein a first control circuit for controlling driving of the first circuit is formed in the first semiconductor chip,
    wherein a second control circuit for controlling driving of the first circuit is formed in the second semiconductor chip, and
    wherein a number of the second front surface electrodes of the second semiconductor chip is smaller than a number of the second back surface electrodes.

2. The semiconductor device according to claim 1, wherein the plurality of third front surface electrodes of the third semiconductor chip are disposed in a center portion of the third front surface.

3. The semiconductor device according to claim 2,
    wherein the plurality of second back surface electrodes of the second semiconductor chip is disposed at positions overlapping the plurality of third front surface electrodes of the third semiconductor chip in the thickness direction and also electrically connected to the plurality of third front surface electrodes, and
    wherein the plurality of first back surface electrodes of the first semiconductor chip is disposed at positions overlapping the second front surface electrodes of the second semiconductor chip in the thickness direction.

4. The semiconductor device according to claim 1,
    wherein a planar size of the second semiconductor chip is larger than a planar size of the first semiconductor chip.

5. The semiconductor device according to claim 4,
    wherein, in a plan view, a side surface of the second semiconductor chip is positioned between a side surface of the first semiconductor chip and a side surface of the third semiconductor chip.

6. The semiconductor device according to claim 1,
    wherein a power circuit for supplying power for driving the first circuit is formed in the third semiconductor chip, and
    wherein a power front surface electrode for supplying power to the power circuit among the plurality of second front surface electrodes and a power back surface electrode for supplying power to the power circuit among the plurality of second back surface electrodes are disposed at positions overlapping in a thickness direction.

7. The semiconductor device according to claim 1,
    wherein a second control circuit for increasing communication frequency is formed in the second semiconductor chip.

8. The semiconductor device according to claim 1,
    wherein a main memory circuit is formed in the third semiconductor chip, and
    wherein in the first semiconductor chip, a first control circuit for controlling driving of the main memory circuit, and a computing circuit for performing arithmetic processing on signal data inputted and outputted to and from the third semiconductor chip or an external device are formed.

9. A semiconductor device comprising:
    a wiring board having a first surface and a second surface opposite to the first surface;

a first semiconductor chip having a first front surface, a plurality of first front surface electrodes formed on the first front surface, a first back surface opposite to the first front surface, and a plurality of back surface electrodes formed on the first back surface and electrically connected to the first front surface electrodes, respectively, the first back surface electrodes being formed at positions overlapping the first front surface electrodes in a plan view, respectively, the first semiconductor chip being mounted over the first surface of the wiring board such that the first front surface faces the first surface of the wiring board;

a second semiconductor chip having a second front surface, a plurality of second front surface electrodes formed on the second front surface and electrically connected to the first back surface electrodes, respectively, a second back surface opposite to the second front surface, and a plurality of second back surface electrodes formed on the second back surface and electrically connected to the second front surface electrodes, respectively, a plurality of through silicon vias penetrating from one of the second front surface and the second back surface to the other, and a plurality of lead wirings formed on the second front surface or the second back surface and electrically connecting the through silicon vias and the second front surface electrodes or the second back surface electrodes, the second semiconductor chip being mounted over the first back surface of the first semiconductor chip;

a third semiconductor chip having a third front surface, a plurality of third front surface electrodes electrically connected to the second back surface electrodes, respectively, and a third back surface opposite to the third front surface, the third semiconductor chip being mounted over the second semiconductor chip such that the third front surface faces the second semiconductor chip; and a plurality of external terminals formed on the second surface of the wiring board, wherein the third semiconductor chip has a planar size larger than a planar size of the first semiconductor chip, wherein a first circuit is formed in the third semiconductor chip, wherein a first control circuit for controlling driving of the first circuit is formed in the first semiconductor chip, wherein a second control circuit for increasing communication frequency is formed in the second semiconductor chip, and wherein a number of the second front surface electrodes of the second semiconductor chip is smaller than a number of the second back surface electrodes.

10. The semiconductor device according to claim 9, wherein the plurality of third front surface electrodes of the third semiconductor chip are disposed in a center portion of the third front surface.

11. The semiconductor device according to claim 10, wherein the plurality of second back surface electrodes of the second semiconductor chip is disposed at positions overlapping the plurality of third front surface electrodes of the third semiconductor chip in the thickness direction and also electrically connected to the plurality of third front surface electrodes, and wherein the plurality of first back surface electrodes of the first semiconductor chip is disposed at positions overlapping the second front surface electrodes of the second semiconductor chip in the thickness direction.

12. The semiconductor device according to claim 9, wherein a planar size of the second semiconductor chip is larger than a planar size of the first semiconductor chip.

13. The semiconductor device according to claim 12, wherein, in a plan view, a side surface of the second semiconductor chip is positioned between a side surface of the first semiconductor chip and a side surface of the third semiconductor chip.

14. The semiconductor device according to claim 9, wherein a power circuit for supplying power for driving the first circuit is formed in the third semiconductor chip, and wherein a power front surface electrode for supplying power to the power circuit among the plurality of second front surface electrodes and a power back surface electrode for supplying power to the power circuit among the plurality of second back surface electrodes are disposed at positions overlapping in a thickness direction.

15. The semiconductor device according to claim 9, wherein a main memory circuit is formed in the third semiconductor chip, and wherein in the first semiconductor chip, a first control circuit for controlling driving of the main memory circuit, and a computing circuit for performing arithmetic processing on signal data inputted and outputted to and from the third semiconductor chip or an external device are formed.

* * * * *